US012763230B2

(12) United States Patent
Ganjoo et al.

(10) Patent No.: US 12,763,230 B2
(45) Date of Patent: *Oct. 13, 2026

(54) TRANSPARENT CONDUCTIVE OXIDE HAVING AN EMBEDDED FILM

(71) Applicant: Vitro Flat Glass, LLC, Cheswick, PA (US)

(72) Inventors: Ashtosh P. Ganjoo, Allison Park, PA (US); Sudarshan Narayanan, Oxford (GB); Dennis J. O'Shaughnessy, Allison Park, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 210 days.

This patent is subject to a terminal disclaimer.

(21) Appl. No.: 18/545,437

(22) Filed: Dec. 19, 2023

(65) Prior Publication Data

US 2024/0194369 A1 Jun. 13, 2024

Related U.S. Application Data

(63) Continuation of application No. 16/819,299, filed on Mar. 16, 2020, now Pat. No. 11,881,326, which is a continuation of application No. 15/669,411, filed on Aug. 4, 2017, now Pat. No. 10,650,935.

(51) Int. Cl.

| | |
|---|---|
| ***H01B 1/02*** | (2006.01) |
| ***B32B 7/023*** | (2019.01) |
| ***C03C 17/34*** | (2006.01) |
| ***C23C 14/08*** | (2006.01) |

(Continued)

(52) U.S. Cl.

CPC ............... *H01B 1/02* (2013.01); *B32B 7/023* (2019.01); *C03C 17/3417* (2013.01); *C23C 14/086* (2013.01); *C23C 14/35* (2013.01); *H01B 1/08* (2013.01); *C03C 2217/734* (2013.01); *C03C 2217/944* (2013.01); *C03C 2217/948* (2013.01)

(58) Field of Classification Search

None

See application file for complete search history.

(56) References Cited

U.S. PATENT DOCUMENTS 4,716,086 A 12/1987 Gillery et al.
4,786,563 A 11/1988 Gillery et al.
5,344,718 A 9/1994 Hartig et al.

(Continued)

FOREIGN PATENT DOCUMENTS

CA 2156571 A1 2/1996
CN 101429640 A 5/2009

(Continued)

OTHER PUBLICATIONS

Jiang et al., "Re-evaluation of literature values of silver optical constants." Optics Express, 2015, pp. 2133-2144, vol. 23:3.

*Primary Examiner* — Prashant J Khatri
(74) *Attorney, Agent, or Firm* — The Webb Law Firm

(57) ABSTRACT

The present invention is directed to coated articles. A substrate is coated with an underlayer having at a first underlayer film made of a first high refractive index material. A transparent conductive oxide layer over at least a portion of the underlayer. An embedded film is embedded within the transparent conductive oxide layer wherein the embedded film comprises a second high refractive index material.

19 Claims, 28 Drawing Sheets
(22 of 28 Drawing Sheet(s) Filed in Color)

(51) Int. Cl.
*C23C 14/35* (2006.01)
*H01B 1/08* (2006.01)

(56) References Cited

U.S. PATENT DOCUMENTS

| | | | |
|---|---|---|---|
| 5,376,455 | A | 12/1994 | Hartig et al. |
| 5,425,861 | A | 6/1995 | Hartig et al. |
| 5,532,180 | A | 7/1996 | den Boer et al. |
| 5,584,902 | A | 12/1996 | Hartig et al. |
| 5,709,930 | A | 1/1998 | DePauw |
| 5,834,103 | A | 11/1998 | Bond et al. |
| 6,398,925 | B1 | 6/2002 | Arbab et al. |
| 7,311,961 | B2 | 12/2007 | Finley et al. |
| 7,335,421 | B2 | 2/2008 | Thiel et al. |
| 7,648,768 | B2 | 1/2010 | Thiel |
| 8,597,474 | B2 | 12/2013 | Finley |
| 9,546,415 | B2 | 1/2017 | Park et al. |
| 9,556,071 | B2 | 1/2017 | Finley et al. |
| 10,379,269 | B2 | 8/2019 | Lee et al. |
| 2004/0241490 | A1 | 12/2004 | Finley |
| 2006/0246321 | A1 | 11/2006 | Molle et al. |
| 2007/0275252 | A1 | 11/2007 | Krasnov |
| 2010/0089621 | A1 | 4/2010 | Stoss et al. |
| 2010/0310863 | A1 | 12/2010 | Kuchiyama et al. |
| 2010/0311204 | A1 | 12/2010 | Komin et al. |
| 2012/0107554 | A1 | 5/2012 | Pfaff et al. |
| 2013/0230730 | A1 | 9/2013 | Nagamoto et al. |
| 2014/0113120 | A1 | 4/2014 | Thiel |
| 2014/0154488 | A1 | 6/2014 | Lu |
| 2015/0286079 | A1 | 10/2015 | Sternchuss et al. |
| 2015/0311470 | A1 | 10/2015 | Guimard et al. |
| 2016/0002098 | A1 | 1/2016 | Sternchuss et al. |
| 2016/0229741 | A1 | 8/2016 | Canova et al. |
| 2016/0300632 | A1 | 10/2016 | Kawakami et al. |

FOREIGN PATENT DOCUMENTS

| | | | |
|---|---|---|---|
| CN | 105658592 | A | 6/2016 |
| CN | 106488893 | A | 3/2017 |
| JP | 2000281387 | A | 10/2000 |
| JP | 2008250038 | A | 10/2008 |
| JP | 201061837 | A | 3/2010 |
| JP | 201072635 | A | 4/2010 |
| JP | 2010072635 | A | 4/2010 |
| JP | 2020529345 | A | 10/2020 |
| WO | 9529883 | A1 | 11/1995 |
| WO | 2010129730 | A1 | 11/2010 |
| WO | 2014188822 | A1 | 11/2014 |

Without embedded film 225 nm samples show emissivity of ≥ 0.16 after heating 150 nm samples show emissivity of ~0.20 post heated

TRANSPARENT CONDUCTIVE OXIDE HAVING AN EMBEDDED FILM

CROSS REFERENCE TO RELATED APPLICATIONS

This application is a continuation of U.S. patent application Ser. No. 16/819,299 filed Mar. 16, 2020, which is a continuation of U.S. patent application Ser. No. 15/669,411 filed Aug. 4, 2017, the entire disclosures of which are hereby incorporated by reference herein.

BACKGROUND OF THE INVENTION

Field of the Invention

The invention relates to coated articles having a low emissivity and neutral color.

Description of Related Art

Transparent conductive oxides ("TCOs") are applied to the substrate to provide the coated article with lower emissivity and lower sheet resistance. This makes TCOs particularly useful in electrodes (for example solar cells) or heating layers, activing glazing units or screens. TCOs are usually applied by vacuum deposition techniques, such as magnetron sputtering vacuum deposition ("MSVD"). Generally a thicker TCO layer provides a lower sheet resistance. The thickness of the TCO, however, impacts the color of the coated article. Therefore, there is a need to adjust the coloring effect caused by TCO layers. There is also a need to minimize the thickness of a TCO layer so as to minimize the impact the TCO has on the color of the coated article while still maintaining the required sheet resistance.

Coating stacks may corrode over time. To protect from this, protective overcoats can be applied to coatings. For example, titanium dioxide films disclosed in U.S. Pat. Nos. 4,716,086 and 4,786,563 are protective films that provide chemical resistance to a coating. Silicon oxide disclosed in Canadian Patent Number 2,156,571, aluminum oxide and silicon nitride disclosed in U.S. Pat. Nos. 5,425,861; 5,344,718; 5,376,455; 5,584,902 and 5,532,180; and in PCT International Patent Publication No. 95/29883 are also protective films that provide chemical resistance to a coating. This technology could be advanced by more chemically and/or mechanically durable protective overcoats.

SUMMARY OF THE INVENTION

A coated article includes a substrate, an underlayer over the substrate. The underlayer includes a first layer. The first layer contains a high refractive index material. A second layer is positioned over at least a portion of the first layer. The second layer contains a low refractive index material. A transparent conductive film positioned over at least a portion of the underlayer. The coated article has a sheet resistance of at least 5Ω/□ and at most 25Ω/□. The coated article has a color with an a* of at least −9 and at most 1, a b* of at least −9 and at most 1.

Optionally, the coated article can have a protective layer over at least a portion of the transparent conductive oxide layer. The protective layer includes a first protective film over at least a portion of the transparent conductive oxide layer, and a second protective film over at least a portion of the first protective film. The second protective film is the outer-most film in the coating stack, and includes a mixture of titania and alumina. Optionally, the protective layer can include a third protective film positioned between the first protective film and a second protective film.

A method of forming a coated substrate includes providing a substrate. A transparent conductive oxide is identified and a thickness for the transparent conductive oxide is determined that will provide a sheet resistance of at least 5Ω/□ and at most 25Ω/□. An underlayer having a first underlayer material and a second underlayer material is identified. Thickness for the first underlayer and the second underlayer are determined that will provide the coated substrate with a color having an a* of at least −9 and at most 1, a b* of at least −9 and at most 1. The thicknesses of the two films in the underlayer are used to tune the color of the coated substrate. Since the color is impacted by the thickness of the transparent conductive oxide film, the color is tuned after the thickness of the transparent conductive oxide film is determined. The first underlayer film including the first underlayer material is applied over at least a portion of the substrate at the first underlayer film thickness. A second underlayer film including the second underlayer material is applied over at least a portion of the first underlayer at the second underlayer thickness. A transparent conductive oxide layer having the transparent conductive oxide is applied over at least a portion of the second underlayer film at the transparent conductive oxide film thickness.

A coated article having a color with an a* of at least −9 and at most 1 and a b* of at least −9 and at most 1 made by the following steps. A transparent conductive oxide is identified and a thickness for the transparent conductive oxide is determined that will provide a sheet resistance of at least 5Ω/□ and at most 25Ω/□. An underlayer having a first underlayer material and a second underlayer material is identified. Thickness for the first underlayer and the second underlayer are determined that will provide the coated substrate with a color having an a* of at least −9 and at most 1, a b* of at least −9 and at most 1. The thicknesses of the two films in the underlayer are used to tune the color of the coated substrate. Since the color is impacted by the thickness of the transparent conductive oxide film, the color is tuned after the thickness of the transparent conductive oxide film is determined. The first underlayer film including the first underlayer material is applied over at least a portion of the substrate at the first underlayer film thickness. A second underlayer film including the second underlayer material is applied over at least a portion of the first underlayer at the second underlayer thickness. A transparent conductive oxide layer having the transparent conductive oxide is applied over at least a portion of the second underlayer film at the transparent conductive oxide film thickness.

A coated article including a substrate. An underlayer is positioned over at least a portion of the substrate. The underlayer includes at least a first underlayer film over at least a portion of the substrate, and an optional second underlayer film over at least a portion of the first underlayer film. The first underlayer film contains a first high refractive index material. The optional second underlayer film contains a first low refractive index layer. A transparent conductive oxide layer is positioned over at least a portion of the first or optional second underlayer film. A second high refractive index material is embedded within the transparent conductive oxide layer. The coated article has a sheet resistances of at least 5Ω/□ and at most 25Ω/□. The sheet resistance is at least 35% higher than without the second high refractive index material embedded within the transparent conductive oxide layer.

Optionally, the coated article can have a protective layer over at least a portion of the transparent conductive oxide layer. The protective layer includes a first protective film over at least a portion of the transparent conductive oxide layer, and a second protective film over at least a portion of the first protective film. The second protective film is the outer-most film in the coating stack, and includes a mixture of titania and alumina. Optionally, the protective layer can include a third protective film positioned between the first protective film and a second protective film.

A coated article including a substrate. An underlayer is positioned over at least a portion of the substrate. The underlayer includes at least a first underlayer film over at least a portion of the substrate, and an optional second underlayer film over at least a portion of the first underlayer film. The first underlayer film contains a first high refractive index material. The optional second underlayer film contains a first low refractive index layer. A first transparent conductive oxide layer is positioned over at least a portion of the first or optional second underlayer film. An embedded film is positioned over at least a portion of the first transparent conductive oxide layer. The embedded film has a second high refractive index material. A second transparent conductive oxide layer is positioned over at least a portion of the second transparent conductive oxide layer. The coated article has a sheet resistances of at least 5Ω/□ and at most 25Ω/□. The sheet resistance is at least 35% higher than without the embedded film.

Optionally, the coated article can have a protective layer over at least a portion of the transparent conductive oxide layer. The protective layer includes a first protective film over at least a portion of the transparent conductive oxide layer, and a second protective film over at least a portion of the first protective film. The second protective film is the outer-most film in the coating stack, and includes a mixture of titania and alumina. Optionally, the protective layer can include a third protective film positioned between the first protective film and a second protective film.

A method of forming a coated article; a method of increasing the sheet resistance; or a method of increasing the light transmission through a coated article. A substrate is provided. An underlayer is applied over at least a portion of the substrate. A first underlayer film is applied over at least a portion of the substrate. The first underlayer film has a first high refractive index material. An optional second underlayer film is applied over at least a portion of the first underlayer film. The optional second underlayer film has a first low refractive index layer. A first transparent conductive oxide layer is applied over at least a portion of the first or optional second underlayer film. An embedded film is applied over at least a portion of the first transparent conductive oxide film. The embedded film has a second high refractive index material. A second transparent conductive oxide film is applied over at least a portion of the embedded film. Optionally a protective layer can be applied over the second transparent conductive oxide film. The optional protective layer includes a first protective film over at least a portion of the transparent conductive oxide layer, and a second protective film over at least a portion of the first protective film. The second protective film is the outer-most film in the coating stack, and includes a mixture of titania and alumina. Optionally, the protective layer can include a third protective film positioned between the first protective film and a second protective film.

A coated article made by the following steps. A substrate is provided. An underlayer is applied over at least a portion of the substrate. A first underlayer film is applied over at least a portion of the substrate. The first underlayer film has a first high refractive index material. An optional second underlayer film is applied over at least a portion of the first underlayer film. The optional second underlayer film has a first low refractive index layer. A first transparent conductive oxide layer is applied over at least a portion of the first or optional second underlayer film. An embedded film is applied over at least a portion of the first transparent conductive oxide film. The embedded film has a second high refractive index material. A second transparent conductive oxide film is applied over at least a portion of the embedded film. Optionally a protective layer can be applied over the second transparent conductive oxide film. The optional protective layer includes a first protective film over at least a portion of the transparent conductive oxide layer, and a second protective film over at least a portion of the first protective film. The second protective film is the outer-most film in the coating stack, and includes a mixture of titania and alumina. Optionally, the protective layer can include a third protective film positioned between the first protective film and a second protective film.

A method of increasing the sheet resistance of a coated article. A coated article is provided. The coated article has a substrate and a transparent conductive oxide layer over at least a portion of the substrate. The coated article is processed with a post-deposition process. The post deposition process can be tempering the coated article, heating the entire coated article by placing it into a furnace, flash annealing only a surface of the transparent conductive oxide layer or passing an Eddy current through the transparent conductive oxide layer. Alternatively, a coated article having a sheet resistance of less than 25 ohms per square made by the method described in this paragraph.

A method of increasing sheet resistance of a coated article. A substrate is provided. A transparent conductive oxide is applied over at least a portion of the substrate. A post-deposition process is applied to the substrate that is coated with the transparent conductive oxide. The post deposition process can be tempering the coated article, heating the entire coated article by placing it into a furnace, flash annealing only a surface of the transparent conductive oxide layer or passing an Eddy current through the transparent conductive oxide layer.

A coated article is a substrate having a coating stack. At least a portion of the substrate is coated with a functional coating. A protective layer is applied over at least a portion of the functional coating. The protective layer has a first protective film over at least a portion of the functional coating, and a second protective film over at least a portion of the functional coating. The second protective film is the last film within the coating stack, and includes titania and alumina. Optionally, a third protective film can be positioned between the first protective film and the second protective film, or between the first protective film and the functional coating.

A method of making a coated article including providing a substrate. A functional coating is applied over at least a portion of the substrate. A first protective film is applied over at least a portion of the functional coating. A second protective film that includes titania and alumina is applied over at least a portion of the first protective film. Optionally, a third protective film is applied between the first protective film and the second protective film, or between the first protective film and the functional coating.

A method of reducing the absorption, resistance or emissivity of a transparent conductive oxide layer. A substrate is provided. A transparent conductive oxide layer is applied over at least a portion of the substrate in an atmosphere that comprises between 0% and 2.0% oxygen.

A coated article having reduced absorption, resistance or emissivity comprising a transparent conductive oxide layer made by the following steps. A substrate is provided. A transparent conductive oxide layer is applied over at least a portion of the substrate in an atmosphere that comprises between 0% and 2.0% oxygen.

BRIEF DESCRIPTION OF THE DRAWING(S)

The patent or application file contains at least one drawing executed in color. Copies of this patent or patent application publication with color drawing(s) will be provided by the Office upon request and payment of the necessary fee.

FIGS. 1*a*, 1*b*, 1*c* and 1*d* are side views (not to scale) of coatings incorporating a feature of the invention;

FIGS. 2*a*, 2*b*, 2*c*, 2*d* and 2*e* are side views of other coatings (not to scale) incorporating a feature of the invention;

FIGS. 3*a*, 3*b*, 3*c*, 3*d*, 3*e* are side views of other coatings (not to scale) incorporating a feature of the invention;

FIGS. 4*a* and 4*b* are side views of other coatings (not to scale) incorporating a feature of the invention;

FIGS. 5*a* and 5*b* are side views of other coatings (not to scale) incorporating a feature of the invention;

FIGS. 6*a*, 6*b*, 6*c*, 6*d*, 6*e*, 6*f*, 6*g*, and 6*h* are side views of other coatings (not to scale) incorporating a feature of the invention;

FIG. 7 is a graph showing the sheet resistance of ITO versus thickness for samples that had the surface of the ITO transparent conductive oxide layer heated to specified temperatures.

FIGS. 8*a-c* are XRD graphs showing the crystallization of tin-doped indium oxide transparent conductive oxide layers.

Figure 13A:
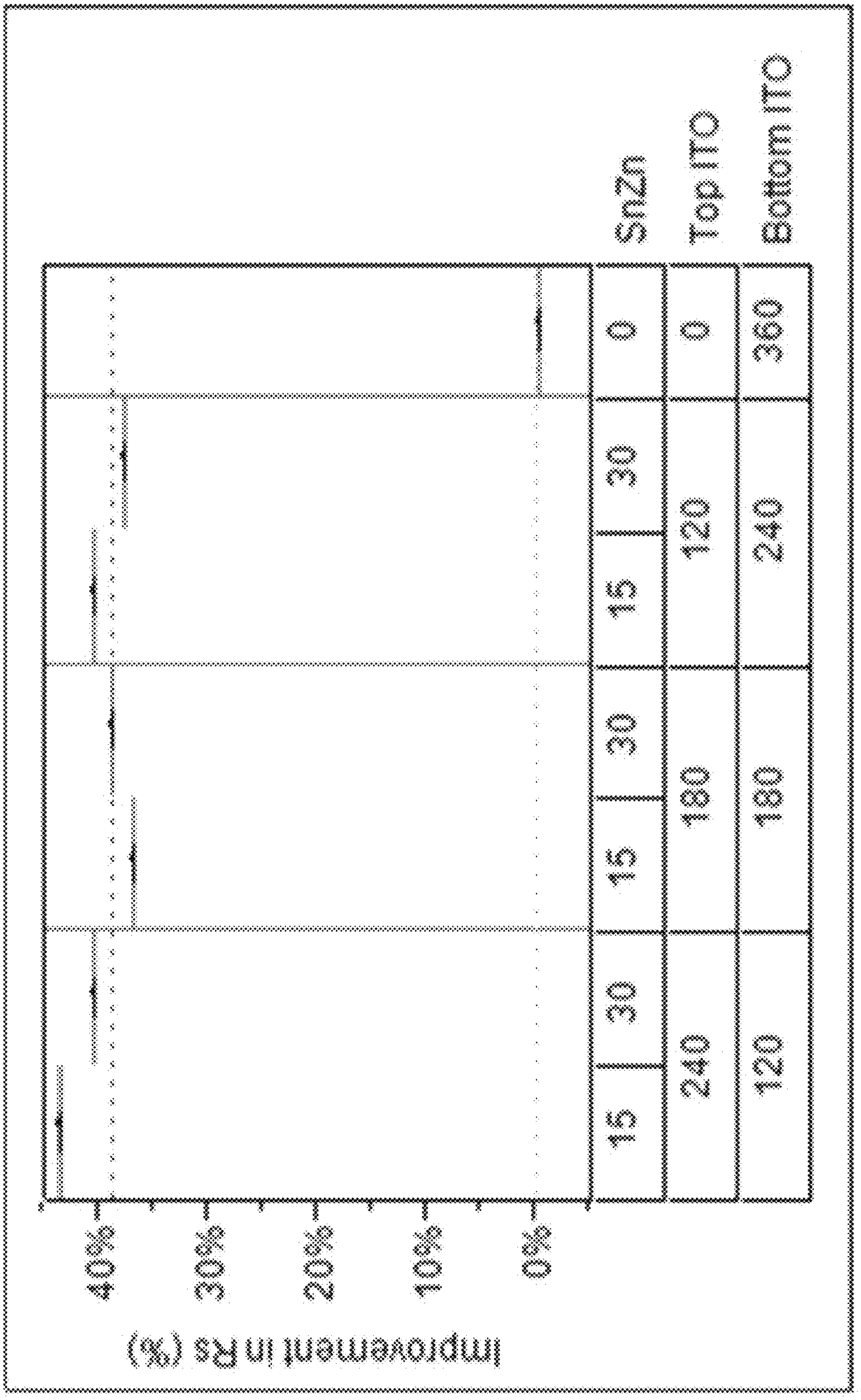

FIG. 13*a* is a graph showing the effect of the embedded film on the sheet resistance.

Figure 13B:
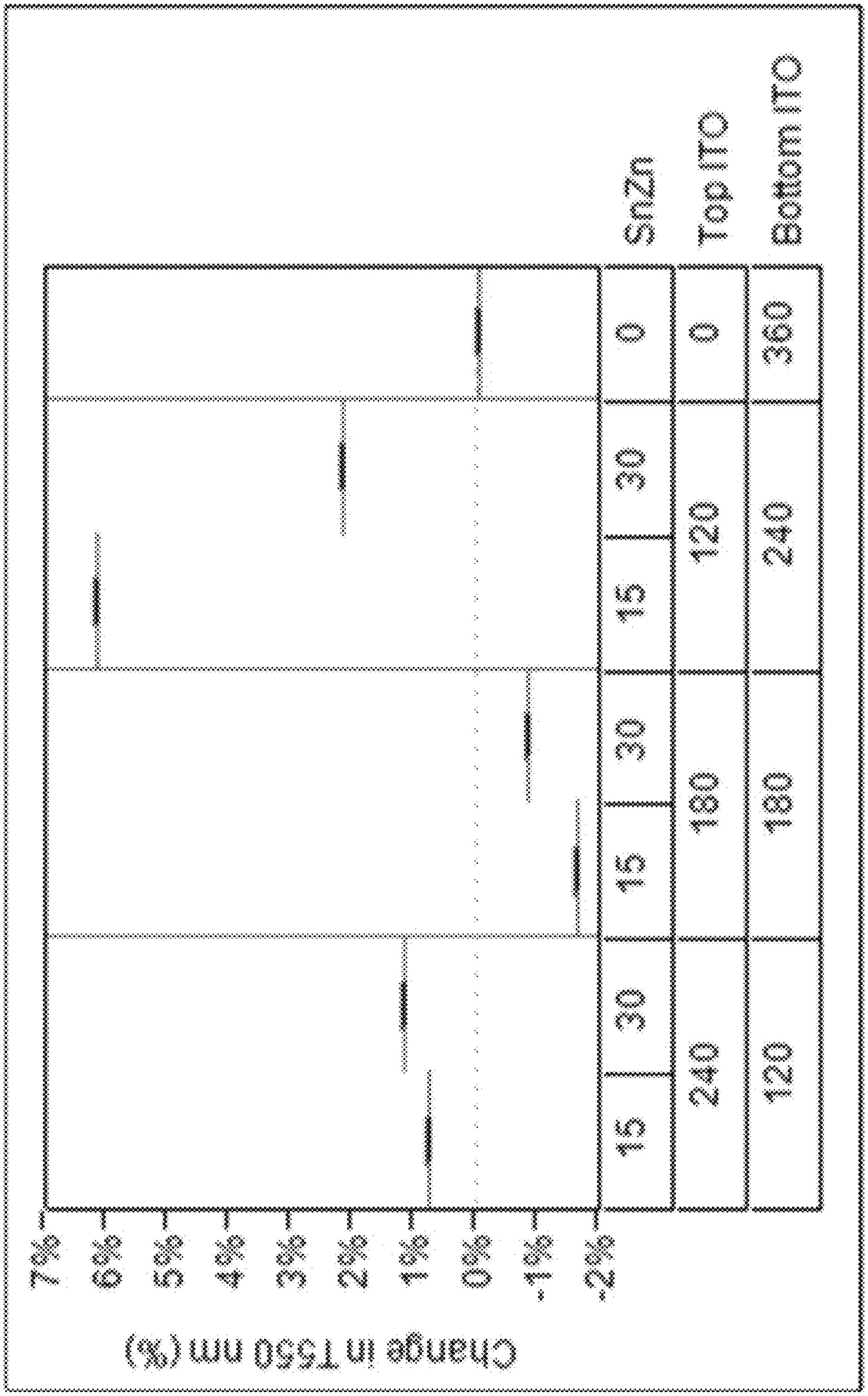

FIG. 13*b* is a graph showing the effect of the embedded film on emissivity.

Figure 13C:
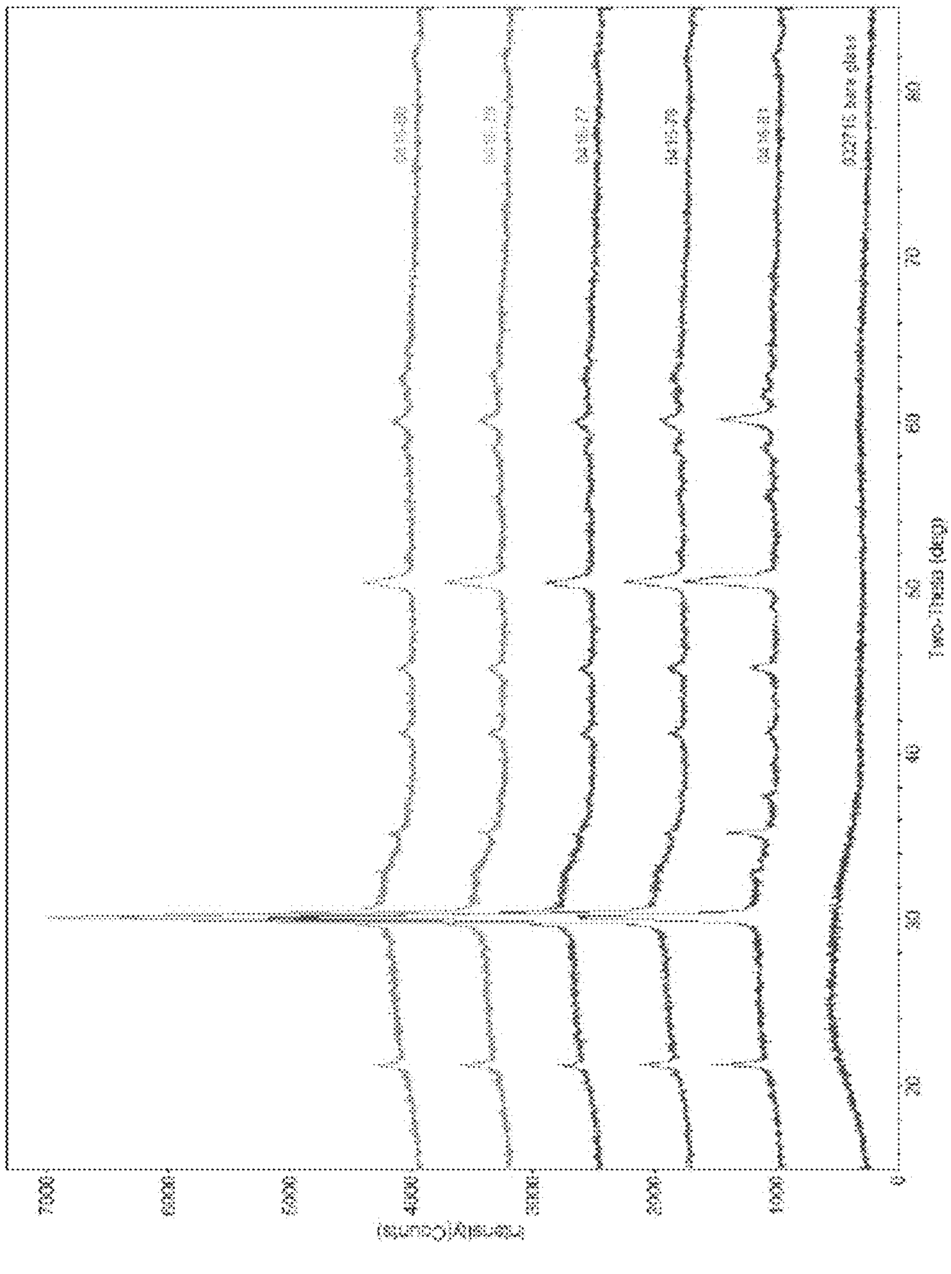
Figure 14:
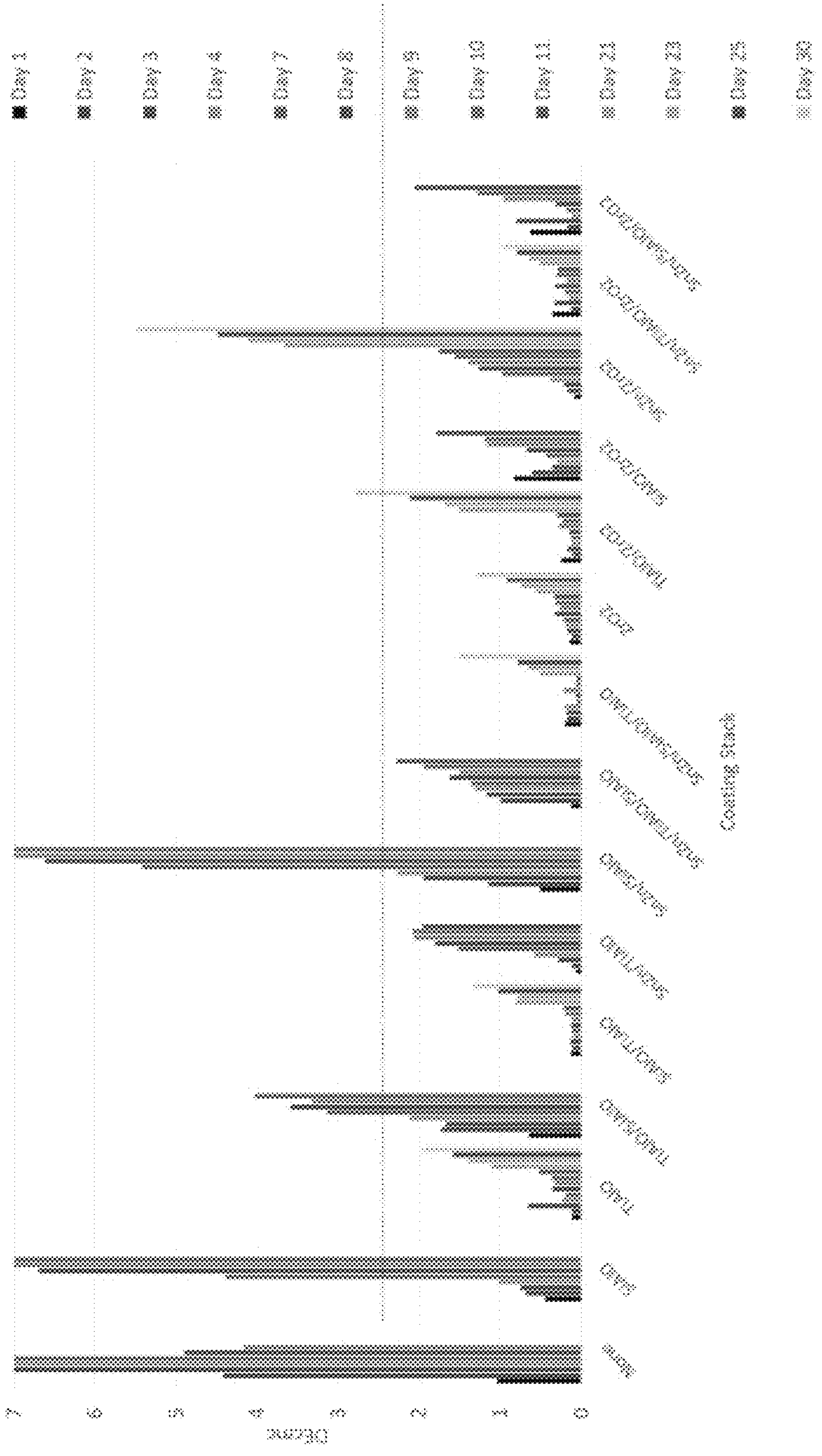

FIG. 13*c* is an XRD graph of indium-doped tin oxide having an embedded film FIG. 14 is a bar graph showing the durability of different protective layers.

Figure 15:
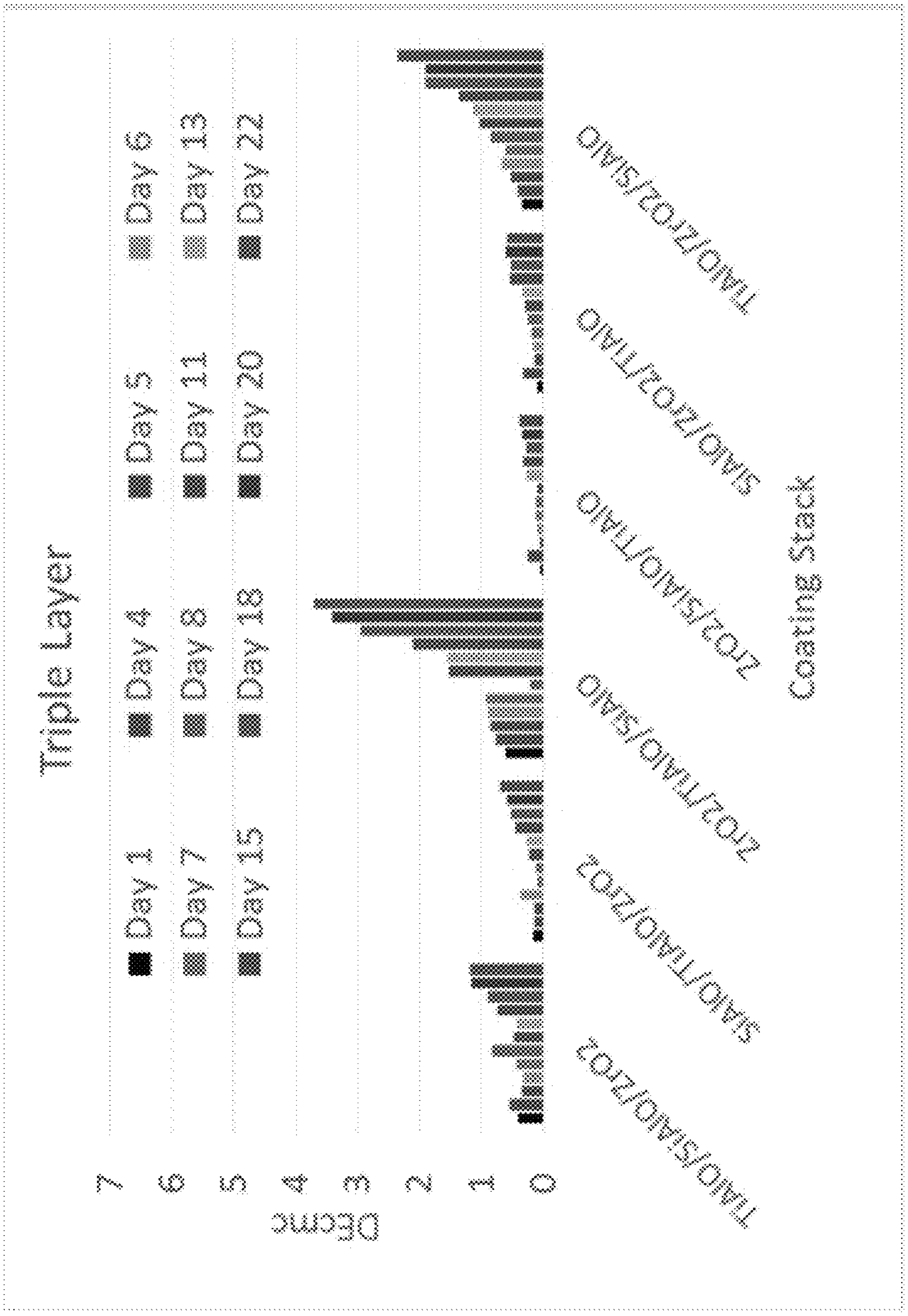

FIG. 15 is a bar graph showing the durability of different protective layers.

Figure 16A:
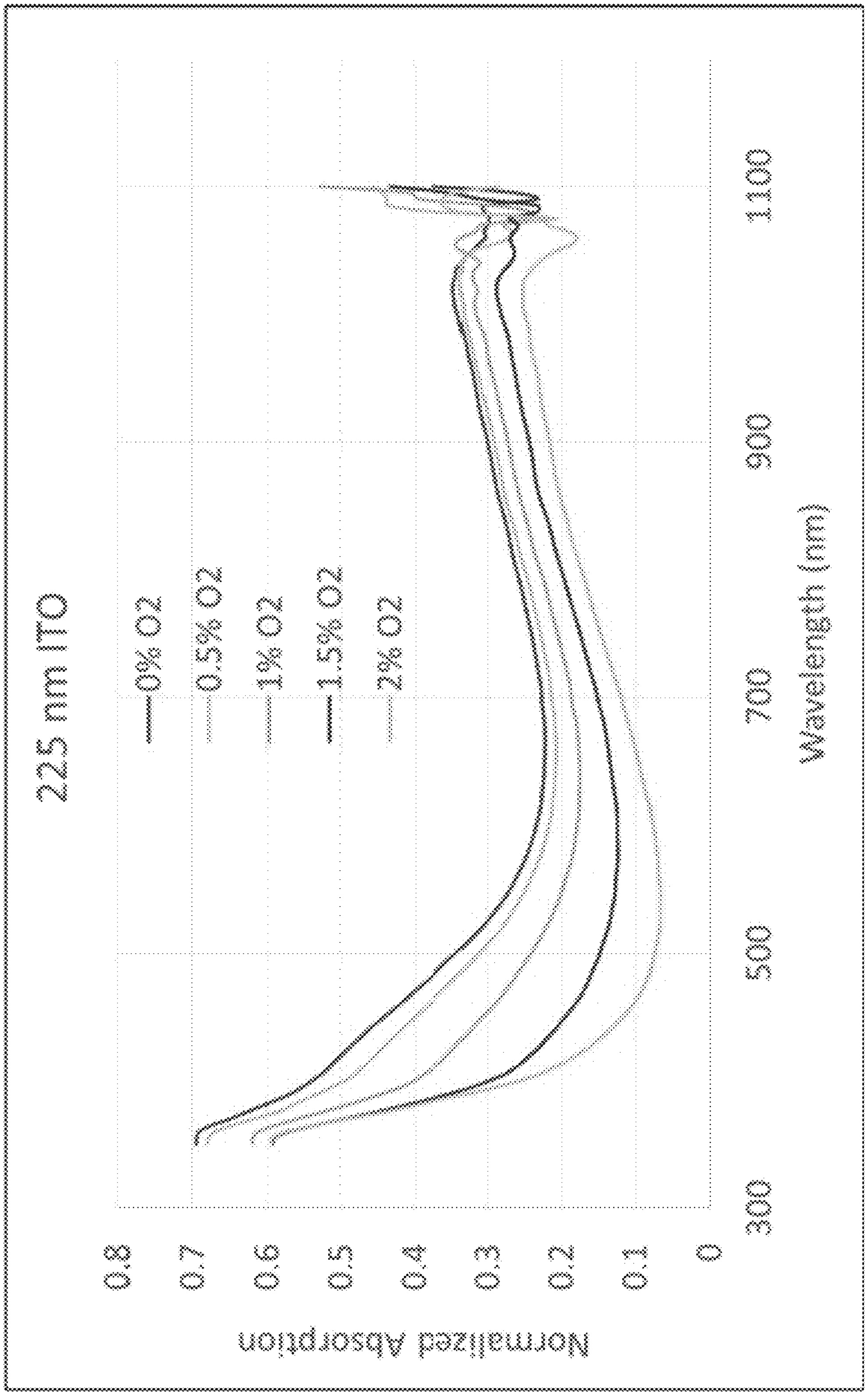
Figure 16B:
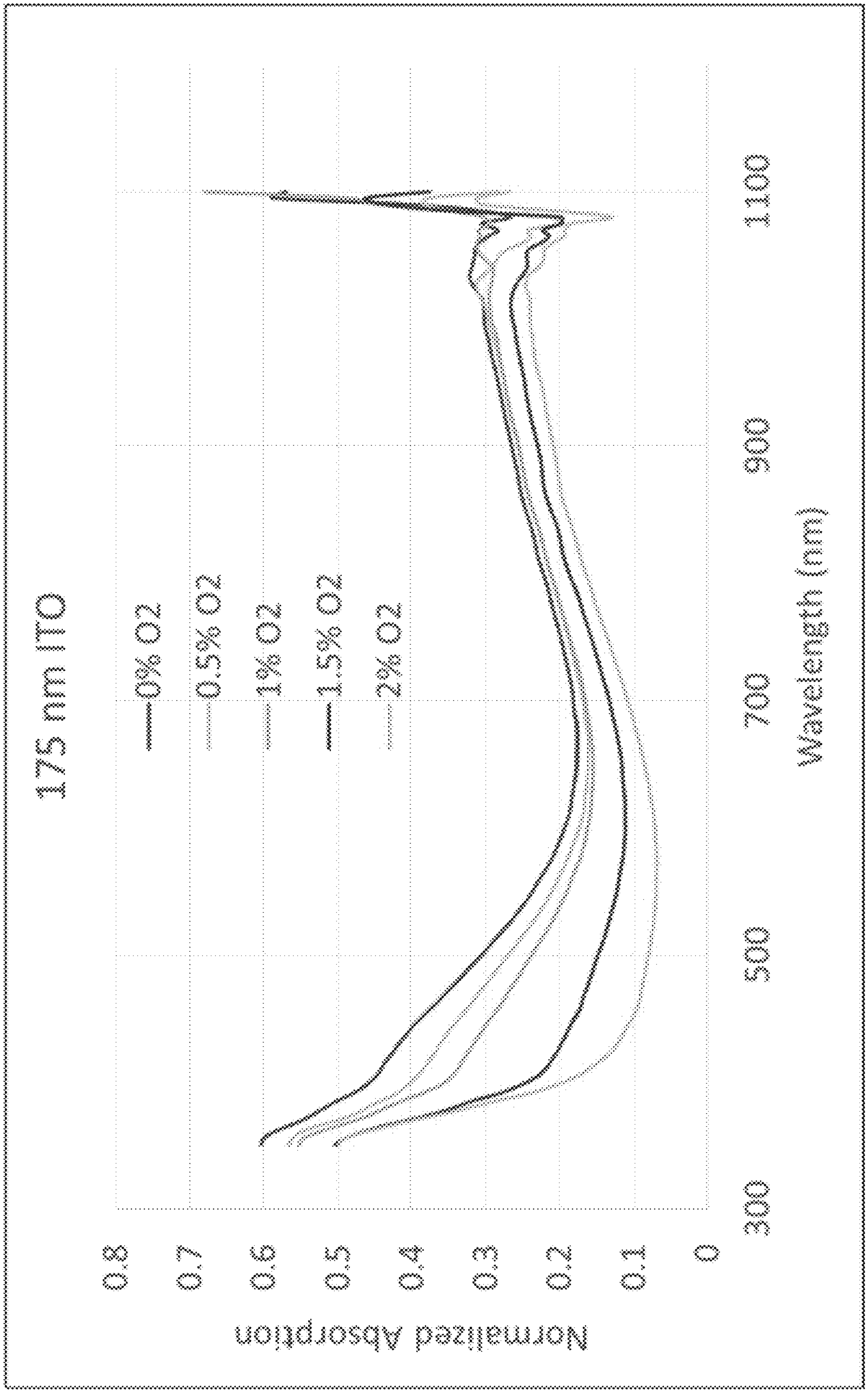

FIGS. 16(*a*) and (*b*) are line graphs showing the normalized absorption for transparent conductive oxide layers comprising indium-doped tin oxide in an atmosphere with 0% to 2% oxygen.

Figure 17A:
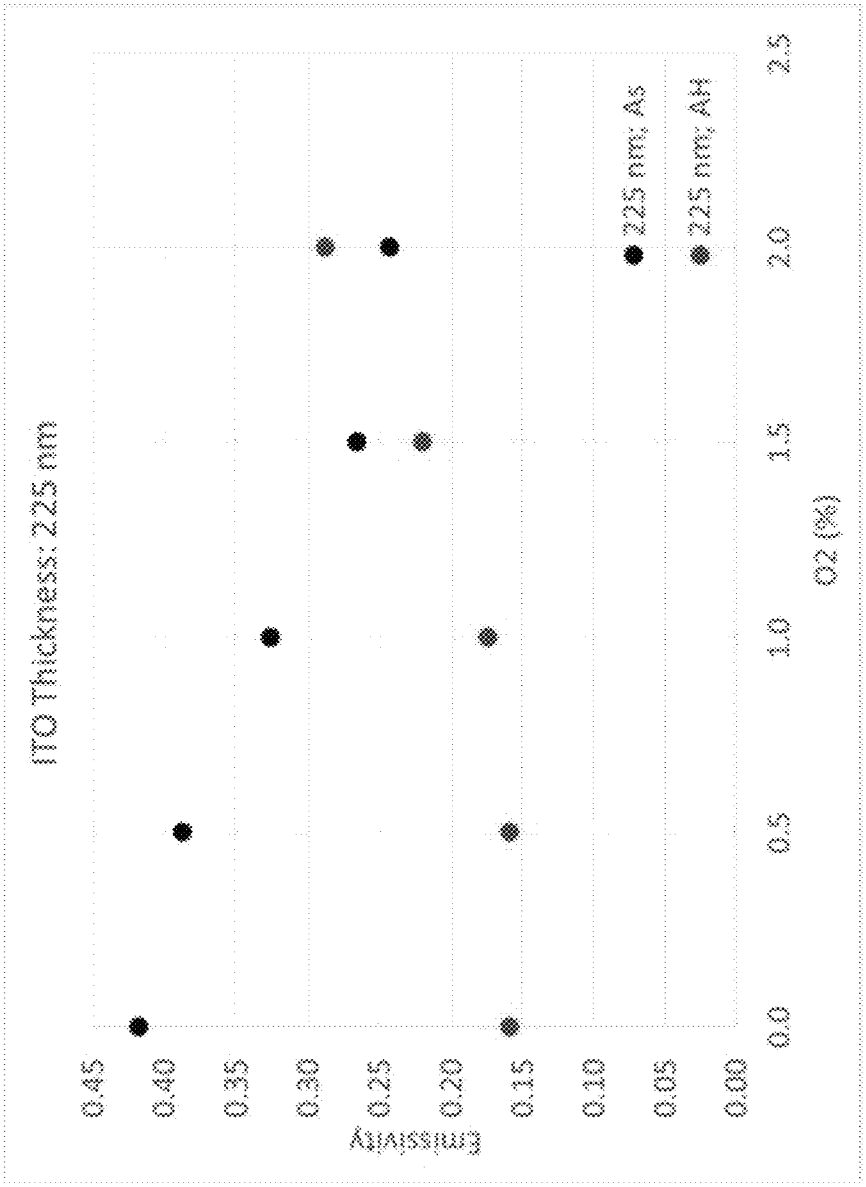
Figure 17B:
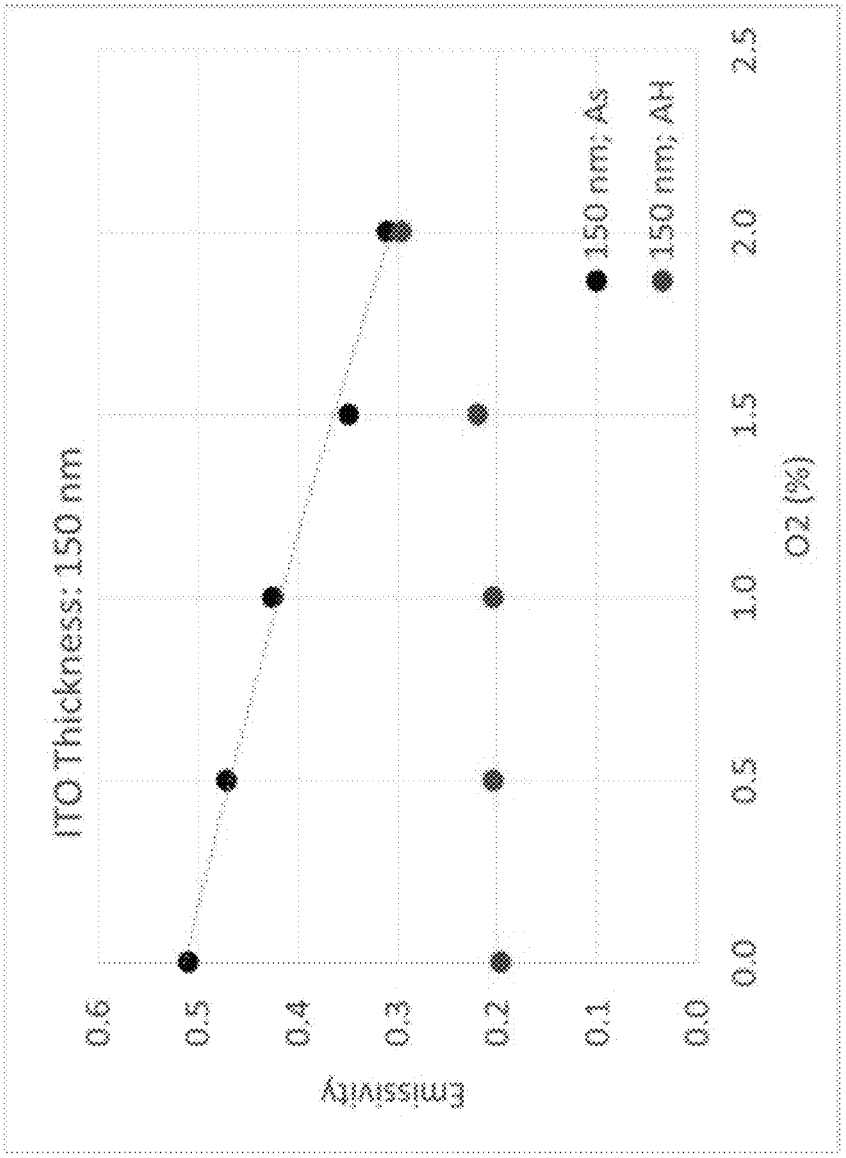

FIGS. 17(*a*) and *b*) are graphs showing the emissivity for transparent conductive oxide layers comprising indium-doped tin oxide in an atmosphere with 0% to 2% oxygen.

Figure 18:
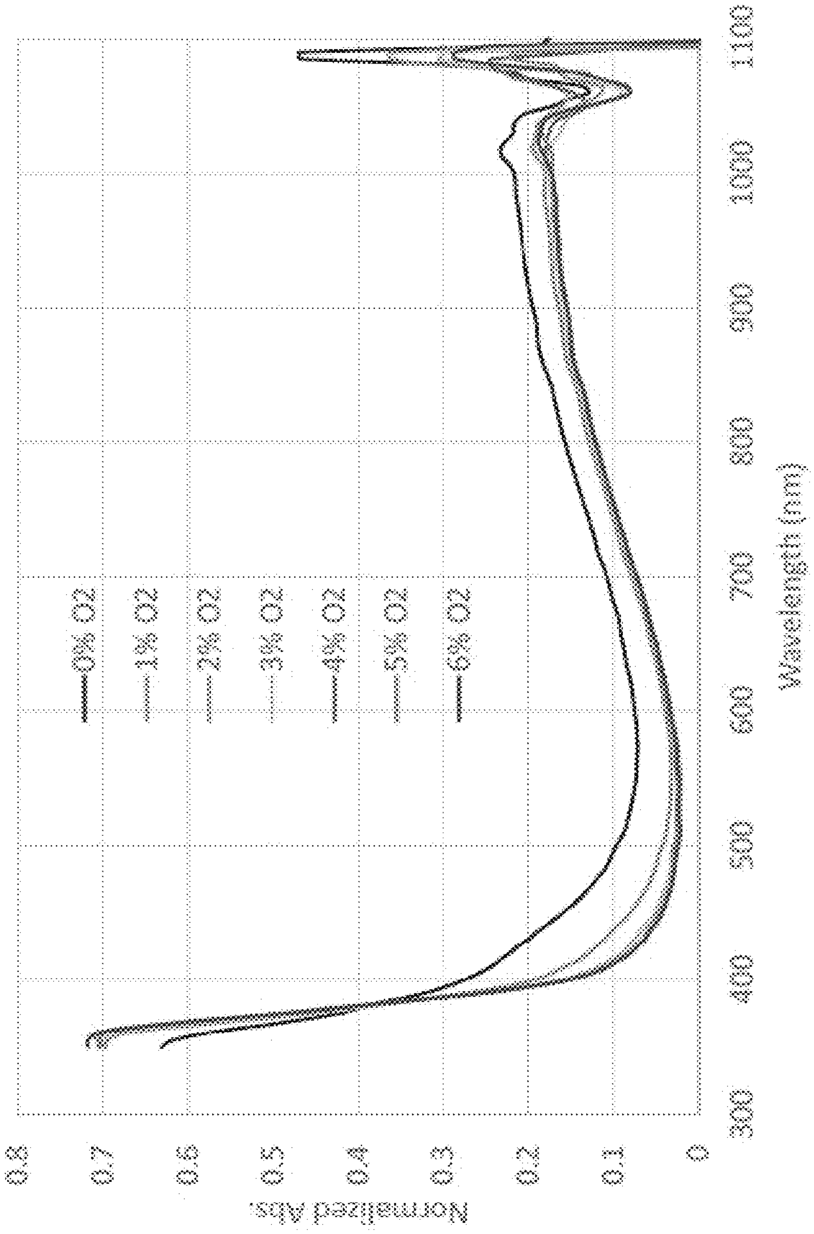

FIG. 18 is a graph showing the normalized absorbance for transparent conductive oxide layer comprising aluminum-doped zinc oxide in an atmosphere with 0% to 6% oxygen.

Figure 19:
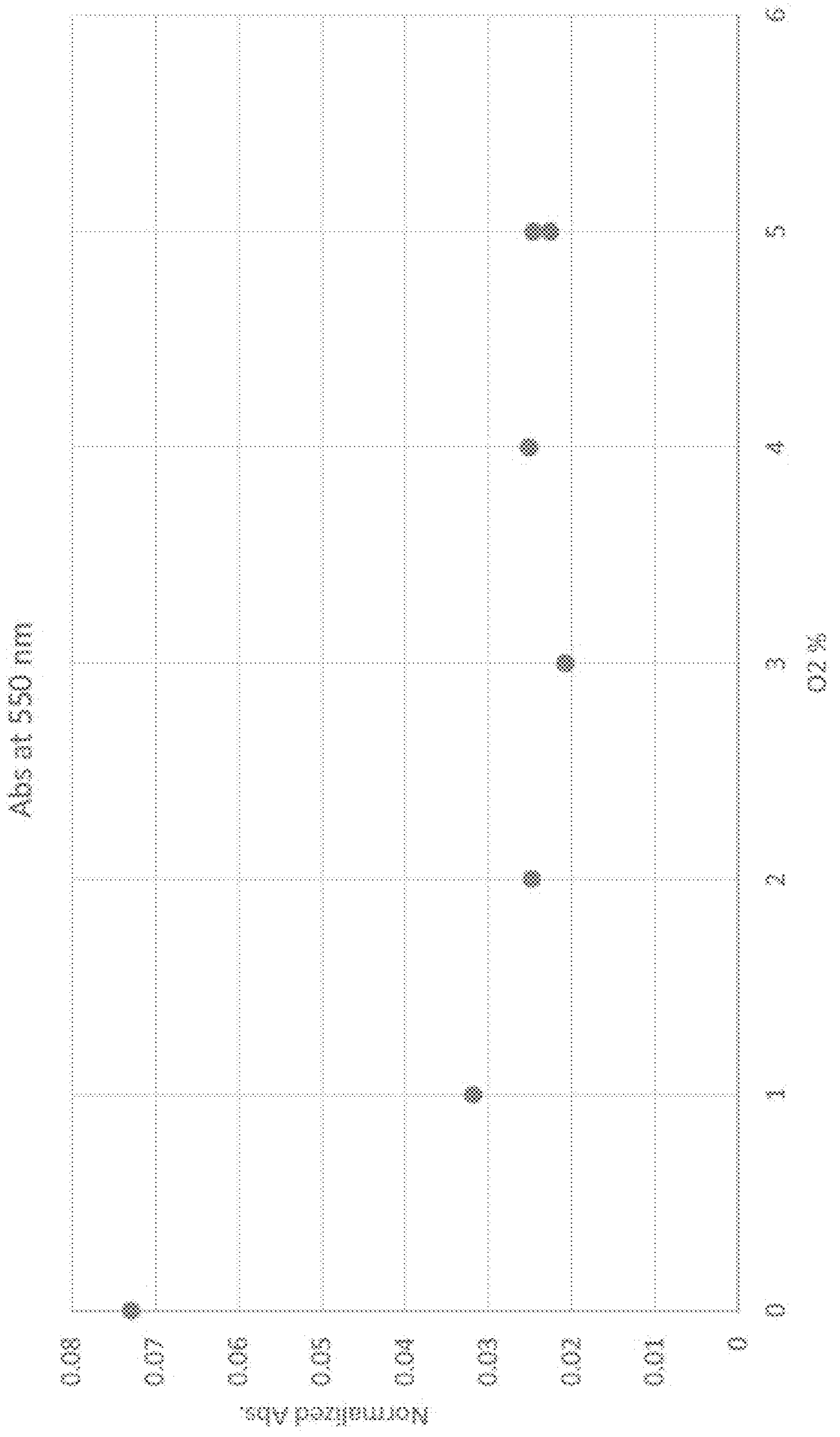

FIG. 19 is a graph showing normalized absorbance as a function of oxygen content supplied to a coater.

Figure 20:
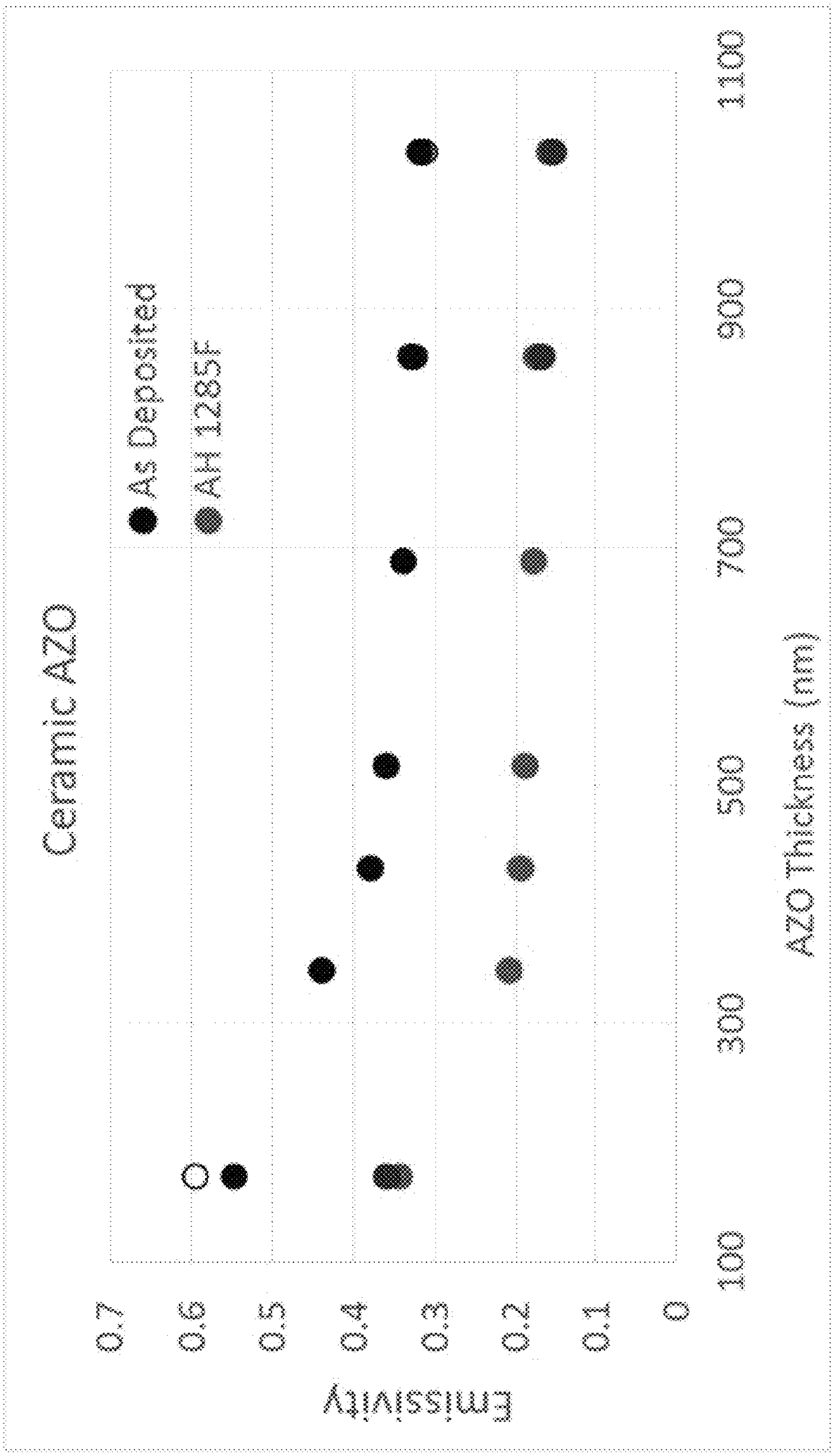

FIG. 20 is a graph showing the sheet resistance for a transparent conductive oxide layer comprising indium-doped tin oxide after post-deposition processing as a function of the surface temperature of the transparent conductive oxide layer.

Figure 21:
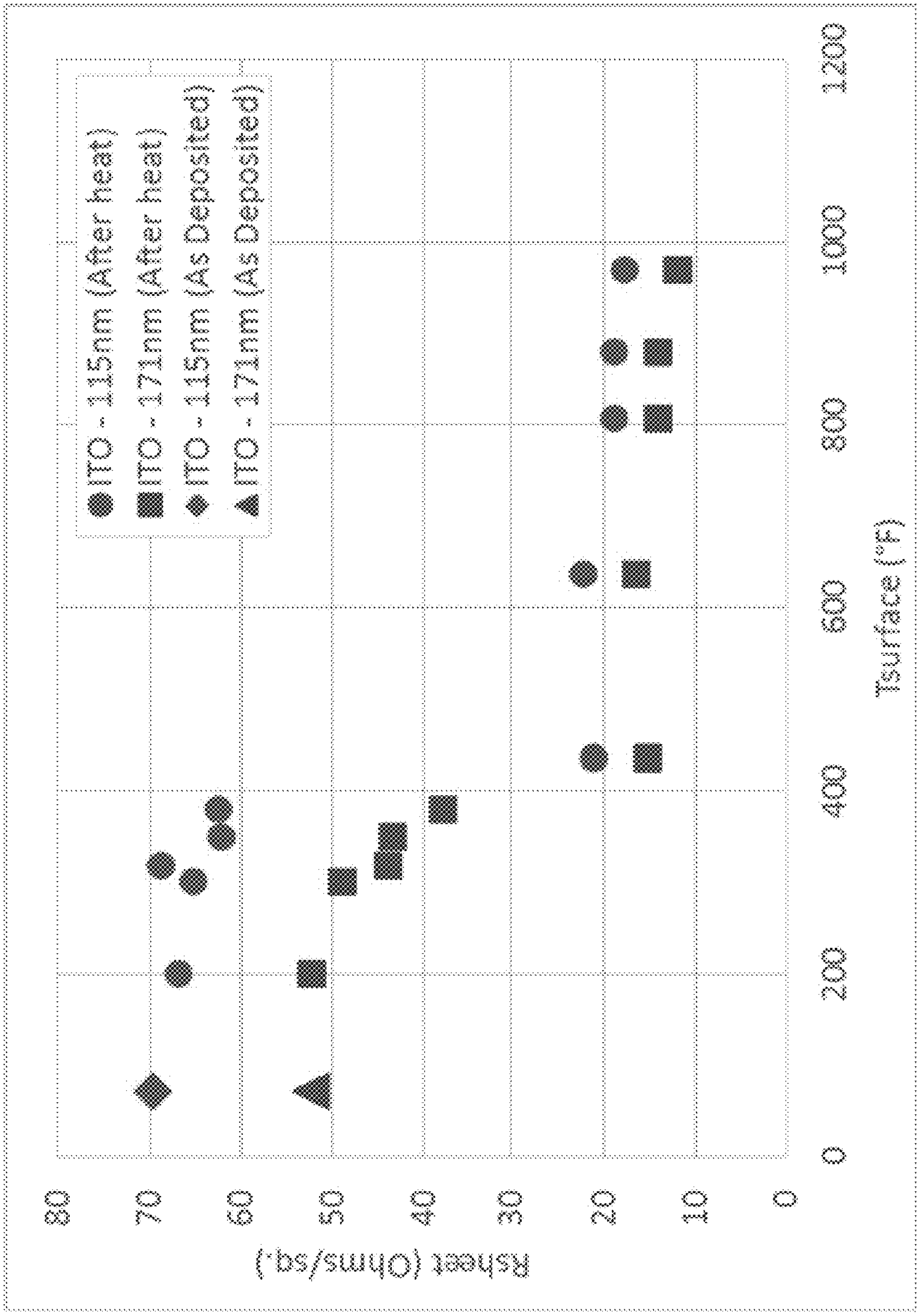

FIG. 21 is a graph showing sheet resistance as a function of the surface temperature of a transparent conductive oxide.

Figure 22:
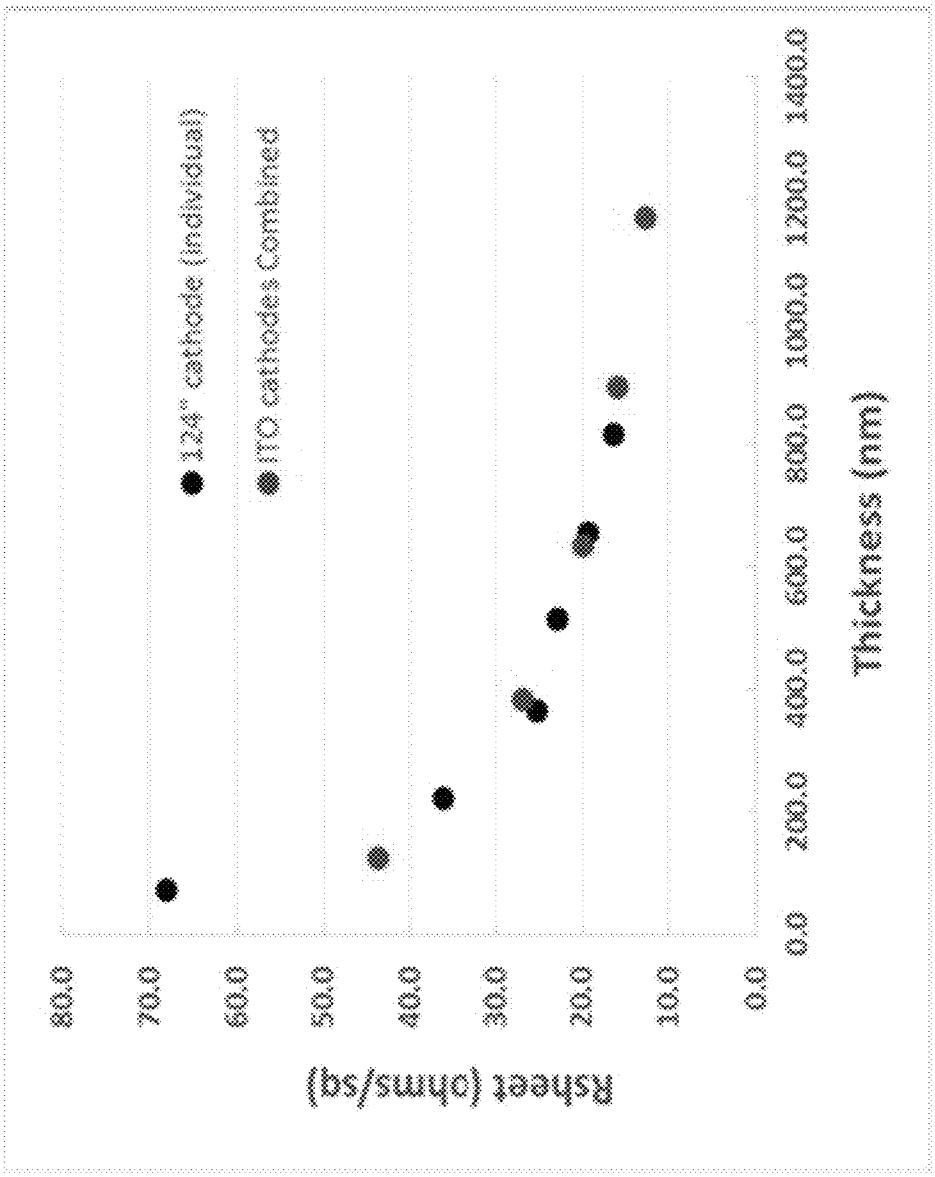

FIG. 22 is a graph showing the sheet resistance of ITO versus thickness for samples made with one ITO film or two ITO films which are deposited on each other to get the thickness.

DESCRIPTION OF THE INVENTION

Spatial or directional terms used herein, such as “left”, “right”, “upper”, “lower”, and the like, relate to the invention as it is shown in the drawing figures. It is to be understood that the invention can assume various alternative orientations and, accordingly, such terms are not to be considered as limiting.

As used herein, spatial or directional terms, such as “left”, “right”, “inner”, “outer”, “above”, “below”, and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term “about”. Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of “1 to 10” should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Additionally, all documents, such as but not limited to, issued patents and patent applications, referred to herein are to be considered to be “incorporated by reference” in their entirety. Any reference to amounts, unless otherwise specified, is “by weight percent”. The term “film” refers to a region of a coating having a desired or selected composition. A “layer” comprises one or more “films”. A “coating” or “coating stack” is comprised of one or more “layers”. The terms “metal” and “metal oxide” are to be considered to include silicon and silica, respectively, as well as traditionally recognized metals and metal oxides, even though silicon is technically not a metal.

All numbers used in the specification and claims are to be understood as being modified in all instances by the term “about”. All ranges disclosed herein are to be understood to encompass the beginning and ending range values and any and all subranges subsumed therein. The ranges set forth herein represent the average values over the specified range.

The term "over" means "farther from the substrate". For example, a second layer located "over" a first layer means that the second layer is located farther from the substrate than the first layer. The second layer can be in direct contact with the first layer or one or more other layers can be located between the second layer and the first layer.

All documents referred to herein are to be considered to be "incorporated by reference" in their entirety.

Any reference to amounts, unless otherwise specified, is "by weight percent".

The term "visible light" means electromagnetic radiation having a wavelength in the range of 380 nm to 780 nm. The term "infrared radiation" means electromagnetic radiation having a wavelength in the range of greater than 780 nm to 100,000 nm. The term "ultraviolet radiation" means electromagnetic energy having a wavelength in the range of 100 nm to less than 380 nm.

The terms "metal" and "metal oxide" include silicon and silica, respectively, as well as traditionally recognized metals and metal oxides, even though silicon may not be conventionally considered a metal. By "at least" is meant "greater than or equal to". By "not more than" is meant "less than or equal to".

All haze and transmittance values herein are those determined using a Haze-Gard Plus haze meter (commercially available from BYK-Gardner USA) and in accordance with ASTM D1003-07.

In instances where percent oxygen is referenced in a coater, the percent oxygen is the amount of oxygen added to the coater chamber in relation to other gases. For example, if 2% oxygen is added to the coater chamber's atmosphere, then 2% oxygen and 98% argon is added to the coater chamber. Argon can be substituted for other gases, but often the gases are inert gases.

The discussion of the invention herein may describe certain features as being "particularly" or "preferably" within certain limitations (e.g., "preferably", "more preferably", or "even more preferably", within certain limitations). It is to be understood that the invention is not limited to these particular or preferred limitations but encompasses the entire scope of the disclosure.

The invention comprises, consists of, or consists essentially of, the following aspects of the invention, in any combination. Various aspects of the invention are illustrated in separate drawing figures. However, it is to be understood that this is simply for ease of illustration and discussion. In the practice of the invention, one or more aspects of the invention shown in one drawing figure can be combined with one or more aspects of the invention shown in one or more of the other drawing figures.

An exemplary article includes a substrate 10, an underlayer 12 over the substrate 10 and a transparent conductive oxide 14 over the underlayer 12 is shown in FIG. 1.

The article 2 can be a window, a solar mirror, a solar cell, or an organic light emitting diode. The coating applied to the substrate 10 can provide low emissivity, low resistivity, scratch resistance, radio frequency attenuation or a desired color.

The substrate 10 can be transparent, translucent, or opaque to visible light. By "transparent" is meant having a visible light transmittance of greater than 0% up to 100%. Alternatively, the substrate 12 can be translucent or opaque. By "translucent" is meant allowing electromagnetic energy (e.g., visible light) to pass through but diffusing this energy such that objects on the side opposite the viewer are not clearly visible. By "opaque" is meant having a visible light transmittance of 0%.

The substrate 10 can be glass, plastic or metal. Examples of suitable plastic substrates include acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); or glass substrates. Examples of suitable glass substrates include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. Examples of suitable metal substrates include aluminum or stainless steel.

The substrate 10 can have a high visible light transmission at a reference wavelength of 550 nanometers (nm) and a thickness of 2 millimeters. By "high visible light transmission" is meant visible light transmission at 550 nm of greater than or equal to 85%, such as greater than or equal to 87%, such as greater than or equal to 90%, such as greater than or equal to 91%, such as greater than or equal to 92%.

The underlayer 12 can be a single layer, a homogeneous layer, a gradient layer, a bi-layer or can include a plurality of layers. By "homogeneous layer" is meant a layer in which the materials are randomly distributed throughout the coating. By "gradient layer" is meant a layer having two or more components, with the concentration of the components varying (continually changing or step change) as the distance from the substrate 12 changes.

The underlayer 12 can include two films: a first underlayer film 20 and a second underlayer film 22. The first underlayer film 20 is positioned over the substrate 10, and is closer to the substrate 10 than the second underlayer film 22. The first underlayer film 20 can be a material that has a higher refractive index than the second underlayer film 22 and/or the substrate 10. For example, the first underlayer film 20 can comprise a metal oxide, nitride, or oxynitride. Examples of suitable metals for the first underlayer film 20 include silicon, titanium, aluminum, zirconium, hafnium, niobium, zinc, bismuth, lead, indium, tin, tantalum, alloys thereof or mixtures thereof. For example, the first underlayer film 20 can include an oxide of zinc, tin, aluminum, and/or titanium, alloys thereof or mixtures thereof. For example, the first underlayer film 20 can include an oxide of zinc and/or tin. For example, the first underlayer film 20 can include zinc oxide and tin oxide, or zinc stannate.

The first underlayer film 20 can include zinc oxide. A zinc target to sputter a zinc oxide film may include one or more other materials to improve the sputtering characteristics of the zinc target. For example, the zinc target can include up to 15 wt. %, such as up to 10 wt. %, such as up to 5 wt. %, of such a material. The resultant zinc oxide layer would include a small percentage of an oxide of the added material, e.g., up to 15 wt. %, up to 10 wt. %, up to 9 wt. % of the material oxide. A layer deposited from a zinc target having up to 10 wt. %, e.g., up to 5 wt. % of an additional material to enhance the sputtering characteristics of the zinc target is referred to herein as "a zinc oxide layer" even though a small amount of the added material (or an oxide of the added material) may be present. An example of such a material is tin.

The first underlayer film 20 can include an alloy of zinc oxide and tin oxide. For example, the first underlayer film 20 can include or can be a zinc stannate layer. By "zinc stannate" is meant a composition of the formula: $Zn_XSn_{1-X}O_{2-X}$ (Formula 1) where "x" varies in the range of greater than 0 to less than 1. For instance, "x" can be greater than 0 and can be any fraction or decimal between greater than 0 to less than 1. A zinc stannate layer has one or more of the forms of Formula 1 in a predominant amount. A zinc stannate layer in which x=⅔ is conventionally referred to as "$Zn_2SnO_4$". The alloy of zinc oxide and tin oxide can include 80 wt % to 99 wt % zinc and 20 wt % to 1 wt % tin; such as 85 wt % zinc to 99 wt % zinc and 15 wt % tin to 1 wt % tin; 90 wt % zinc to 99 wt % zinc and 10 wt % tin to 1 wt % tin; such as approximately 90 wt % zinc and 10 wt % tin.

The second underlayer film 22 can be a material that has a lower refractive index than the first underlayer film 20. For example, the second underlayer film 22 can comprise a metal oxide, nitride, or oxynitride. Examples of suitable metals for the second underlayer film 22 include silicon, titanium, aluminum, zirconium, phosphorus, hafnium, niobium, zinc, bismuth, lead, indium, tin, tantalum alloys thereof or mixtures thereof.

For example, the second underlayer film 22 can include silica and alumina. According to this example, the second underlayer film 22 would have at least 50 weight % silica; 50 to 99 weight % silica and 50 to 1 weight % alumina; 60 to 98 weight % silica and 40 to 2 weight % alumina; 70 to 95 weight % silica and 30 to 5 weight % alumina; 80 to 90 weight % silica and 10 to 20 weight % alumina, or 8 weight % silica and 15 weight % alumina.

A transparent conductive oxide layer 14 is over the underlayer 12. The transparent conductive oxide layer 14 can be a single layer or can have multiple layers or regions. The transparent conductive oxide layer 14 has at least one conductive oxide layer. For example, the transparent conductive oxide layer 14 can include one or more metal oxide materials. For example, the transparent conductive oxide layer 14 can include one or more oxides of one or more of Zn, Fe, Mn, Al, Ce, Sn, Sb, Hf, Zr, Ni, Bi, Ti, Co, Cr, Si, In, or an alloy of two or more of these materials. For example, the transparent conductive oxide layer 14 can comprise tin oxide. In another example, the transparent conductive oxide layer 14 comprises zinc oxide The transparent conductive oxide layer 14 can include one or more dopant materials, such as, but not limited to, F, In, Al, P, Cu, Mo, Ta, Ti, Ni, Nb, W, Ga, Mg, and/or Sb. For example, the dopant can be In, Ga, Al or Mg. The dopant can be present in an amount less than 10 wt. %, such as less than 5 wt. %, such as less than 4 wt. %, such as less than 2 wt. %, such as less than 1 wt. %. The transparent conductive oxide layer 14 can be a doped metal oxide such as gallium-doped zinc oxide ("GZO"), aluminum-doped zinc oxide ("AZO"), indium-doped zinc oxide ("IZO") magnesium-doped zinc oxide ("MZO"), or tin-doped indium oxide ("ITO").

The transparent conductive oxide layer 14 can have a thickness in the range of 75 nm to 950 nm, such as 90 nm to 800 nm, such as 100 nm to 700 nm. For example, the transparent conductive oxide layer 14 can have a thickness in the range of 125 nm to 450 nm; at least 150 nm; or at least 175 nm. The transparent conductive oxide layer 14 can have a thickness that is no greater than 600 nm, 500 nm, 400 nm, 350 nm, 300 nm, 275 nm, 250 nm, or 225 nm.

Different transparent conductive oxide layer 14 materials have different sheet resistance at the same thickness, and impact the optics of the article differently, as well. Ideally, the sheet resistance should be less than 25Ω/□ ohms per square, or less than 20Ω/□, or less than 18Ω/□. For example, if the transparent conductive oxide layer 14 comprises GZO, it can have a thickness of at least 300 nm, and at most 400 nm. If the transparent conductive oxide layer 14 comprises AZO, it should have a thickness of at least 350 nm, or at least 400 nm, and a thickness at most 950 nm, or at most 800 nm, or at most 700 nm, or at most 600 nm. If the transparent conductive oxide layer 14 comprises ITO, it can have a thickness of at least 75 nm, at least 90 nm, at least 100 nm, at least 125 nm, or at least 150 nm, or at least 175 nm; and at most 350 nm, at most 300 nm, at most 275 nm, or at most 250 nm, or at most 225 nm.

The transparent conductive oxide layer 14 can have a surface roughness (RMS) in the range of 5 nm to 60 nm, such as 5 nm to 40 nm, such as 5 nm to 30 nm, such as 10 nm to 30 nm, such as 10 nm to 20 nm, such as 10 nm to 15 nm, such as 11 nm to 15 nm.

For example, when the transparent conductive oxide layer 14 is tin-doped indium oxide, the thickness of the transparent conductive oxide layer 14 can be in the range of 75 nm to 350 nm; 100 nm to 300 nm; 125 nm to 275 nm; 150 nm to 250 nm; or 175 nm to 225 nm.

The transparent conductive oxide layer 14 can have a sheet resistance in the range of 5Ω/□ to 25Ω/□, such as 8Ω/□ to 20Ω/□. For example, such as 10Ω/□ to 18 Ω/□.

For example, the article can be a glass substrate 10 with an underlayer 12 over the glass substrate 10. The underlayer 12 can have at least two films: a first underlayer film 20 and a second underlayer film 22. The first underlayer film 20 can be an alloy of zinc oxide and tin oxide, and the second underlayer film 22 and can be an alloy of silica and alumina. A transparent conductive oxide layer 14 can be over the second film 22. The transparent conductive oxide layer 14 can be ITO, GZO or AZO.

The transparent conductive oxide film provides that article with a certain sheet resistance, for example, less than 25Ω/□. Generally, as the thickness of the transparent conductive oxide increase, the sheet resistance decrease. Once the desired sheet resistance is identified and the necessary thickness for the transparent conductive oxide to achieve the desired sheet resistance, optical design software can be used to determine the thickness of the first film and the second film. An example of a suitable optical modelling software is FILM STAR. Ideally, one strives to have a color of a*, b* be −1, −1. Some variability, is acceptable in this color. For example, the a* can be as high as 1, 0 or −0.5 and as low as −9, −4, −3 or −1.5 and the b* value can be as high as 1, 0 or −0.5 and as low as −9, −4, −3 or −1.5. To obtain the desired color, one changes the thickness of the first film 20 and the second film 22 to obtain the desired color for the identified transparent conductive oxide and thickness of the transparent conductive oxide. For example, the first film may be between 10 and 20 nm thick, or between 11 and 15 nm thick; and the second film may be between 25 and 35 nm thick, or between 29 and 34 nm thick.

Figure 1A:
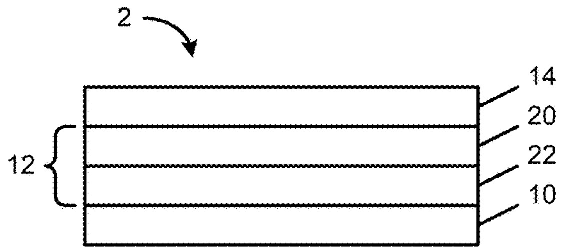
Figure 1B:
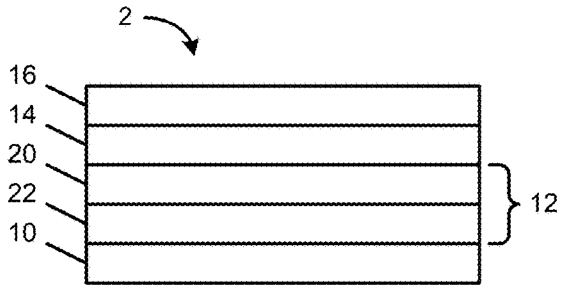
Figure 1C:
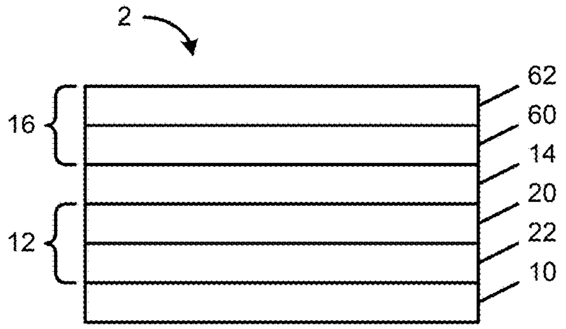
Figure 1D:
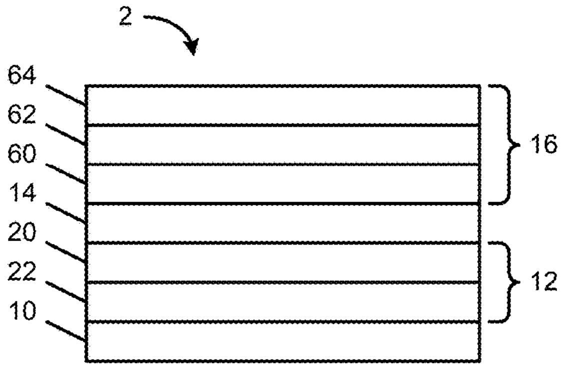
Figure 2A:
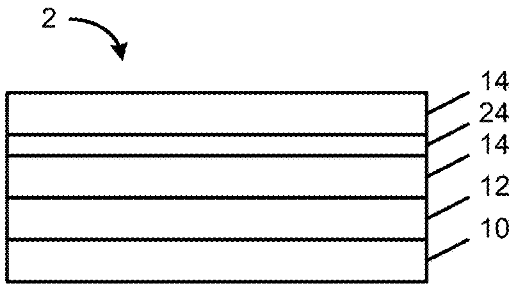
Figure 2B:
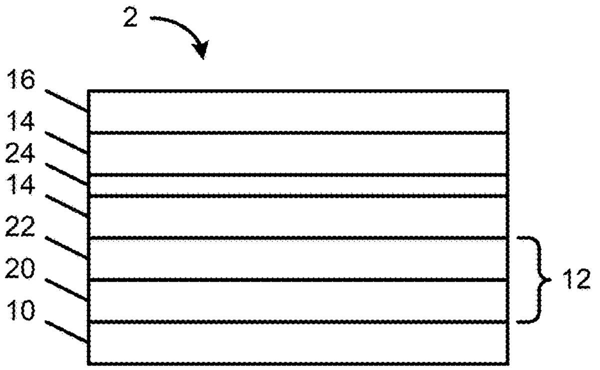
Figure 2C:
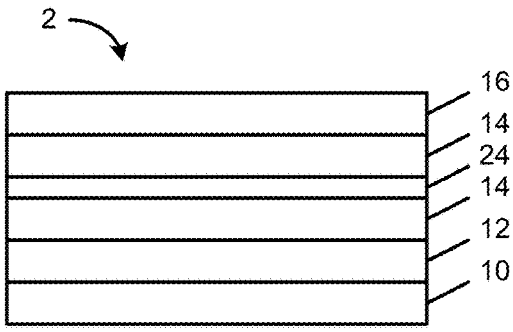
Figure 2D:
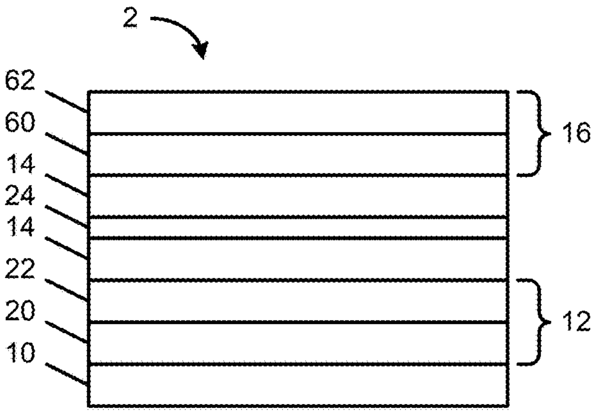
Figure 2E:
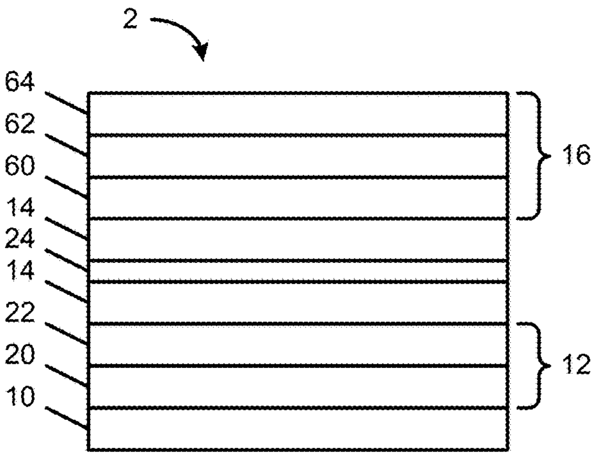
Figure 3A:
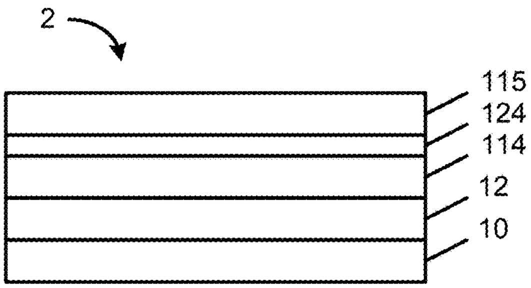
Figure 3B:
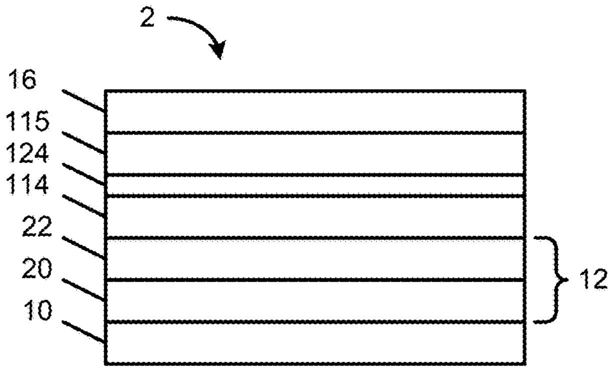
Figure 3C:
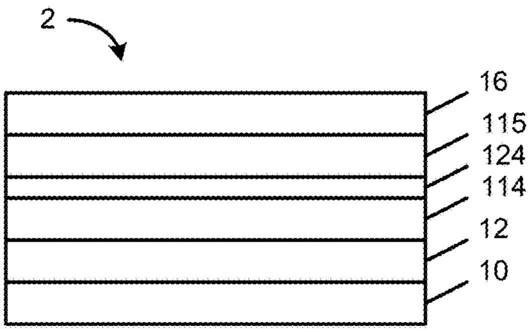
Figure 3D:
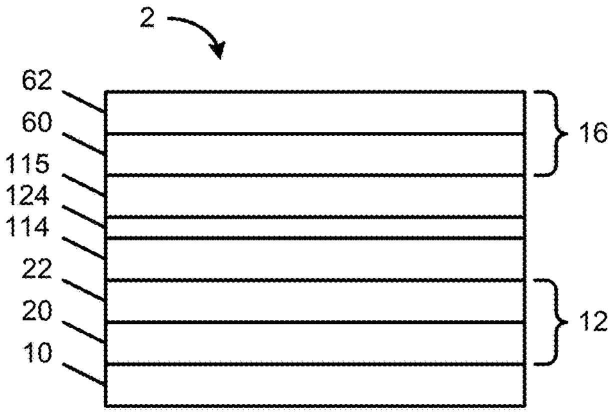
Figure 3E:
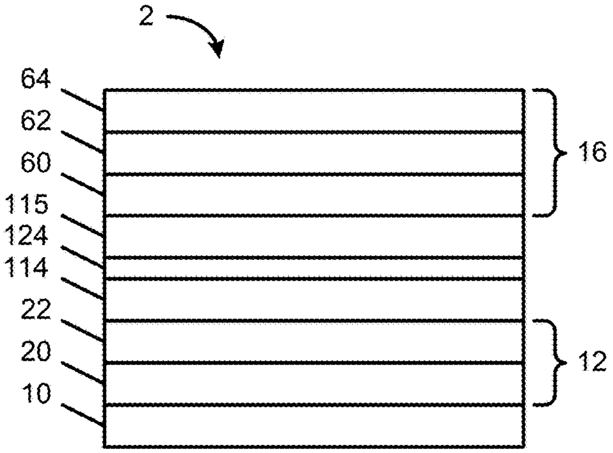

Referring to FIGS. 1*c* and 1*d*, the article 2 may optionally include a protective layer 16 over the transparent conductive oxide layer 14, such as the protective layer as described herein. For example, the protective layer 16 may include a first protective film 60 and a second protective film 62. The second protective film 62 may include a mixture of titania and silica. For example, the protective layer 16 have included a first protective film 60, a second protective film 62 and a third protective film 64.

An exemplary method of the invention is forming a coated substrate. A substrate 10 is provided. A transparent conductive oxide is identified. Once the transparent conductive oxide is identified, one can identify a thickness for the transparent conductive film that will provide the coated substrate with a sheet resistance of at least 5Ω/□ and/or no more than 25Ω/□, specifically no more than 20Ω/□, more specifically no more than 18Ω/□. A desired color of the coated substrate is also identified. A first underlayer material and a second underlayer material are identified using optical design software, a first underlayer film thickness and a second underlayer film thickness are determined that will provide the article having the above-identified transparent conductive oxide layer with a color wherein a* can be as high as 1 and as low as −9, and the b* value can be as high as 1 and as low as −9. The underlayer 12 is applied over the substrate by applying the first underlayer material over the substrate to form a first underlayer film 20 to the identified first film thickness, and applying the second underlayer material over the first underlayer film to the identified second underlayer film thickness to form the second underlayer film 22. The transparent conductive oxide material is applied over the underlayer 12 to the identified transparent conductive film thickness to form the transparent conductive oxide layer 14.

The thickness of the transparent conductive oxide layer 14 impacts the sheet resistance and the color of a substrate. The underlayer 12 is used to tune the color of the article having the transparent conductive oxide layer 14 at a specific thickness. This is done by identifying a first underlayer material and a second underlayer material, then, using a tool such as FILM STAR, identifying thicknesses for each underlayer material that provide the desired color. Once the first and second underlayer materials are identified, one can tune the thickness of each of these materials to achieve any desired color. Typically, a desired color is a*, b* be −1, −1. Some variability, is acceptable in this color. For example, the a* can be as high as 1 and as low as −9, and the b* value can be as high as 1 and as low as −9.

For example, one may wish to make a solar cell having a color of a*−1 and b*−1. A glass substrate would be provided. The transparent conductive oxide material could be identified as indium doped tin oxide ("ITO"). One would understand that if the thickness of the ITO transparent conductive oxide film is between 125 nm and 275 nm, one can achieve a sheet resistance of 5Ω/□ to 25Ω/□ with the invention disclosed herein. In order to achieve the desired color, one could select an underlayer 12 that has a first underlayer film 20 comprising zinc oxide and tin oxide, and a second underlayer film 22 comprising silica and alumina. The first underlayer film 20 would have a thickness between 10 nm and 15 nm, and the second underlayer film 22 would have a thickness between 29 nm and 34 nm. The first underlayer film 20 is applied over the substrate 10 at the identified thickness, and the second underlayer film 22 is applied over the first underlayer film 20 at the identified thickness. The transparent conductive oxide layer 14 is applied over the second underlayer film 22 at the identified thickness, thus forming an article having a color with an a* between −9 to 1, specifically between −4 and 0, more specifically between −3 and 1, more specifically between −1.5 and −0.5; and b* between −9 to 1, specifically between −4 and 0, more specifically between −1.5 and −0.5.

In another example, a glass substrate 10 would be provided. The transparent conductive oxide layer material could be identified as indium doped tin oxide ("ITO"). One would understand that if the thickness of the ITO transparent conductive oxide film is between 125 nm and 275 nm, one would achieve a sheet resistance of 5Ω/□ to 25Ω/□, specifically no more than 20Ω/□, more specifically no more than 18Ω/□. In order to achieve the desired color, one could select an underlayer 12 that has a first underlayer film 20 comprising zinc oxide and tin oxide, and a second underlayer film 22 comprising silica, and also consider the effect on the color that the protective layer 16 would have on the coated substrate. In this example, a protective layer of silica having a thickness of at least 30 nm and no more than 45 nm is used. The first underlayer film 20 would have a thickness between 10 nm and 15 nm, and the second underlayer film 22 would have a thickness between 29 nm and 34 nm. The first underlayer film 20 is applied over the substrate 10 at the identified thickness, and the second underlayer film 22 is applied over the first underlayer film 20 at the identified thickness. The transparent conductive oxide layer 14 is applied over the second underlayer film 22 at the identified thickness that provides the sheet resistance discussed above, thus forming a coated substrate having a color between a*−9 to 1, or −4 to 0, or −3 to 1, or −1.5 to −0.5 and b*−9 to 1; or −4 to 0, or −3 to 1, or −1.5 to −0.5.

In these examples, the underlayer is used to tune the color of the coated substrate.

FIG. 2 shows another exemplary article 2 that includes a substrate 10, an underlayer 12 over the substrate a transparent conductive oxide layer 14 over the underlayer 12 and an embedded film 24 comprising a second high refractive index material that is embedded in the transparent conductive oxide layer 14.

The substrate 10 can be any of the substrates discussed herein.

The underlayer 12 can have a first underlayer film 20 and an optional second underlayer film 22. The first underlayer film 20 has a first high refractive index material. The optional second underlayer film 22 has a first low refractive index material. The first high refractive index material has a refractive index higher than the first lower refractive index material.

The transparent conductive oxide layer 14 can be any of the transparent conductive oxides discussed above.

The embedded film 24 has a second high refractive index material embedded within the transparent conductive oxide layer 14. The second high refractive index material can be any material that has a higher refractive index than the first low refractive index material. For example, the second high refractive index material forming the embedded film 24 can comprise a metal oxide, nitride, or oxynitride. Examples of suitable oxide materials for the embedded film 24 include oxides of silicon, titanium, aluminum, zirconium, phosphorus, hafnium, niobium, zinc, bismuth, lead, indium, tin, and/or alloys and/or mixtures thereof. For example, the embedded film 24 can include an oxide of silicon and/or aluminum.

For example, the embedded film 24 can include an oxide of silicon and aluminum. According to this example, the second underlayer film 22 would have at least 50 volume % silica; 50 to 99 volume % silica and 50 to 1 volume % alumina; 60 to 98 volume % silica and 40 to 2 volume % alumina; 70 to 95 volume % silica and 30 to 5 volume % alumina; 80 to 90 weight % silica and 10 to 20 weight % alumina, or 8 weight % silica and 15 weight % alumina.

The embedded film 24 can have a thickness in the ranges of 5 nm to 50 nm, 10 to 40 nm or 15 to 30 nm.

The article may optionally include a protective layer 16 over the transparent conductive oxide layer 14, such as the protective layer is described herein. For example, the protective layer 16 may include a first protective film 60 and a second protective film 62. The second protective film 62 may include a mixture of titania and silica. For example, the protective layer 16 includes a first protective film 60, a second protective film 62 and a third protective film 64.

FIG. 3 shows another exemplary article 2 that includes a substrate 10, an underlayer 12 over the substrate, a first transparent conductive oxide layer 114 over the underlayer 12, an embedded film 124 over the first transparent conductive oxide layer 114. A second transparent conductive oxide layer 115 over the embedded film 124. Optionally, a protective layer 16 can be applied over the second transparent conductive oxide layer 115.

The embedded film 124 can comprise a metal oxide, nitride, or oxynitride. Examples of suitable materials for the second high refractive index metal include oxides of silicon, titanium, aluminum, zirconium, phosphorus, hafnium, niobium, zinc, bismuth, lead, indium, tin, and/or alloys and/or mixtures thereof. For example, the second high refractive index material can include silica and/or alumina.

For example, the embedded film 124 can include silica and alumina. The second high refractive index material would have at least 50 volume % silica; 50 to 99 volume % silica and 50 to 1 volume % alumina; 60 to 98 volume % silica and 40 to 2 volume % alumina; or 70 to 95 volume % silica and 30 to 5 volume % alumina; 80 to 90 weight % silica and 10 to 20 weight % alumina, or 8 weight % silica and 15 weight % alumina.

The embedded film 124 can have a thickness in the ranges of 5 nm to 50 nm, 10 to 40 nm or 15 to 30 nm.

The first transparent conductive oxide layer 114 and the second transparent conductive oxide layer 115 have a combined thickness of in the range of 75 nm to 950 nm, such as 90 nm to 800 nm, such as 125 nm to 700 nm. For example, the combined thickness can be no greater than 950 nm, 800 nm, 700 nm, 600 nm, 500 nm, 400 nm, 350 nm, 300 nm, 275 nm, 250 nm, or 225 nm. The combined thickness can be at least 75 nm, at least 90 nm, at least 100 nm, at least 125 nm, 150 nm or 175 nm. The first transparent conductive oxide layer 114 can have a thickness of at least 10 nm, at least 25 nm, 50 nm, 75 nm or 100 nm; and at most 650 nm, 550 nm, 475 nm, 350 nm, 250 nm or 150. The second transparent conductive oxide layer 115 can have a thickness of at least 10 nm, at least 25 nm, 50 nm, 75 nm or 100 nm; and at most 650 nm, 550 nm, 475 nm, 350 nm, 250 nm or 150. For example, if the first transparent conductive oxide layer 114 and the second transparent conductive oxide layer 115 comprises ITO, the first transparent conductive oxide layer 114 can have a thickness of at least 25 nm, 50 nm, 75 nm or 100 nm; and at most 200 nm, 175 nm, 150 nm or 125 nm; and the second transparent conductive oxide layer 115 can have a thickness of at least 25 nm, 50 nm, 75 nm or 100 nm; and at most 200 nm, 175 nm, 150 nm or 125 nm. In another example, if transparent conductive oxide layer 114 and the second transparent conductive oxide layer 115 comprises AZO, the first transparent conductive oxide layer 114 can have a thickness of at least 100 nm, at least 150 nm at least 200 nm, 250 nm, or 300 nm; and at most 650 nm, 550 nm, at most 450 nm, at most 325 nm or at most 200 nm; and the second transparent conductive oxide layer 115 can have a thickness of at least 100 nm, at least 150 nm at least 200 nm, 250 nm, or 300 nm; and at most 650 nm, 550 nm, at most 450 nm, at most 325 nm or at most 200 nm. In another example, if transparent conductive oxide layer 114 and the second transparent conductive oxide layer 115 comprises GZO, the first transparent conductive oxide layer 114 can have a thickness of at least 30 nm, at least 60 nm, at least 75 nm, at least 90 nm, at least 100 nm, at least 125 nm, at least 150 nm, 200 nm, or 300 nm; and at most 350 nm, at most 300 nm, 275 nm, at most 250 nm, or at most 225 nm; and the second transparent conductive oxide layer 115 can have a thickness of at least 30 nm, at least 60 nm, at least 75 nm, at least 90 nm, at least 100 nm, at least 125 nm, at least 150 nm, 200 nm, or 300 nm; and 350 nm, at most 300 nm, 275 nm, at most 250 nm, or at most 225 nm.

By changing the thickness of the first and second transparent conductive oxide layers 114, 115, one moves the embedded film 124 either higher in the transparent conductive oxide layer 14, or lower in the transparent conductive oxide layer 14. Surprisingly, no matter where the embedded film 24, 124 is positioned within the coating stack, there is a significant increase in the sheet resistance (see FIG. 13*a*). Also surprisingly, the position of the embedded film 24, 124 within the transparent conductive oxide layer 14 has a different impact on the light transmission (see FIG. 13*b*). When the first transparent conductive oxide layer 114 is thinner than the second transparent conductive oxide layer 115, thereby the embedded film 124 is positioned lower within the transparent conductive oxide layer 14, there is an increase in light transmission (see FIG. 13*b*). This increase is more pronounced when the first transparent conductive oxide layer 114 is thicker than the second transparent conductive oxide layer 115, thereby the embedded film 124 is positioned higher within the transparent conductive oxide layer 14 (see FIG. 13*b*). However, if the thickness of the first transparent conductive oxide layer 114 is approximately equal to the thickness of the second transparent conductive oxide layer 115, thereby the embedded film 124 is positioned at approximately the middle of the transparent conductive oxide layer 14, the transmission decreases (see FIG. 13*b*). For example, the second transparent conductive oxide film 115 can be at least 25%, at least 50%, at least 75%, at least 100% (i.e. at least doubled), at least 125% or at least 150% thicker than the first transparent conductive oxide film 114; and can be at most 250% thicker; at most 200% thicker; at most 150% thicker; at most 125% thicker; at most 100% (i.e. at most doubled) thicker; at most 75% thicker; at most 50% thicker or at most 25% thicker than the first transparent conductive oxide film 114. Alternatively, the second transparent conductive oxide film 115 can be at least 25%, at least 50%, at least 75%, at least 100% (i.e. at least doubled), at least 125% or at least 150% thinner than the first transparent conductive oxide film 114; and can be at most 250% thinner; at most 200% thinner; at most 150% thinner; at most 125% thinner; at most 100% (i.e. at most doubled) thinner; at most 75% thinner; at most 50% thinner or at most 25% thinner than the first transparent conductive oxide film 114

Another example of the invention is a method of making a coated article 2. A substrate 10 is provided. A first underlayer film 20 having a first high refractive index material is applied over at least a portion of the substrate 10. A second underlayer film 22 having a first low refractive index material is applied over at least a portion of the first underlayer film 20, wherein the first lower refractive index material has a refractive index that is lower than the first high refractive index film. A first transparent conductive oxide film 114 is applied over at least a portion of the underlayer 12. An embedded film 124 having a second high refractive index material is applied over at least a portion of the first transparent conductive oxide film 114, wherein the second high refractive index material has a refractive index that is greater than the first low refractive index material, or has a refractive index that is within 10%, or 5% of the refractive index for the first high refractive index, or is the same material as the first high refractive index material, or has the same refractive index as the first high refractive index material. A second transparent conductive oxide film 115 is applied over at least a portion of the embedded film 124. The second high refractive index film splits the transparent conductive oxide film into two portions, the first transparent conductive oxide film and the second transparent conductive oxide film.

The embedded film 124 also allows one to tune a color for the coated substrate. The color can have an a* of at least −9, −4, −3 or −1.5 and at most 1, 0 or −0.5 and have a b* of at least −9, −4, −3 or −1.5 and at most 1, 0 or −0.5.

By changing the thicknesses of the two high refractive index materials, and the low refractive index material, one can tune the color of the coated substrate. To this end, first, one should identify the material that will be used in the transparent conductive oxide films 114 and 115. Once that material is identified, a desired sheet resistance is identified. By knowing the material and the sheet resistance, one can determine the thickness of the transparent conductive oxide layer 14, or the combined thickness of the first and second transparent conductive oxide films 114 and 115. The transparent conductive oxide layer 14 will impact the color of the coated substrate. To offset this color impact, one can use an optical design tool (e.g. FILM STAR) to identify the thicknesses for the first and second underlayer films 20 and 22, and the thickness of the embedded film 24, 124. This is done by inputting the thickness of the transparent conductive oxide layer 14 into the software, identifying the first high refractive index material, second high refractive index material and first lower refractive index material. With these parameters, one can determine the thickness of the first and second underlayer films 20 and 24, and the embedded film 24, 124. These films are then applied at those identified thicknesses.

For example, the method may include identifying a first transparent conductive oxide material to be used in the first transparent conductive oxide film 114, and a second transparent conductive oxide material to be used in the second transparent conductive oxide 115. These transparent conductive oxides can be GZO, AZO, IZO, MZO, or ITO.

A thickness for the transparent conductive oxide layer 14 can be identified by first identifying a desired sheet resistance. Once the sheet resistance is identified, one can then identify the combined thickness of both transparent conductive oxide films 114, 115. The sheet resistance can be at least 8Ω/□, at least 10Ω/□, or at least 12Ω/□; and can be at most 25Ω/□, at most 20Ω/□, or at most 18Ω/□. To achieve those values, the combined thickness of the transparent conductive oxide layer 14 can be at least 75 nm, at least 90 nm, at least 100 nm; at least 175 nm; at least 180 nm; at least 190 nm; at least 200 nm; at least 205 nm; at least 225 nm; or at least 360 nm. Since the transparent conductive oxide layer 14 impacts the color of the coated substrate, it is important to minimize the combined thickness of the transparent conductive oxide films 114, 115. To this end, the combined thickness of the transparent conductive oxide films 114, 115 can be at most 800 nm; at most 700 nm; at most 360 nm; at least 350 nm, at most 300 nm, at most 275 bnm, at most 250 nm, at most 225 nm; at most 205 nm; at most 200 nm; at most 190 nm; at most 180 nm or at most 175 nm.

One also determines the position of the embedded film 24,124 within the transparent conductive oxide. In doing so, one considers whether one desires to have increase or decrease transmission (see FIG. 13(*b*)). The first transparent conductive oxide film 114 can be thicker, thinner or about the same thickness as the second conductive oxide film 115.

A first high refractive index material for a first underlayer film 20, a first low refractive index material for a second underlayer film 22 and a second high refractive index material for embedded film 24,124 are identified. Optionally a protective layer 16 may be identified with identified thickness for each protective layer film 60, 62 and/or 64. A desired color is identified. Those parameters are inputted into an optical design tool, such as FILM STAR, and thickness for the first underlayer film 20 and underlayer film 22 and embedded film 124 are identified.

Figure 4A:
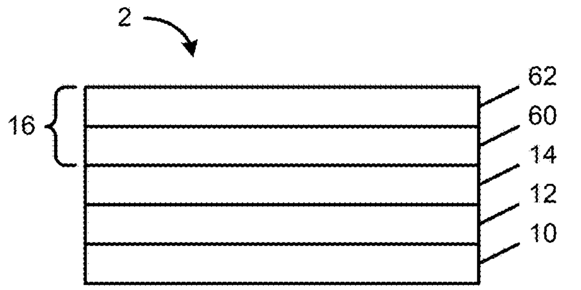
Figure 4B:
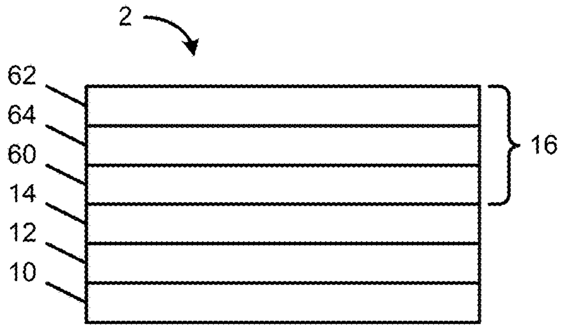

The coating stack having the underlayer 12, transparent conductive oxide layer 14, embedded film 24,124 and optional protective layer 16 are applied over the substrate at the identified thickness. The thickness of the underlay films 20, 22 and embedded film 24,124 tune the color of the article 2 to the desired color FIGS. 4*a* and 4*b* shows another exemplary article 2 that includes a substrate 10, an underlayer 12 over the substrate 10, a transparent conductive oxide layer 14 over the underlayer 12, and a protective layer 16 over the transparent conductive oxide layer 14. The substrate 10, underlayer 12, and transparent conductive oxide layer 14 can be any of substrates or underlayers discussed herein. The transparent conductive oxide layer 14 can be divided by the embedded layers 24,124 discussed herein.

The protective layer 16 is over the transparent conductive oxide layer 14, or optionally in direct contact with the transparent conductive oxide layer 14. It can include at least two protective films 60, 62 or at least three protective films 60, 62, 64.

FIG. 4*a* shows an example of an article with a protective layer having two protective films 60, 62. The first protective film 60 is positioned over the transparent conductive oxide layer 14, and is closer to the transparent conductive oxide layer 14 than the second protective film 62. The second protective film 62 is the outer most film in the coating 18 on the coated article.

The first protective film 60 can comprise alumina, silica, titania, zirconia, tin oxide or mixtures thereof. For example, the first protective film can comprise a mixture of silica and alumina. In another example, the first protective film 60 can comprise zinc stannate. In another example, the first protective film 60 can comprise zirconia.

The second protective film 62 comprises a mixture of titania and alumina. The second protective film 62 is the last film in a coating 18 applied over the substrate 10.

The second protective film 62 comprises 40-60 weight percent of alumina, and 60-40 weight percent of titania; 45-55 weight percent of alumina, and 55-45 weight percent of titania; 48-52 weight percent of alumina, and 52-48 weight percent of titania; 49-51 weight percent of alumina, and 51-49 weight percent of titania; or 50 weight percent of alumina, and 50 weight percent of titania.

As shown in FIG. 4*b*, the protective layer 16 may further comprise a third protective film 64 positioned between the first protective film 60 and the second protective film 62. The third protective film 64 can comprise alumina, silica, titania, zirconia, tin oxide or mixtures thereof. For example, the third protective film 64 can comprise a mixture of silica and alumina. In another example, the third protective film 64 comprises zinc stannate. In another example, the third protective film 64 comprises zirconia.

Figure 5A:
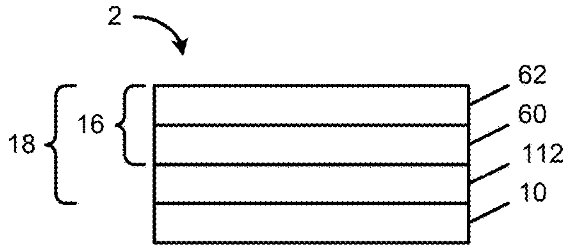
Figure 5B:
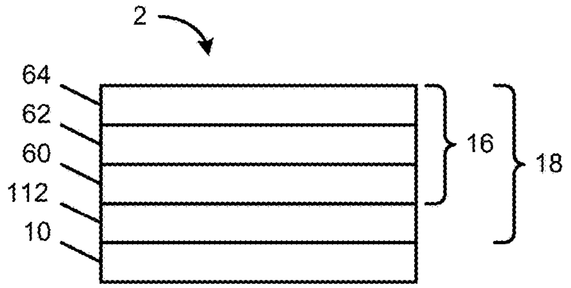

Another exemplary article is shown in FIGS. 5*a* and *b*, which includes a substrate 10, a functional coating 112 and a protective layer 16. The substrate in this method may be glass, plastic or metal.

The functional coating 112 can be any functional coating. For example, it can include multiple dielectric films or multiple metal films. The function coating can include the underlayer 12 described herein, and/or the transparent conductive oxide layer 14 descried herein. The protective layer 16 can be a first protective film 60 and a second protective film 62 as described herein. In this instance, the second protective film 62 is the outer most film, and includes alumina and titania.

The protective layer can have a total thickness of at least 20 nm, 40 nm, 60 nm, or 80 nm, 100 nm or 120 nm; and at most 275 nm, 255 nm, 240 nm, 170 nm, 150 nm, 125 nm or 100 nm. The first protective film can have a thickness of at least 10 nm, at least 15 nm at least 27 nm, at least 35 nm, at least 40 nm, at least 54 nm, at least 72 nm; and at most 85 nm, 70 nm, 60 nm 50 nm, 45 nm, 30 nm. The second protective film can have a thickness of at least 10 nm, at least 15 nm at least 27 nm, at least 35 nm, at least 40 nm, at least 54 nm, at least 72 nm; and at most 85 nm, 70 nm, 60 nm 50 nm, 45 nm, 30 nm. The optional third protective film can have a thickness of at least 10 nm, at least 15 nm at least 27 nm, at least 35 nm, at least 40 nm, at least 54 nm, at least 72 nm; and at most 85 nm, 70 nm, 60 nm 50 nm, 45 nm, 30 nm. For example, the protective layer can have the thickness listed in Table 1, below. In one embodiment, the 1$^{st}$ protective film has a thickness of at least 20 nm or at least 30 nm; and at most 60 nm or at most 50 nm. The second protective film has a thickness of at least 15 nm, or at least 20 nm; and at most 50 nm or at most 40 nm. The optional third protective layer has a thickness of at least 5 nm, or at least 10 nm; and at most 30 nm or at most 20 nm. The optional third protective layer may be positioned between the first protective film and the functional layer, or between the first protective film and the second protective film.

TABLE 1

| Exemplary Thickness for a Protective Layer | | |
|---|---|---|
| 1$^{st}$ Protective Film | Optional 3$^{rd}$ Protective Film | 2$^{nd}$ Protective Film |
| 27 nm | — | 33 nm |
| 27 nm | — | 50 nm |
| 27 nm | — | 68 nm |
| 27 nm | — | 85 nm |
| 54 nm | — | 33 nm |
| 54 nm | — | 50 nm |
| 54 nm | — | 68 nm |
| 54 nm | — | 85 nm |
| 72 nm | — | 33 nm |
| 72 nm | — | 50 nm |
| 72 nm | — | 68 nm |
| 72 nm | — | 85 nm |
| 50 nm | — | 50 nm |
| 50 nm | — | 70 nm |
| 50 nm | — | 85 nm |
| 70 nm | — | 50 nm |
| 70 nm | — | 70 nm |
| 70 nm | — | 85 nm |
| 20 nm | — | 20 nm |
| 20 nm | — | 30 nm |
| 20 nm | — | 40 nm |
| 30 nm | — | 20 nm |
| 30 nm | — | 30 nm |

TABLE 1-continued

| Exemplary Thickness for a Protective Layer | | |
|---|---|---|
| 1$^{st}$ Protective Film | Optional 3$^{rd}$ Protective Film | 2$^{nd}$ Protective Film |
| 30 nm | — | 40 nm |
| 40 nm | — | 20 nm |
| 40 nm | — | 30 nm |
| 40 nm | — | 40 nm |
| 50 nm | 15 nm | 50 nm |
| 50 nm | 15 nm | 70 nm |
| 50 nm | 15 nm | 85 nm |
| 70 nm | 15 nm | 50 nm |
| 70 nm | 15 nm | 70 nm |
| 70 nm | 15 nm | 85 nm |
| 15 nm | 50 nm | 50 nm |
| 15 nm | 50 nm | 70 nm |
| 15 nm | 50 nm | 85 nm |
| 15 nm | 70 nm | 50 nm |
| 15 nm | 70 nm | 70 nm |
| 15 nm | 70 nm | 85 nm |

The functional coating 112 can be a single film functional coating or can be a multi-film functional coating that includes a one or more dielectric layers and/or one or more infrared reflective layers.

The functional coating 112 can, for example, be a solar control coating. The term "solar control coating" refers to a coating comprised of one or more layers or films that affect the solar properties of the coated article, such as, but not limited to, the amount of solar radiation, for example, visible, infrared, or ultraviolet radiation, reflected from, absorbed by, or passing through the coated article; shading coefficient; emissivity, etc. The solar control coating can block, absorb, or filter selected portions of the solar spectrum, such as, but not limited to, the IR, UV, and/or visible spectrums.

The functional coating 112 can, for example, include one or more dielectric films. The dielectric film can comprise an anti-reflective material, including, but not limited to, metal oxides, oxides of metal alloys, nitrides, oxynitrides, or mixtures thereof. The dielectric film can be transparent to visible light. Examples of suitable metal oxides for the dielectric film include oxides of titanium, hafnium, zirconium, niobium, zinc, bismuth, lead, indium, tin, and mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate, defined below), oxides of indium-tin alloys, silicon nitrides, silicon aluminum nitrides, or aluminum nitrides. Further, doped metal oxides, such as antimony or indium doped tin oxides or nickel or boron doped silicon oxides, can be used. The dielectric film can be a substantially single phase film, such as a metal alloy oxide film, e.g., zinc stannate, or can be a mixture of phases composed of zinc and tin oxides or can be composed of a plurality of films.

The functional coating 112 can include a radiation reflective film. The radiation reflective film can include a reflective metal, such as, but not limited to, metallic gold, copper, palladium, aluminum, silver, or mixtures thereof. In one embodiment, the radiation reflective film comprises a metallic silver layer.

Figure 6A:
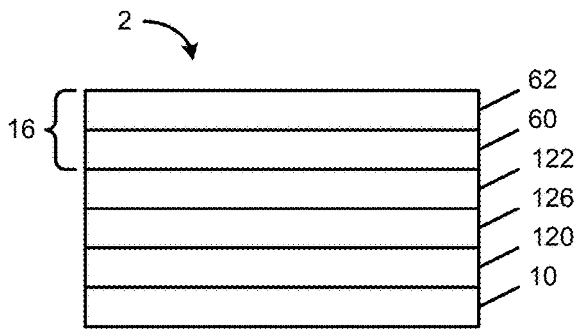
Figure 6B:
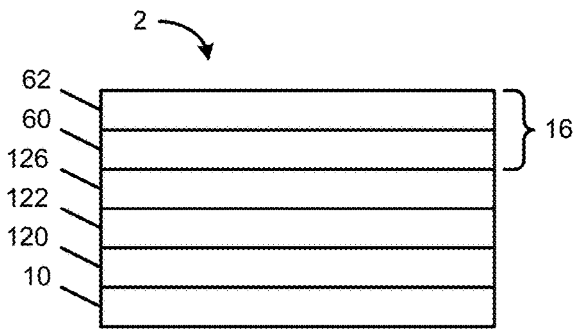
Figure 6C:
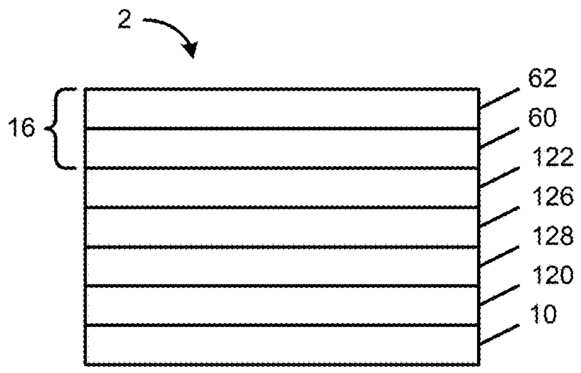
Figure 6D:
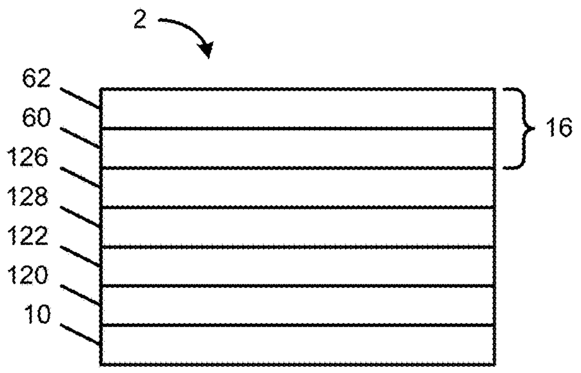
Figure 6E:
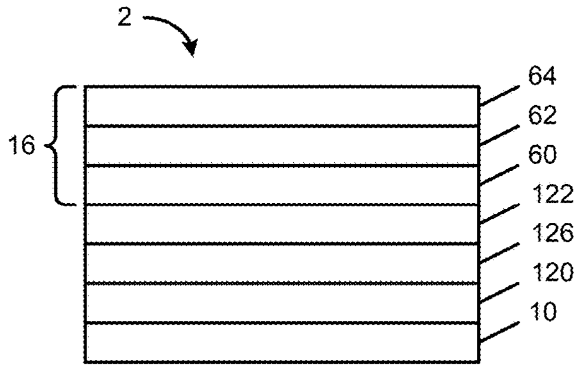
Figure 6F:
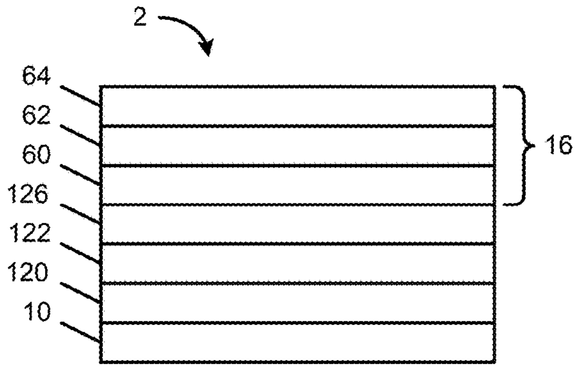
Figure 6G:
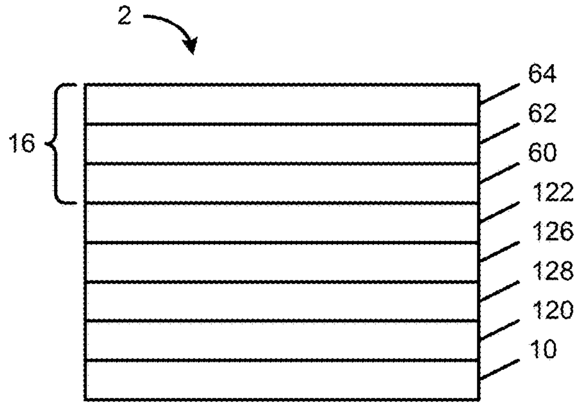
Figure 6H:
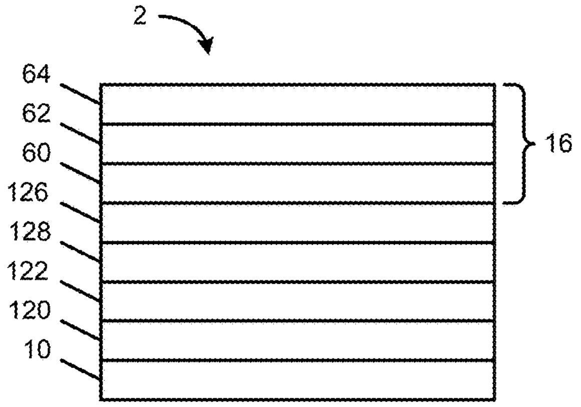

In one embodiment, the functional coating comprises a first dielectric layer 120 over the substrate 10, a second dielectric layer 122 over the first dielectric layer 120, and a metal layer 126 either between the first dielectric layer and second dielectric layer 120 (see FIG. 7) or over the second dielectric layer 122 (see FIG. 6*a*). The protective coating 16 is positioned over the metal layer 126 (see FIG. 6*b*). Optionally, a primer 128 may be applied between the metal film and the first dielectric layer (see FIG. 6*c*) or the second dielectric layer (see FIG. 6*d*).

The dielectric films 120 and 122 can be transparent to visible light. Examples of suitable metal oxides for the dielectric films 120 and 122 include oxides of titanium, hafnium, zirconium, niobium, zinc, bismuth, lead, indium, tin, and mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate, defined above), oxides of indium-tin alloys, silicon nitrides, silicon aluminum nitrides, or aluminum nitrides. Further, doped metal oxides, such as antimony or indium doped tin oxides or nickel or boron doped silicon oxides, can be used. The dielectric films 120 and 122 can be a substantially single phase film, such as a metal alloy oxide film, e.g., zinc stannate, or can be a mixture of phases composed of zinc and tin oxides. The dielectric films 120 and 122 can have a combined thickness in the range of 100 Å to 600 Å, such as 200 Å to 500 Å, such as 250 Å to 350 Å.

The metal film 126 may be selected from the group consisting of metallic gold, copper, palladium, aluminum, silver, and alloys thereof. For example, the metal film 126 can be silver.

The optional primer 128 can be a single film or multiple films. For example, the primer 128 can include an oxygen-capturing material that can be sacrificed during the deposition process to prevent degradation or oxidation of the metal film 126 during the sputtering process or subsequent heating processes. The primer 128 can also absorb at least a portion of electromagnetic radiation, such as visible light, passing through the coating. Examples of materials useful for the primer 128 include titanium, silicon, silicon dioxide, silicon nitride, silicon oxynitride, nickel-chrome alloys (such as Inconel), zirconium, aluminum, alloys of silicon and aluminum, alloys containing cobalt and chromium (e.g., Satellite®), and mixtures thereof. For example, the primer 148 can be titanium.

The protective layer 16 can include a first protective film 60 and a second protective film 62; or a first protective film 60 (see FIGS. 5*a* and 6*a-d*), a second protective film 62 and a third protective film 64 (see FIGS. 5*b* and 6*e-h*).

In a method for making a coated article, an underlayer 12 is applied over a substrate 10, and a transparent conductive oxide layer 14 is applied over the underlayer 12. The undercoating 12 can be applied over the substrate 10, and the transparent conductive oxide layer 14 can be applied over at least a portion of the underlayer 12; or a substrate 10 having the undercoating 12 and the transparent conductive oxide layer 14 on it can be provided. A protective layer 16 is applied over at least a portion of the transparent conductive oxide. The protective layer 16 is applied by first applying a first protective film 60 over the transparent conductive oxide, and then applying a second protective film 62 over the first protective film 60. Optionally, a third protective film 64 can be applied over the first protective film 60, and the second protective film 62 can be applied over the third protective film 64.

In a method for making a coated article, a functional coating 112 is applied over a substrate 10. A functional coating 112 can be applied over the substrate 10, or a substrate having a functional coating 112 can be provided. A protective layer 16 is applied over the functional coating 112. The protective layer 16 is applied by first applying a first protective film 60 over the transparent conductive oxide, and then applying a second protective film 62 over the first protective film 60. Optionally, a third protective film 64 can be applied over the first protective film 60, and the second protective film 62 can be applied over the third protective film 64.

Another exemplary method of the invention is a method of increasing the sheet resistance of a coated article. A coated article is provided. The coated article has a substrate and transparent conductive oxide layer over at least part of the substrate. The coated article is processed with a post-deposition process.

The post-deposition process can be tempering the coated article, flash annealing only a surface of the transparent conductive oxide layer, or passing an Eddy current through the transparent conductive oxide layer.

Tempering the coated article is done by heating the entire article so that the surface of the transparent conductive oxide layer reaches above 380° F., at least 435° F., or at least 635° F. for at least 5, 10, 15, 20, 25 or 30 seconds, and at most 120, 90, 60, 55, 50, 45, 40, 35 or 30 seconds. The transparent conductive oxide layer should not be heated to more than 635° F. or 806° F. After the coated articled is heated, it is cooled rapidly to a normal temperature at a particular rate.

The coated article can be flash annealed to increase the sheet resistance. This is done by using a flash lamp to heat a surface of the coated article. The surface that is heated is the surface on which the transparent conductive oxide layer resides. The surface is heated to a temperature of above 380° F., at least 435° F. or at least 635° F. for at least 5, 10, 15, 20, 25 or 30 seconds, and at most 120, 90, 60, 50, 55, 45, 40, 35 or 30 seconds. The surface should be heated to no more than 968° F., no more than 878° F., no more than 806° F. or no more than 635° F. After the surface is heated, it is cooled to a normal temperature.

Passing an Eddy current through the transparent conductive oxide ("TCO") can be done by exposing the transparent conductive oxide layer to a changing magnetic field. For example a magnetic field can be applied over a substrate that is coated with a TCO. The TCO faces the magnetic field. The Eddy current is passed through the transparent conductive oxide layer.

Another exemplary method is a method to lower sheet resistance of a coated article. A substrate is provided. The substrate in this method may be glass, plastic or metal. Optionally, the substrate is coated with an underlayer. The underlayer can comprise one film, two films, or more. The substrate is coated with a transparent conductive oxide by applying a transparent conductive oxide over at least a portion of the substrate or underlayer. Optionally, an embedded film is applied within the transparent conductive oxide layer. This optional step is done by applying a first portion of the transparent conductive oxide layer, applying the embedded layer over at least a portion of the first portion of the transparent conductive oxide layer, and applied a second portion of the transparent conductive oxide layer over at least a portion of the embedded layer. The coated article is processed with one of the post-deposition processes described above.

Optionally, the method may further include applying a protective layer, as described herein, over at least a portion of the transparent conductive oxide layer. The protective layer can have two protective films, or three protective films.

By treating an article with a post-deposition process, the sheet resistance of the article decrease to less than 25 ohms per square, less than 20 ohms per square; less than 18 ohms per square, less than 16 ohms per square, or less than 15 ohms per square. This is particularly useful to reduce the thickness of a TCO. For example, AZO can have a thickness of less than 400 nm, or 320 nm, and greater than 160 nm. AZO should have a thickness of less than 344 nm and greater than 172 nm. ITO should have a thickness of less than 275 nm or 175 nm; and greater than 95 nm.

One exemplary embodiment is a method of making a coated glass article wherein a glass substrate is provided. An undercoating is applied over the glass substrate, preferably by a magnetron sputtered vacuum deposition or process, some other process that does not use radiant heat or the undercoating is applied over the substrate at room temperature. Preferably the undercoating comprises two films wherein the first film comprises a zinc oxide and a tin oxide and the second film comprises silica and titania. A transparent conductive oxide is applied over the undercoating, preferably by a magnetron sputtered vacuum deposition process, some other process that does not use radiant heat or the transparent conductive oxide is applied over the undercoating at room temperature. Preferably the transparent conductive oxide is tin-doped indium oxide. An optional protective layer is applied over the transparent conductive oxide, preferably by a magnetron sputtered vacuum deposition or process, some other process that does not use radiant heat or the optional protective layer is applied over the transparent conductive oxide at room temperature. The absorption of the transparent conductive oxide is not greater than 0.2, and/or is at least as high as 0.05.

In one exemplary embodiment, the article is a refrigerator door. Refrigerator doors would be treated with a post-deposition process sometime prior to assembly, but well after the metal for the exterior of the door is coated. Typically, refrigerator doors are heated to allow one to bend the coated article into a shape that will appropriately fit the door. This heating process would crystallize the transparent conductive oxide, and reduce the sheet resistance.

EXAMPLES

It will be readily appreciated by one of ordinary skill in the art that modifications may be made to the invention without departing from the concepts disclosed in the foregoing description. Accordingly, the particular embodiments described in detail herein are illustrative only and are not limited to the scope of the invention, which is to be given the full breadth of the appended claims and any and all equivalents thereof.

Example 1 (010761)

A glass substrate was coated with an underlayer, and a transparent conductive oxide layer. The underlayer had a first underlayer film and a second underlayer film. The first underlayer film was zinc stannate over the glass substrate, and the second underlayer film was a silica-alumina alloy having about 85 weight percent silica and 15 weight percent alumina over the first underlayer film. The transparent conductive oxide layer over the second underlayer film was tin-doped indium oxide ("ITO").

Figure 7:
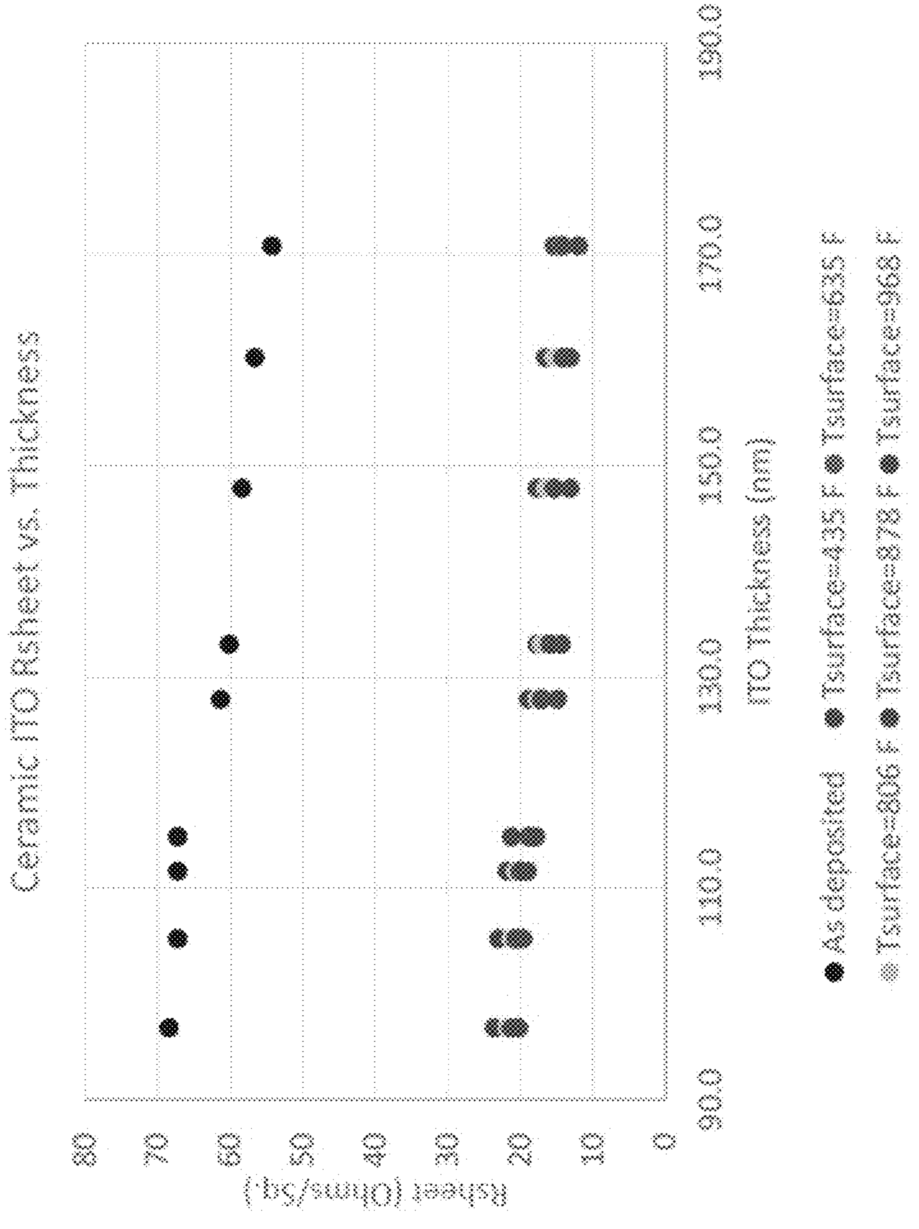

In order to improve the conductivity of the coated article, the entire article was placed into a furnace and the temperature of the transparent conductive oxide layer was measured (see FIG. 7).

The following samples were tested to establish the improved conductivity for each thickness of ITO.

| Sample | ITO Thickness (nm) | ITO Surface Temp. (° F.) | Sheet Resistance (Ω/□) |
|---|---|---|---|
| 1 | 96.8 | Not flash annealed | 68.4 |
| 2 | 96.8 | 435 | 23.6 |
| 3 | 96.8 | 635 | 24.8 |
| 4 | 96.8 | 806 | 21.8 |
| 5 | 96.8 | 878 | 21.2 |
| 6 | 96.8 | 968 | 20.2 |
| 8 | 105.2 | Not flash annealed | 67.2 |
| 8 | 105.2 | 435 | 23.0 |
| 9 | 105.2 | 635 | 23.6 |
| 10 | 105.2 | 806 | 21.2 |
| 11 | 105.2 | 878 | 20.6 |
| 12 | 105.2 | 968 | 19.6 |
| 13 | 111.6 | Not flash annealed | 67.2 |
| 14 | 111.6 | 435 | 21.8 |
| 15 | 111.6 | 635 | 23.6 |
| 16 | 111.6 | 806 | 20.6 |
| 17 | 111.6 | 878 | 20.0 |
| 18 | 111.6 | 968 | 19.0 |
| 19 | 114.9 | Not flash annealed | 67.2 |
| 20 | 114.9 | 435 | 21.2 |
| 21 | 114.9 | 635 | 22.4 |
| 22 | 114.9 | 806 | 18.9 |
| 23 | 114.9 | 878 | 18.9 |
| 24 | 114.9 | 968 | 17.9 |
| 25 | 127.9 | Not flash annealed | 61.3 |
| 26 | 127.9 | 435 | 18.9 |
| 27 | 127.9 | 635 | 20.0 |
| 28 | 127.9 | 806 | 17.7 |
| 29 | 127.9 | 878 | 17.1 |
| 30 | 127.9 | 968 | 14.9 |
| 31 | 133.1 | Not flash annealed | 60.2 |
| 32 | 133.1 | 435 | 17.7 |
| 33 | 133.1 | 635 | 19.5 |
| 34 | 133.1 | 806 | 17.1 |
| 35 | 133.1 | 878 | 15.9 |
| 36 | 133.1 | 968 | 14.3 |
| 37 | 147.9 | Not flash annealed | 58.4 |
| 38 | 147.9 | 435 | 17.7 |
| 39 | 147.9 | 635 | 18.9 |
| 40 | 147.9 | 806 | 16.5 |
| 41 | 147.9 | 878 | 15.3 |
| 42 | 147.9 | 968 | 13.1 |
| 43 | 160.3 | Not flash annealed | 56.6 |
| 44 | 160.3 | 435 | 16.5 |
| 45 | 160.3 | 635 | 18.3 |
| 46 | 160.3 | 806 | 15.3 |
| 47 | 160.3 | 878 | 14.1 |
| 48 | 160.3 | 968 | 13.1 |
| 49 | 170.8 | Not flash annealed | 54.3 |
| 50 | 170.8 | 435 | 15.3 |
| 51 | 170.8 | 635 | 16.5 |
| 52 | 170.8 | 806 | 14.1 |
| 53 | 170.8 | 878 | 14.1 |
| 54 | 170.8 | 968 | 12.0 |

As can be seen in FIG. 7, post-depositing heating of the ITO, regardless of the thickness, decreased the sheet resistance from about 55-70Ω/□ to about 10-25Ω/□. When the ITO thickness was at least than 96.8 nm thick, the sheet resistance was less than 25Ω/□ regardless of the heating temperature. When the ITO thickness was at least 109.2, the sheet resistance was less than 20Ω/□ if the ITO surface reached 968° F. At approximately 127.9 nm, the ITO had a sheet resistance of less than 20Ω/□ when heated to any temperature. The improvements in sheet resistance was unexpected. Similar results were obtained with other transparent conductive oxides, suggesting that the temperature, regardless of transparent conductive oxide, should be above 380° F., at least 435° F., or not above 806° F.

Figure 8A:
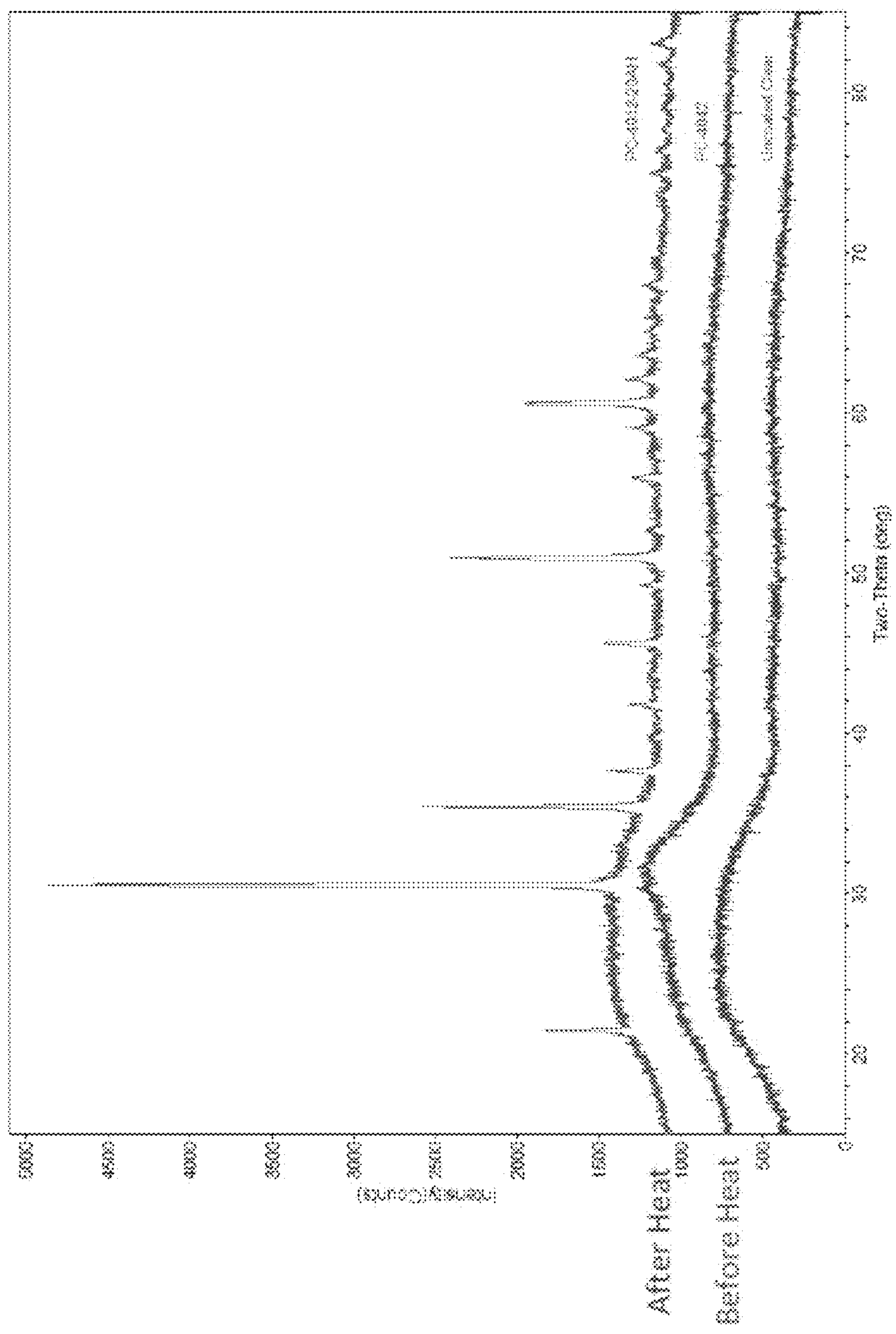
Figure 8B:
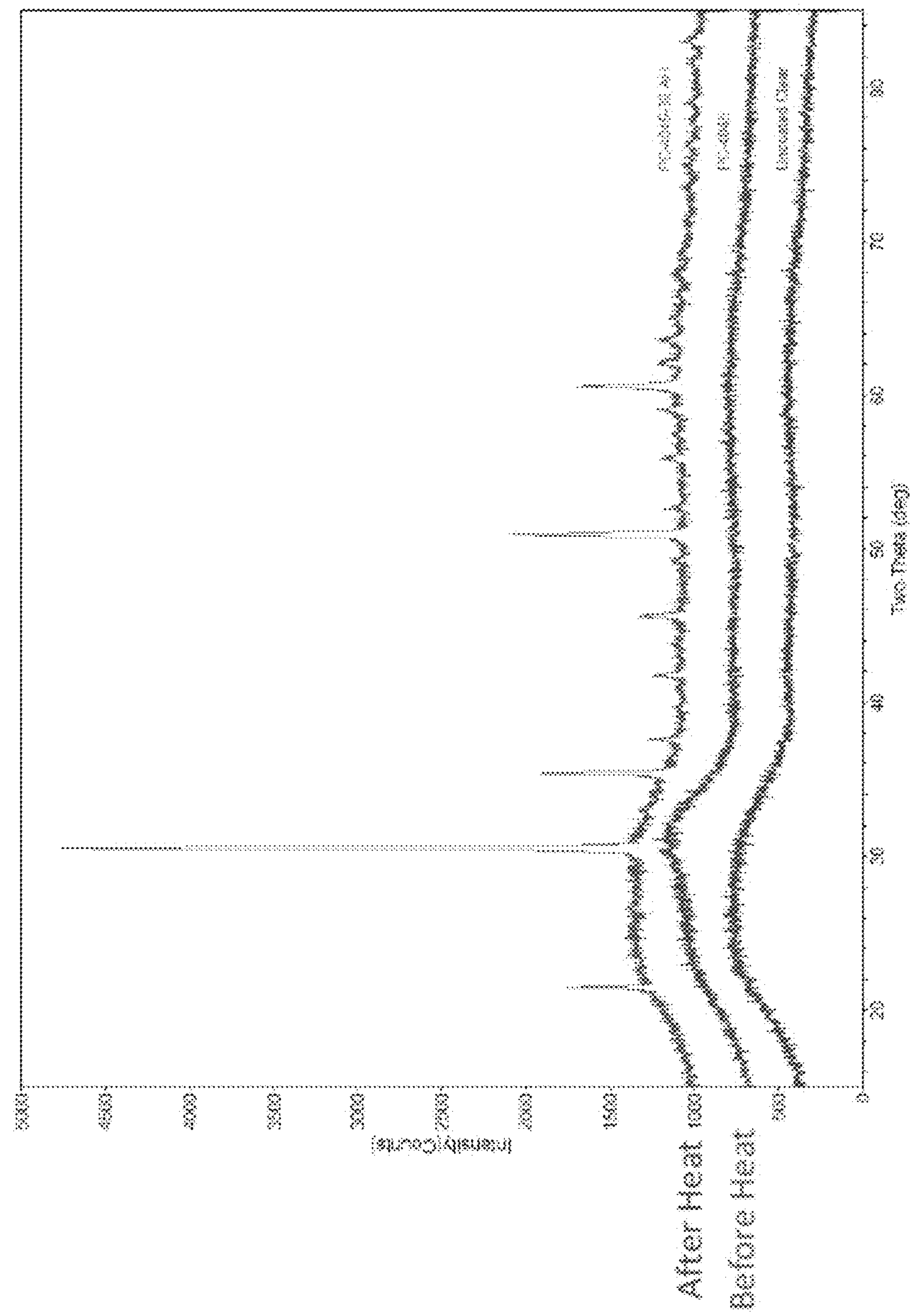
Figure 8C:
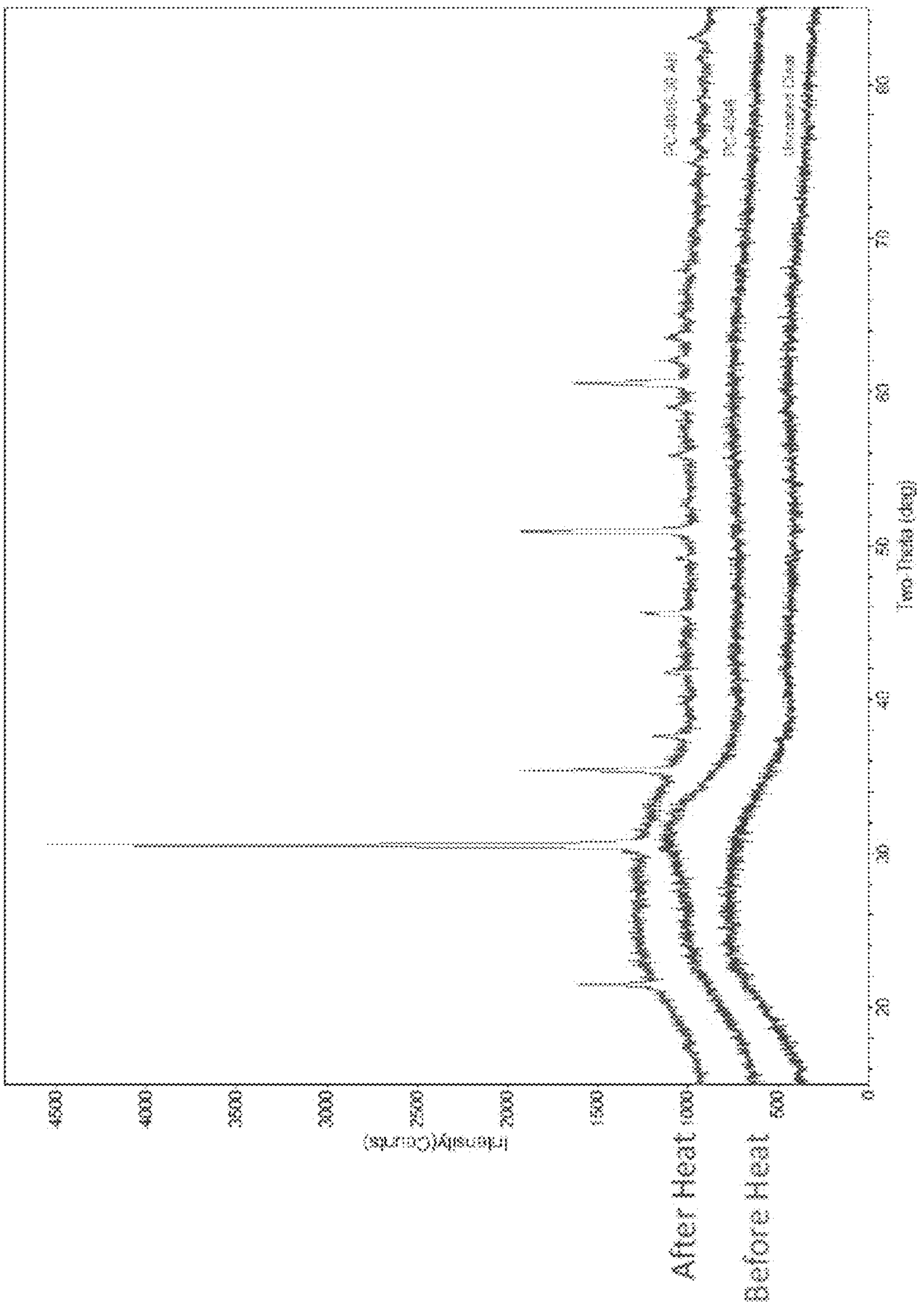

As shown in FIG. 8*a*-*c*, post deposition heating increased the crystallinity of the ITO layer. The samples that were tested are listed in Table 2, below.

TABLE 2

| Samples for Example 1 | | |
|---|---|---|
| Sample | Sample ID | Description |
| A | Uncoated Clear | Uncoated clear glass |
| B | PC-4042 | Clear glass coated with ITO at 168.7 nm |
| C | PC-4042-40 AH | PC-4042 after heating |
| D | PC-4045 | Clear glass coated with ITO at 141.7 nm |
| E | PC-4045-30 AH | PC-4045 after heating |
| F | PC-4046 | Clear glass coated with ITO at 129.4 nm |
| G | PC-4046-30 AH | PC-4046 after heating |

By focusing on the minimal surface temperature needed to increase the crystal formation of the ITO, a tremendous benefit by conserving energy is obtained.

Example 2

Figure 9:
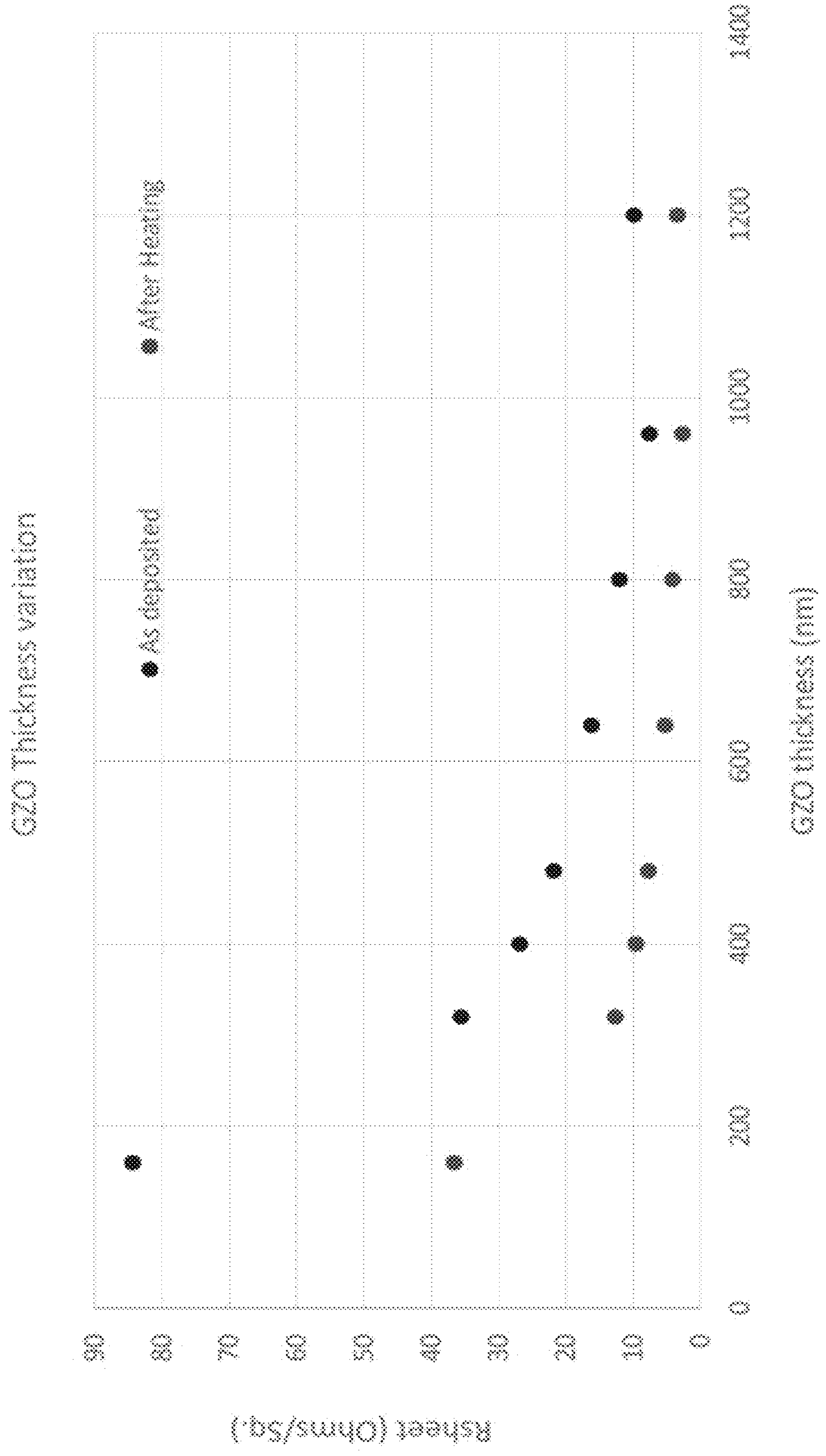
FIG. 9 shows the sheet resistance of a gallium-doped zinc oxide transparent conductive oxide layer as deposited and have being heated.

A glass substrate was coated with a transparent conductive oxide layer. The transparent conductive oxide was gallium-doped zinc oxide ("GZO"). Several samples with different GZO thicknesses were prepared and the sheet resistance measured for samples to compare the effects of post-deposition processing to the sheet resistance of GZO as deposited. The post-deposition process was placing the coated article in a furnace. The sheet resistance of each sample was tested before and after flash annealing, and the results are shown in FIG. 9. The thickness and sheet resistance for the samples test are listed in Table 3, below.

TABLE 3

| Samples from Example 2 | | | |
|---|---|---|---|
| Sample | GZO Thickness (nm) | Sheet Resistance (as deposited) | Sheet Resistance (flash annealed) |
| 1 | 160 | 84.4 | 36.6 |
| 2 | 320 | 35.6 | 12.7 |
| 3 | 400 | 26.9 | 9.6 |
| 4 | 480 | 21.8 | 7.8 |
| 5 | 640 | 16.2 | 5.3 |
| 6 | 800 | 12.0 | 4.2 |
| 7 | 960 | 7.6 | 2.7 |
| 8 | 1200 | 9.9 | 3.5 |

As shown in FIG. 9, post-deposition flash annealing of the GZO improved the sheet resistance for all of the thicknesses tested. The improvement was most significant when the GZO was approximately 320-480 nm thick. When the GZO layer was approximately 320 nm thick, the "as-deposited" GZO layer provided a sheet resistance of 35.6Ω/□ whereas after heat-treatment, the sheet resistance was 12.7Ω/□. This is significant because at this thickness, the flash annealing reduced the sheet resistance into an acceptable range whereas without the flash annealing, the sheet resistance was unacceptably high.

A similar result was observed when the GZO was 480 nm thick. The sheet resistance of the "as-deposited" GZO sample was approximately 21.8Ω/□ whereas the heat treated sample was 7.8 Ω/□.

The difference in sheet resistance is reduced to when at very high thicknesses of GZO. For example, at approximately 950 nm, the "as-deposited" GZO sample had a sheet resistance of approximately 8Ω/□ whereas the flash annealed sample had a sheet resistance of approximately 5Ω/□. In this case, both samples had adequately low sheet resistance.

Thus, as shown in FIG. 9, for samples with GZO as the transparent conductive oxide, the thicknesses that provide the greatest and most significant difference in sheet resistance is when the GZO layer is at least 300 nm thick, and at most 500 nm thick.

Heat-treatment reduces the thickness of the transparent conductive oxide layer needed to reach an acceptable sheet resistance. Without any post-deposition treatment, the GZO would have to be applied to at least 550 nm before the sheet resistance would be less than 20Ω/□. Heating allows one to apply thinner GZO layers. Not only does this reduce the cost of making an appropriate coated article, but it also reduces the effect that the GZO has on the optics and color of the coated article.

This was surprising to find, and provided a cost effective approach for improving sheet resistance of thinner transparent conductive oxide layers.

Example 3

Figure 10:
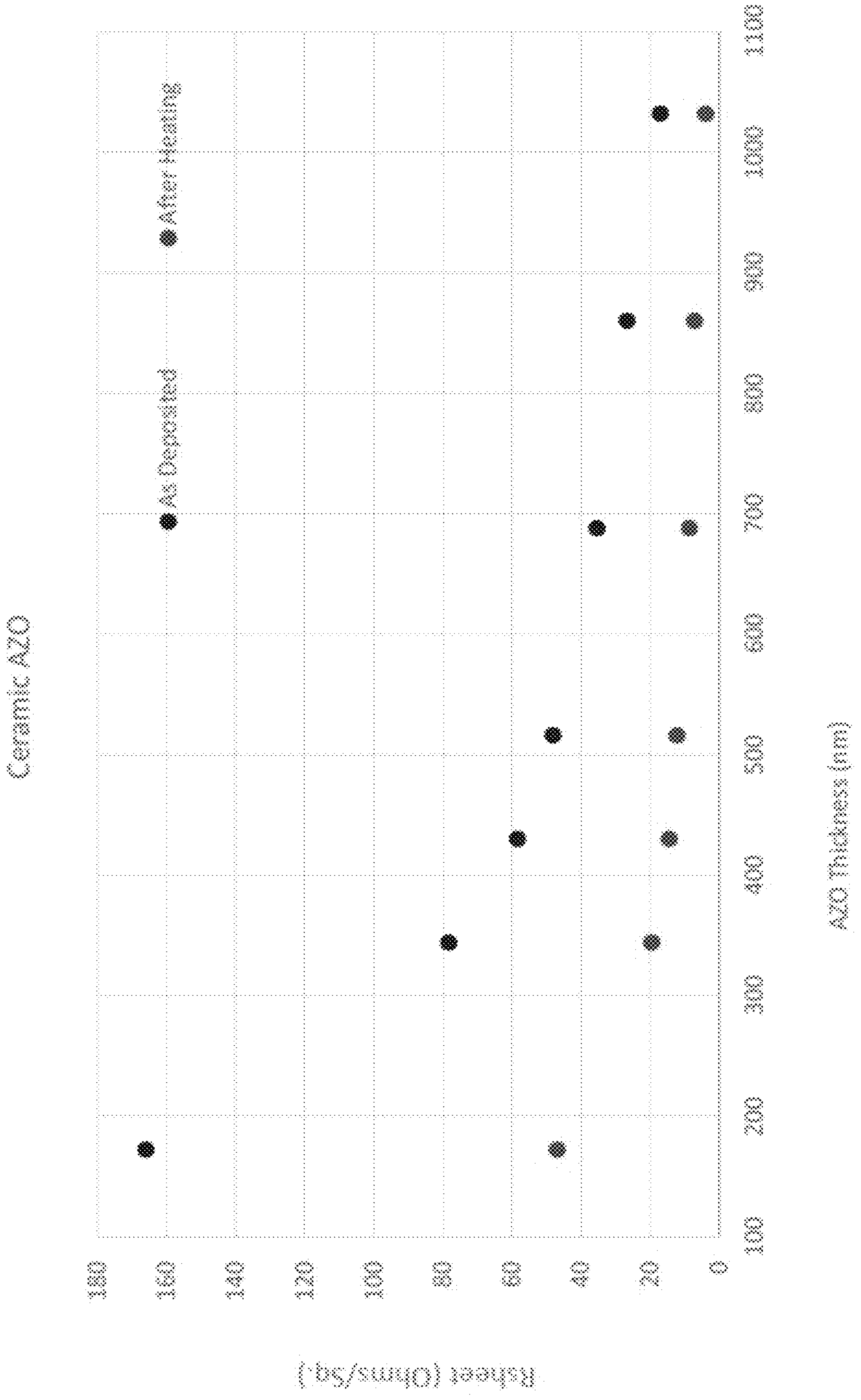
FIG. 10 shows the sheet resistance of aluminum-doped zinc oxide transparent conductive oxide layer as deposited and have being heated.

A glass substrate was coating an aluminum-doped zinc oxide ("AZO") transparent conductive oxide layer. Several samples with different AZO thicknesses were prepared and the sheet resistance measured for samples to compare the effects of post-deposition processing to the sheet resistance of AZO as deposited. The post-deposition process involved placing the coated article in a furnace. The sheet resistance of each sample was tested before and after flash annealing, and the results are shown in FIG. 10. The thickness and sheet resistance for the samples test are listed in Table 4, below.

TABLE 4

| Samples from Example 3 | | | |
|---|---|---|---|
| Sample | AZO Thickness (nm) | Sheet Resistance (as deposited) | Sheet Resistance (flash annealed) |
| 1 | 172 | 166.0 | 46.9 |
| 2 | 344 | 78.3 | 19.5 |
| 3 | 430 | 58.4 | 14.5 |
| 4 | 516 | 48.1 | 12.2 |
| 5 | 688 | 35.3 | 8.6 |
| 6 | 860 | 26.6 | 7.1 |
| 7 | 1032 | 17.0 | 3.9 |

As shown in FIG. 10, post-deposition heating of the AZO improved the sheet resistance for all of the thicknesses tested. The improvement was most significant when the AZO was approximately 344 to 860 nm thick. When the AZO layer was 344 nm thick, the "as-deposited" AZO layer provided a sheet resistance of approximately 78.3Ω/□ whereas after heat-treatment, the sheet resistance was 19.5Ω/□. This is significant because at this thickness, heating reduced the sheet resistance into an acceptable range whereas without heating, the sheet resistance was unacceptably high.

A similar result was observed when the AZO was 860 nm thick. The sheet resistance of the "as-deposited" AZO sample was approximately 26.6Ω/□ whereas the heat-treated sample was approximately 7.1 Ω/□.

The difference in sheet resistance is reduced to when at very high thicknesses of AZO. For example, at approximately 1050 nm, the "as-deposited" AZO sample had a sheet resistance of approximately 17.0Ω/□ whereas the heat-treated sample had a sheet resistance of 3.9Ω/□. In this case, both samples had adequately low sheet resistance.

Thus, as shown in FIG. 10, for samples with AZO as the transparent conductive oxide, the thicknesses that provide the greatest and most significant difference in sheet resistance is when the AZO layer is at least 344 nm thick, and at most 860 nm thick.

Heating also reduces the thickness of the transparent conductive oxide layer needed to reach an acceptable sheet resistance. Without any post-deposition treatment, the AZO would have to be applied to at least 1032 nm before the sheet resistance would be less than 20Ω/□. Heating allows one to apply thinner AZO layers. Not only does this reduce the cost of making an appropriate coated article, but it also reduces the effect that the AZO has on the optics and color of the coated article.

This was surprising to find, and provided a cost effective approach for improving sheet resistance of thinner transparent conductive oxide layers.

Example 4

Using FILM STAR, various underlayer thicknesses were tested to determine which thicknesses provided an acceptable or neutral color. A glass substrate was used having an underlayer, and a transparent conductive oxide. The underlayer had a first film and a second film. The first underlayer film was zinc stannate over the glass substrate, and the second underlayer film was a silica-alumina alloy having about 85 weight percent silica and 15 weight percent alumina over the first underlayer film. The transparent conductive oxide layer over the second underlayer film was a 170 nm thick tin-doped indium oxide ("ITO") layer.

First, a desired sheet resistance was determined. For this example, the desired sheet resistance was approximately between 10Ω/□ and 15Ω/□. To achieve this sheet resistance, it was determined that the transparent conductive oxide layer should be approximately 170 nm thick.

Using FILM STAR, the material and thickness of the glass and the transparent conductive oxide layer was entered. Next, the material for the first underlayer film and the second underlayer film were determined. For this example, the first underlayer film material was zinc stannate and the second underlayer film material was a silica-alumina alloy having 85 weight percent silica and 15 weight percent alumina. The following coatings were analyzed by FILM STAR (see Table 5 and FIG. 11). The thicknesses of the first underlayer first ranged from 8 nm to 17 nm in the samples, and the thicknesses of the second underlayer film ranged from 27 nm and 35 nm.

TABLE 5

Samples from Example 4

| Sample | $ZnSnO_x$ thickness (nm) | $SiAlO_x$ thickness (nm) | ITO thickness (nm) | Color (a*, b*) |
|---|---|---|---|---|
| 1 | 13 | 27 | 170 | (−3.5, 1.6) |
| 2 | 13 | 28 | 170 | (−2.9, 1.1) |
| 3 | 13 | 29 | 170 | (−2.3, 0.5) |
| 4 | 13 | 30 | 170 | (−1.8, −0.1) |
| 5 | 13 | 31 | 170 | (−1.2, −0.8) |
| 6 | 13 | 32 | 170 | (−0.7, −1.5) |
| 7 | 13 | 33 | 170 | (−0.1, −2.2) |
| 8 | 13 | 34 | 170 | (0.5, −2.9) |
| 9 | 13 | 35 | 170 | (1, −3.6) |
| 10 | 8 | 31 | 170 | (−5.3, −4) |
| 11 | 9 | 31 | 170 | (−4.6, −3.2) |
| 12 | 10 | 31 | 170 | (−3.8, −2.5) |
| 13 | 11 | 31 | 170 | (−3, −1.8) |
| 14 | 12 | 31 | 170 | (−2.1, −1.3) |
| 15 | 13 | 31 | 170 | (−1.2, −0.8) |

TABLE 5-continued

Samples from Example 4

| Sample | $ZnSnO_x$ thickness (nm) | $SiAlO_x$ thickness (nm) | ITO thickness (nm) | Color (a*, b*) |
|---|---|---|---|---|
| 16 | 14 | 31 | 170 | (−0.3, −0.4) |
| 17 | 15 | 31 | 170 | (0.8, −0.2) |
| 18 | 16 | 31 | 170 | (1.8, 0) |
| 19 | 17 | 31 | 170 | (2.9, 0) |

Figure 11:
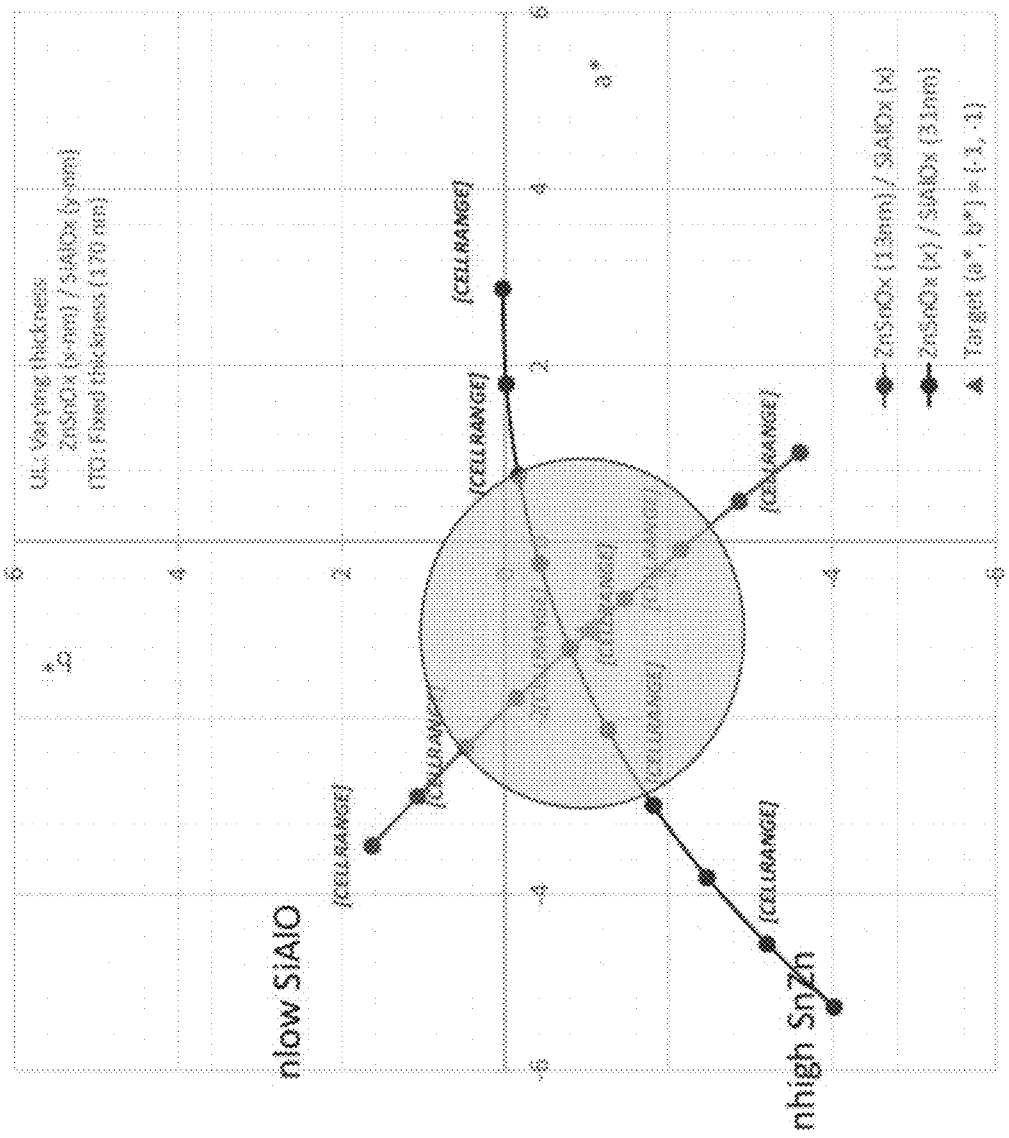
FIG. 11 is a graph showing the effect of the underlayer on the color of a substrate having a 170 nm thick tin-doped indium oxide transparent conductive oxide layer.

As shown in FIG. 11, a neutral color of a*, b* of −1, −1 was obtained when the first underlayer film was 13 nm thick and the second underlayer film was 31 nm thick. Acceptable colors wherein the a* was between −3 and 1, and the b* was between −3 and 1 was obtained when the first underlayer film was between 11 nm and 15 nm thick, and the second underlayer film was between 29 nm and 33.5 nm thick.

Example 5

Figure 12:
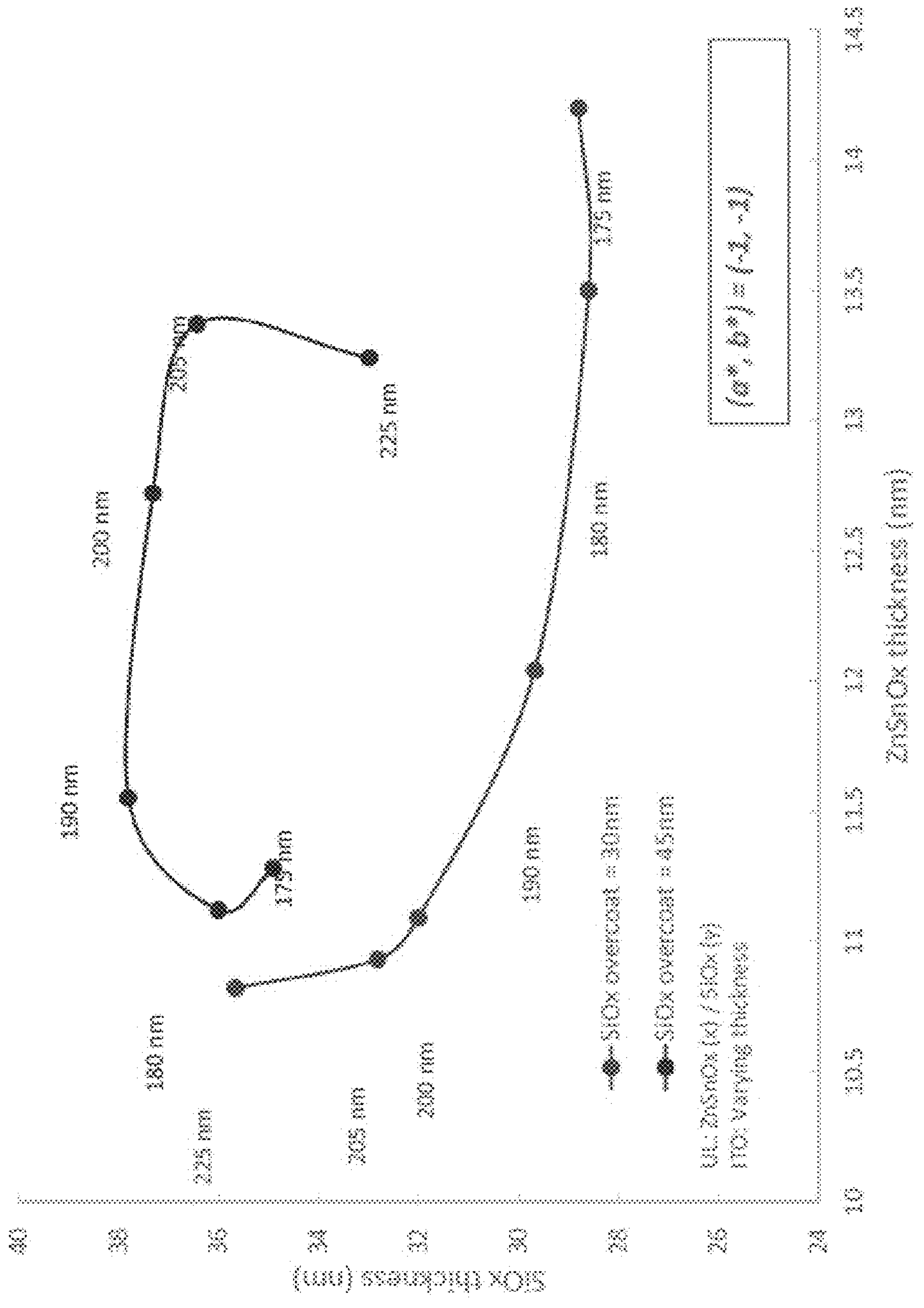
FIG. 12 is a graph showing the effect of the underlayer on the color of a substrate having a 175-225 nm thick tin-doped indium oxide transparent conductive oxide layer, and a silica protective layer.

Using FILM STAR, varying thicknesses of the transparent conductive oxide layer was tested to determine the appropriate thicknesses for the underlayer. In this example, the FILM STAR parameters included a glass substrate coated with an underlayer having a first underlayer film and a second underlayer film. The first underlayer film was zinc stannate and the second underlayer film was silica. The transparent conductive oxide layer over the second underlayer film was tin-doped indium oxide ("ITO"). A silica protective layer was over the ITO layer. Table 6 and FIG. 12 show the samples that were tested. Table 6 shows the values that were inputted into FILM STAR for the ITO layer and the $SiO_2$ layer. The output provided thicknesses for the two underlayer films that would provide a −1, −1 (a*, b*) color.

TABLE 6

Samples for Example 5

| Sample | ITO | $SiO_2$ |
|---|---|---|
| 1 | 225 nm | 30 nm |
| 2 | 205 nm | 30 nm |
| 3 | 200 nm | 30 nm |
| 4 | 190 nm | 30 nm |
| 5 | 180 nm | 30 nm |
| 6 | 175 nm | 30 nm |
| 7 | 175 nm | 45 nm |
| 8 | 180 nm | 45 nm |
| 9 | 190 nm | 45 nm |
| 10 | 200 nm | 45 nm |
| 11 | 205 nm | 45 nm |
| 12 | 225 nm | 45 nm |

These samples show that when the first underlayer film should be at least 10 nm thick and at most 15 nm thick and the second underlayer film should be at least 28 nm thick and at most 36 nm thick to achieve a color of about −1, −1 (a*, b*) when the transparent conductive oxide layer is between 175 nm and 225 nm thick and the protective coating is 30 nm thick. The samples also show that the first underlayer film should be at least 11 nm thick and at most 14 nm thick, and the second underlayer film should be at least 32 nm thick and at most 38 nm thick to achieve an appropriate color when the transparent conductive oxide layer is between 175 nm and 225 nm thick, and the protective layer is 45 nm thick.

FIG. 12 shows the ideal thicknesses that will result in a −1, −1 color. While a −1, −1 is preferred other colors are acceptable, such as colors encircled in FIG. 11 (i.e. a* between −3 and 1, and b* between −3 and 1).

Example 6

The effect of an embedded film was tested at various depths and thicknesses and compared to a transparent conductive oxide layer without an embedded layer. A glass substrate was coated with a bottom transparent conductive oxide film. The bottom transparent conductive oxide film was made from tin-doped indium oxide ("ITO"), and was 120 nm, 180 nm or 240 nm thick. An embedded film was applied over the bottom transparent conductive oxide layer. The embedded film was either 15 nm or 30 nm thick, and was a zinc stannate film. A top transparent conductive oxide film was applied over the embedded film. The top transparent conductive oxide film was ITO, and was 240 nm, 180 nm or 120 nm thick. The combined thickness of the bottom and top transparent conductive oxide films was 360 nm. For a control, ITO oxide was applied over the substrate at a thickness of 360 nm, and it did not contain an embedded film. The sheet resistance and transmission at 550 nm was measured for the samples. The samples are listed in Table 7, below, and in FIG. 13.

TABLE 7

| Samples from Example 6 | | | |
|---|---|---|---|
| Sample | Bottom ITO | $Zn_2SnO_4$ | Top ITO |
| A | 120 nm | 15 nm | 240 nm |
| B | 120 nm | 30 nm | 240 nm |
| C | 180 nm | 15 nm | 180 nm |
| D | 180 nm | 30 nm | 180 nm |
| E | 240 nm | 15 nm | 240 nm |
| F | 240 nm | 30 nm | 240 nm |
| G | 360 nm | N/A | N/A |

As shown in FIG. 13*a*, experimental samples A-F had at least a 35% improvement in sheet resistance as compared to the control, sample G. Samples A and B had at least a 40% improvement in sheet resistance as compared to sample G. Samples C and D had at least a 35% improvement in sheet resistance as compared to sample G. Samples E and F had at least a 37% improvement in sheet resistance as compared to sample G.

Based on this data, the embedded film, regardless of its position or thickness, surprisingly and significantly decrease the sheet resistance of the transparent conductive oxide layer.

As shown in FIG. 13*b*, samples E and F provided the greatest increase in transmission. A smaller improvement was seen in samples A and B. Thus, by having a difference in thickness between the top and bottom transparent conductive oxide layer, one can increase the amount of light transmission. Furthermore, it was surprising to find that if the top transparent conductive oxide layer is thinner than the bottom one, thereby the embedded layer is positioned closer to the surface of the top of the transparent conductive oxide layer rather than the bottom of the transparent conductive oxide layer, there is a much larger increase in transmission. By contrast, if the top and bottom transparent conductive oxide layer are approximately equal, there is an unexpected decrease in light transmission.

FIG. 13*c* shows that the embedded film also impacts the crystallinity of the transparent conductive oxide. By having an embedded film, one can see from this XRD data that crystallinity is unexpectedly improved.

Example 7

In this example, various protective layers were examined. The protective layers were placed over a glass substrate. The coated article did included aluminum-doped zinc oxide transparent conductive oxide between the substrate and the protective layer. One would not expect that the underlayer, functional layer or transparent conductive oxide layer would not impact the results observed.

The glass substrate was different protective layers. Samples 1-3 had a protective layer that comprised a single film. A list of these samples is provided in Table 8.

TABLE 8

| Protective-Layer Stack | |
|---|---|
| Sample | Protective Layer |
| 1 | None |
| 2 | SiAlO |
| 3 | TiAlO |
| 4 | $ZrO_2$ |

Samples 5-11 had a protective layer comprising a first protective film and a second protective film over the first protective film. A list of these samples is provided in Table 9. The first film is closer to the substrate than the second film, and the second film is the outer most film.

TABLE 9

| Samples Protective Layer with Two Films | | |
|---|---|---|
| Sample | $1^{st}$ film | $2^{nd}$ film |
| 5 | TiAlO | SiAlO |
| 6 | SiAlO | TiAlO |
| 7 | SnZnO | TiAlO |
| 8 | SnZnO | SiAlO |
| 9 | TiAlO | $ZrO_2$ |
| 10 | SiAlO | $ZrO_2$ |
| 11 | SnZnO | $ZrO_2$ |

Samples 12-15 had a protective layer comprising three films. A list of these samples is provided in Table 10. The first film is closer to the substrate than the second or third film. For the sake of consistency with the other figures and description above, the second protective film is the outer most film, and the third protective film was positioned between the first film and the third film.

TABLE 10

| Sample Protective Layers with Three Films | | | |
|---|---|---|---|
| Sample | $1^{st}$ film | $3^{rd}$ film | $2^{nd}$ film |
| 12 | SnZnO | TiAlO | SiAlO |
| 13 | SnZnO | SiAlO | TiAlO |
| 14 | SnZnO | TiAlO | $ZrO_2$ |
| 15 | SnZnO | SiAlO | $ZrO_2$ |
| 16 | TiAlO | SiAlO | $ZrO_2$ |
| 17 | SiAlO | TiAlO | $ZrO_2$ |
| 18 | $ZrO_2$ | TiAlO | SiAlO |
| 19 | $ZrO_2$ | SiAlO | TiAlO |
| 20 | SiAlO | $ZrO_2$ | TiAlO |
| 21 | TiAlO | $ZrO_2$ | SiAlO |

The durability of these samples was tested using ASTM Cleveland Condensation test. As shown in FIGS. 14 and 15, the protective film that had TiAlO as the outer most layer performed the best. These figures show the dEcmc for samples 1-15 listed in Tables 8-10.

Specifically, FIG. 14 shows that samples that had two or three protective films wherein the outer most film was TiAlO had unexpectedly better durability. Specifically, samples 6 (SiAlO/TiAlO), sample 7 (SnZn/TiAlO), and sample 13 (SnZn/SiAlO/TiAlO). FIG. 15 further demonstrates that protective layers having titania and alumina as the outer most layer provided unexpected greater durability. FIG. 15, sample 19 ($ZrO_2$/SiAlO/TiAlO) and sample 20 (SiAlO/$ZrO_2$/TiAlO) shows unexpectedly better durability as compared to the other three-film protective layer samples (samples 16, 17, 18, and 21).

This data shows an unexpected result that a titania-alumina outer-most protective film provides greatly improved durability.

Example 8

Samples with transparent conductive oxides sputtered in various atmospheres were tested. As shown in FIGS. 16-20, glass substrates were coated with either indium-doped tin oxide ("ITO") or aluminum-doped zinc oxide ("AZO") via magnetron sputter vacuum deposition ("MSVD") method. The ITO samples were sputtered in an atmosphere that contained 0%, 0.5%, 1%, 1.5% or 2% oxygen and thereafter heat-treated, and the AZO samples were sputtered in an atmosphere that contained 0%, 1%, 2%, 3%, 4%, 5% or 6% oxygen and thereafter heat treated. The remainder of the atmosphere was argon. The ITO samples had an ITO thickness of either 225 nm, 175 nm or 150 nm, and the AZO samples had a thickness of 300 nm to 350 nm of AZO applied onto the substrate. The samples were tested to determine their emissivity, absorbance and/or sheet resistance. (Emissivity is a measure of conductivity.) These samples were heat treated by placing the coated article into a furnace for a period of time so that the transparent conductive oxide surface of the sample to reached at least 435° F. for about 30 seconds.

When coating a transparent article with a transparent conductive oxide, one wants a low absorbance and low sheet resistance (which corresponds to emissivity) article. FIG. 16 shows that as oxygen is added to the atmosphere, the absorption decreases. However, as shown by FIG. 17, the emissivity/sheet resistance of the article is highest when there is 0% oxygen in the atmosphere. Using FIGS. 16 and 17, the ideal balance between absorption and emissivity is obtained when the sputtering atmosphere has between 0.75% and 1.25% oxygen in the atmosphere. As FIG. 17 shows, the sheet resistance of a heat-treated article coated with ITO is lower than non-heated articles coated with an ITO if the atmosphere has less than 2.0% oxygen. There is a significant increase in the sheet resistance when the atmosphere is 1.5% oxygen. Extrapolating from this data, it was concluded that the atmosphere in the coating chamber should be no more than 1.5% oxygen, preferably no more than 1.25%. In order to obtain some decrease absorption for ITO coated article, the atmosphere should contain at least 0.5% oxygen, preferably at least 0.75% oxygen.

Example 9

A glass substrate was coated with an aluminum-doped zinc oxide layer by a magnetron sputter vacuum deposition ("MSVD") process. The target was a ceramic aluminum-doped zinc oxide, which contains a certain amount of oxygen in it. When using a MSVD process to deposit a material such as a transparent conductive oxide, the process causes the ceramic raw materials to disassociate, possibly causing some of the oxygen to escape. In order to ensure that the material deposited is oxidized, often oxygen is supplied to the coating chamber together with an inert gas. In this example, the AZO was deposited by MSVD in a coating chamber that had the oxygen content supplied to the chamber that was either 0%, 1%, 2%, 3%, 4%, 5% or 6%. The remainder of the atmosphere supplied to the coating chamber was argon, however, any inert gas could be used. The normalized absorption of the coating was determined. As shown in FIG. 18, the normalized absorption at 550 nm was best when 0% oxygen was supplied to the coating chamber. It was acceptable when 1% oxygen was supplied to the coating chamber. Based on the data shown in FIG. 18, one would extrapolate that less than 0.5% oxygen in the coating chamber provides significantly better absorption than when 1% oxygen is used.

As shown in FIG. 19, the normalized absorption has a steep decline from 0% oxygen to 1% oxygen, and a minimal decline from 1% oxygen to 2% oxygen. This data further supports the conclusion that, by extrapolation, one would conclude that less than 1% oxygen, less than 0.5% oxygen, or less than 0.25% oxygen, or less than 0.1% oxygen, or 0% oxygen supplied to the coating chamber provides the best absorption.

Example 10

One problem with post-deposition heating of a coated article is the amount of energy wasted. As discussed above, post deposition heating of a transparent conductive oxide ("TCO") layer provides improved performance at smaller thicknesses. Placing a coated article into a furnace that heats the entire article wastes energy beyond the temperature necessary to crystalize the TCO layer. In order to determine the surface temperature needed to improve the performance of a transparent conductive oxide layer, a glass substrate was coated with indium-doped tin oxide at 115 nm or 171 nm thick. The samples had the surface of the ITO layer heated to temperatures listed in Tables 11 and 12. For the purpose of this experiment, the surfaces were heated by placing the entire coated article into a furnace, however, a flash lamp could be used as an alternative.

After the post-deposition heating of the surface, the sheet resistance of each sample was measured (see FIG. 21, and Tables 11 and 12). The results show that at approximately 435° F., the layer reaches its lowest sheet resistance. Additionally heating the surface does not provide any additional reduction in sheet resistance. Therefore, in order to reduce the sheet resistance of a transparent conductive oxide layer, the post deposition heating should heat the surface of the transparent conductive oxide layer to above 380 OF, at least 435° F., between 435° F. and 806° F., between 435° F. and 635° F., or to 435° F.

TABLE 11

115 nm Thick ITO Samples of Example 10

| Max. Surface Temperature (° F.) | Sheet Resistance (Ω/□) |
|---|---|
| 72 | |
| 200 | 69.7 |

TABLE 11-continued

| 115 nm Thick ITO Samples of Example 10 | |
|---|---|
| Max. Surface Temperature (° F.) | Sheet Resistance (Ω/□) |
| 300 | 67 |
| 317 | 68.9 |
| 350 | 65.3 |
| 380 | 62.6 |
| 435 | 21.2 |
| 635 | 22.4 |
| 806 | 18.9 |
| 878 | 18.9 |
| 968 | 17.9 |

TABLE 12

| 171 nm Thick ITO Samples of Example 10 | |
|---|---|
| Max. Surface Temperature (° F.) Room Temperature | Sheet Resistance (Ω/□) |
| 200 | 52.3 |
| 300 | 52.3 |
| 317 | 43.9 |
| 350 | 49 |
| 380 | 43.5 |
| 435 | 15.3 |
| 635 | 16.5 |
| 806 | 14.1 |
| 878 | 14.1 |
| 968 | 12 |

The invention is further described in the following numbered clauses.

Clause 1: A coated article comprising a substrate, an underlayer over said substrate, the underlayer comprising a first underlayer film wherein the first underlayer film comprises a high refractive index material, and a second underlayer film over the first layer wherein the second layer comprises a low refractive index material, and a transparent conductive oxide layer over the underlayer.

Clause 2: The coated article according to claim 1, wherein the high refractive index material comprises zinc oxide and tin oxide.

Clause 3: The coated article of clauses 1 or 2, wherein the low refractive index material comprises silica and alumina.

Clause 4: The coated article of any of the clauses 1 to 3, wherein the transparent conductive film comprises tin-doped indium oxide.

Clause 5: The coated of any of the clauses 1 to 4, wherein the transparent conductive oxide layer has a thickness of at least 75 nm, at particularly at least 90 nm, more particularly at least 100 nm, more particularly at least 125 nm, more particularly at least 150 nm, or more particularly at least 175 nm.

Clause 6: The coated article of any of the clauses 1 to 5, wherein the transparent conductive oxide layer has a thickness of at most 350 nm, particularly at most 300 nm, particularly at most 275 nm, particularly at most 250 nm, more particularly at most 225 nm.

Clause 7: The coated article of any of the clauses 1 to 6 wherein the coated article has a sheet resistance in the range of 5 to 25 ohms per square, particularly 5 to 20 ohms per square, more particularly 8 to 18 ohms per square, more particularly 5 to 15 ohms per square Clause 8: The coated article of any of the clauses 1 to 7, wherein the first underlayer film has a first underlayer thickness and the second underlayer film has a second underlayer thickness to provide the coated article with a color having an a* of at least −9 and at most 1, particularly at least −4 and at most 0, more particularly at least −3 and at most 1, more particularly at least −1.5 and at most −0.5, more particularly −1; and a b* of at least −9 and at most 1, particularly at least −4 and at most 0, more particularly at least −3 and at most 1, more particularly at least −1.5 and at most −0.5, more particularly −1.

Clause 9: The coated article of any of the clauses 1 to 8, wherein the high refractive index material comprises zinc oxide.

Clause 10: The coated article of any of the clauses 1 to 9 further comprising a protective layer over the transparent conductive oxide layer wherein the protective layer comprises a first protective film and a second protective film over at least a portion of the first protective film, wherein the second protective film is an outermost film and the second protective film comprises titania and alumina.

Clause 11: The coated article of clause 10 wherein the first protective film comprises titania, alumina, zinc oxide, tin oxide, zirconia, silica, or mixtures thereof. Optionally, the first protective film does not comprise a mixture of titania and alumina.

Clause 12: The coated article of the clauses 9 or 10 wherein the second protective film comprises 35 to 65 weight percent titania; particularly 45 to 55 weight percent titania; more particularly 50 weight percent titania.

Clause 13: The coated article of any of the clauses 10 to 12 wherein the second protective film comprises 65 to 35 weight percent alumina, particularly 55 to 45 weight percent alumina, more particularly 50 weight percent alumina.

Clause 14: The coated article of any of the clauses 10 to 13 further comprising a third protective film over at least a portion of the first protective film and positioned between the first protective film and the second protective film, or between the first protective film and the functional coating wherein the third protective film comprises titania, alumina, zinc oxide, tin oxide, zirconia, silica, or mixtures thereof. Optionally, the third protective film does not comprise a mixture of titania and alumina.

Clause 15: A method of adjusting a color of coated substrate comprising providing a substrate; identifying a transparent conductive oxide and a transparent conductive oxide layer thickness for a transparent conductive oxide layer that will provide a sheet resistance of at least 5Ω/□ and no more than 25Ω/□ (particularly no more than 20Ω/□, more particularly no more than 18Ω/□, identifying a first underlayer material and a first underlayer thickness for a first underlayer film, and a second underlayer material and a second underlayer thickness that will provide the coated substrate having the transparent conductive oxide at the transparent conductive layer thickness a color having an a* between −9 and 1, particularly between −4 and 0, more particularly between −3 and 1, more particularly between −1.5 and −0.5; and a b* of between −9 and 1, particularly between −4 and 0, more particularly between −3 and 1, more particularly between −1.5 and −0.5, applying the first underlayer film having the first underlayer thickness is applied over at least a portion of the substrate; applying the second underlayer film having the second underlayer thickness over at least a portion of the first underlayer film; and applying the transparent conductive oxide layer over the transparent conductive oxide at the transparent conductive layer thickness over at least a portion of the underlayer.

Clause 16: The method of clause 15 wherein the transparent conductive oxide is tin-doped indium oxide.

Clause 17: The method of clause 15 or 16 wherein the transparent conductive layer thickness is at least 125 nm (particularly at least 150 nm, more particularly at least 175 nm) and no more than 950 nm (particularly 500 nm, more particularly 350 nm, more particularly 225 nm).

Clause 18: The method of any of the clauses 15 to 17 wherein the first underlayer material comprises zinc oxide and tin oxide.

Clause 19: The method of any of the clauses 15 to 18 wherein the first underlayer thickness is at least 11 nm and no more than 15 nm.

Clause 20: The method of any of the clauses 15 to 19 wherein the second underlayer material comprises silica and alumina.

Clause 21: The method of any of the clauses 15 to 20, wherein the second underlayer thickness is at least 29 nm and no more than 34 nm.

Clause 22: The method of any of the clauses 15 to 21 further comprising applying a protective layer over a portion of the transparent conductive oxide layer wherein the protective layer comprises a first protective film and a second protective film over at least a portion of the first protective film, wherein the second protective film is an outermost film and the second protective film comprises titania and alumina.

Clause 23: The method of clause 22 wherein the first protective film comprises titania, alumina, zinc oxide, tin oxide, zirconia, silica, or mixtures thereof. Optionally, the first protective film does not comprise a mixture of titania and alumina.

Clause 24: The method of clauses 22 or 23 wherein the second protective film comprises 35 to 65 weight percent titania; particularly 45 to 55 weight percent titania; more particularly 50 weight percent titania.

Clause 25: The method of any of the clauses 22 to 25 wherein the second protective film comprises 65 to 35 weight percent alumina, particularly 55 to 45 weight percent alumina, more particularly 50 weight percent alumina.

Clause 26: The method of any of the clauses 22 to 25 further comprising a third protective film over at least a portion of the first protective film and positioned between the first protective film and the second protective film, or between the first protective film and the functional coating wherein the third protective film comprises titania, alumina, zinc oxide, tin oxide, zirconia, silica, or mixtures thereof. Optionally, the third protective film does not comprise a mixture of titania and alumina.

Clause 27: A coated article comprising a substrate, an underlayer over at least a portion of the substrate, and a transparent conductive oxide layer over at least a portion of the underlayer. The underlayer has a first underlayer film and an optional second underlayer film. The first underlayer film comprises a first high refractive index material. The optional second underlayer film comprises a low refractive index material. The first high refractive index material has a refractive index that is higher than the low refractive index material. The transparent conductive oxide layer has an embedded film embedded within the transparent conductive oxide layer. The embedded film comprises a second high refractive index material. The second high refractive index material has a refractive index that is higher than the low refractive index material.

Clause 28: The coated article according to clause 27 wherein the embedded film has a thickness of 5 nm to 50 nm, particularly 10 nm to 40 nm, more particularly 15 nm to 30 nm.

Clause 29: The coated article according to clause 27 or 29 wherein the second high refractive index material comprises tin oxide and zinc oxide.

Clause 30: The coated article according to any of the clauses 27 to 29 wherein the embedded film is positioned closer to a top of the transparent conductive oxide layer.

Clause 31: The coated article according to any of the clauses 27 to 29 wherein the embedded film is positioned closer to a bottom of the transparent conductive oxide layer.

Clause 32: The coated article according to any of the clauses 27 to 29 wherein the embedded film is positioned at approximately a middle of the transparent conductive oxide layer.

Clause 33: The coated article according to any of the clauses 27 to 32 wherein the transparent conductive oxide layer is selected from the group consisting of gallium-doped zinc oxide ("GZO"), aluminum-doped zinc oxide ("AZO"), indium-doped zinc oxide ("IZO") magnesium-doped zinc oxide ("MZO"), or tin-doped indium oxide ("ITO"), particularly GZO, AZO and ITO, more particularly ITO.

Clause 34: The coated article according any of the clauses 27 to 33, wherein the high refractive index material comprises zinc oxide and tin oxide.

Clause 35: The coated article of any of the clauses 27 to 34, wherein the low refractive index material comprises silica and alumina.

Clause 36: The coated article of any of the clauses 27 to 35, wherein the transparent conductive oxide layer has a thickness of at least 75 nm, more particularly at least 90 nm, more particularly at least 100 nm, more particularly at least 125 nm, more particularly at least 150 nm, more particularly at least 175 nm, or more particularly at least 320 nm.

Clause 37: The coated article of any of the clauses 27 to 34, wherein the transparent conductive oxide layer has a thickness of at most 950 nm, particularly at most 550 nm, more particularly at most 480 nm, more particularly at most 350 nm, more particularly at most 300 nm, more particularly at most 275 nm, more particularly at most 250 nm, more particularly at most 225 nm.

Clause 38: The coated article of any of the clauses 27 to 37 wherein the coated article has a sheet resistance in the range of 5 to 20 ohms per square, particularly 8 to 18 ohms per square, more particularly 5 to 15 ohms per square.

Clause 39: The coated article of any of the clauses 27 to 38, wherein the first underlayer film has a first underlayer thickness, the second underlayer film has a second underlayer thickness and the embedded film has an embedded film thickness to provide the coated article with a color having an a* of at least −9 and at most 1, particularly at least −4 and at most 0, more particularly at least −3 and at most 1, more particularly at least −1.5 and at most −0.5, more particularly −1; and a b* of at least −9 and at most 1, particularly at least −4 and at most 0, more particularly at least −3 and at most 1, more particularly at least −1.5 and at most −0.5, more particularly −1.

Clause 40: The coated article of clause 39 wherein the first underlayer film thickness is between 11 nm and 15 nm, and/or the second underlayer film thickness is between 29 nm and 34 nm.

Clause 41: The coated article of any of the clauses 27 to 40 further comprising a protective layer over the transparent conductive oxide layer wherein the protective layer comprises a first protective film and a second protective film over at least a portion of the first protective film, wherein the second protective film is an outermost film and the second protective film comprises titania and alumina.

Clause 42: The coated article of clause 41 wherein the first protective film comprises titania, alumina, zinc oxide, tin oxide, zirconia, silica, or mixtures thereof. Optionally, the first protective film does not comprise a mixture of titania and alumina.

Clause 43: The coated article of clause 41 or 42 wherein the second protective film comprises 35 to 65 weight percent titania; particularly 45 to 55 weight percent titania; more particularly 50 weight percent titania.

Clause 44: The coated article of any of the clauses 40 to 43 wherein the second protective film comprises 65 to 35 weight percent alumina, particularly 55 to 45 weight percent alumina, more particularly 50 weight percent alumina.

Clause 45: The coated article of any of the clauses 40 to 44 further comprising a third protective film over at least a portion of the first protective film and positioned between the first protective film and the second protective film, or between the first protective film and the functional coating wherein the third protective film comprises titania, alumina, zinc oxide, tin oxide, zirconia, silica, or mixtures thereof. Optionally, the third protective film does not comprise a mixture of titania and alumina.

Clause 46: A method of adjusting a color of a coated article. The method includes applying a first underlayer film over at least a portion of a substrate. The first underlayer film comprises a first high refractive index material. Optionally, a second underlayer film comprises a low refractive index material applied over at least a portion of the first underlayer film. The first high refractive index material has a refractive index that is higher than the low refractive index material. A first transparent conductive oxide film is applied over at least a portion of the first underlayer film or the optional second underlayer film. An embedded film is applied over at least a portion of the first transparent conductive oxide layer. The embedded film comprises a second high refractive index material. The second high refractive index material has a refractive index that is higher than the low refractive index material. A second transparent conductive oxide film is applied over at least a portion of the embedded film.

Clause 47: The method according to clause 46 wherein the embedded film has thickness of 5 nm to 50 nm, particularly 10 nm to 40 nm, more particularly 15 nm to 30 nm.

Clause 48: The method according to clause 46 or 47 wherein the second high refractive index material comprises tin oxide and zinc oxide.

Clause 49: The method according to any of the clauses 46 to 47 wherein the embedded film is positioned closer to a top of the transparent conductive oxide layer.

Clause 50: The method according to any of the clauses 46 to 47 wherein the embedded film is positioned closer to a bottom of the transparent conductive oxide layer.

Clause 51: The method according to any of the clauses 46 to 47 wherein the embedded film is positioned at approximately a middle of the transparent conductive oxide layer.

Clause 52: The method according to any of the clauses 46 to 51 wherein the first transparent conductive oxide film and/or the second transparent conductive oxide film is selected from the group consisting of gallium-doped zinc oxide ("GZO"), aluminum-doped zinc oxide ("AZO"), indium-doped zinc oxide ("IZO") magnesium-doped zinc oxide ("MZO"), or tin-doped indium oxide ("ITO"), particularly GZO, AZO and ITO, more particularly ITO.

Clause 53: The method according any of the clauses 46 to 52, wherein the high refractive index material comprises zinc oxide and tin oxide.

Clause 54: The method of any of the clauses 46 to 53, wherein the low refractive index material comprises silica and alumina.

Clause 55: The method of any of the clauses 46 to 55, wherein the first transparent conductive oxide layer and/or the second transparent conductive oxide layer has a thickness of at least 80 nm, or particularly at least 120 nm, more particularly at least 180 nm, more particularly at least 240 nm or more particularly at least 360 nm.

Clause 56: The method of any of the clauses 46 to 55, wherein the first transparent conductive oxide layer and/or the second transparent conductive oxide layer has a thickness of at most 400 nm, particularly at most 360 nm, more particularly at most 240 nm, more particularly at most 180 nm, more particularly at most 120 nm or more particularly at most 80 nm.

Clause 57: The method of any of the clauses 46 to 56 wherein the coated article has a sheet resistance in the range of 5 to 25 ohms per square, particularly 5 to 20 ohms per square, more particularly 5 to 18 ohms per square.

Clause 58: The method of any of the clauses 46 to 57, wherein the first underlayer film has a first underlayer thickness, the second underlayer film has a second underlayer thickness and the embedded film has an embedded film thickness to provide the coated article with a color having an a* of at least −9 and at most 1, particularly at least −4 and at most 0, more particularly at least −3 and at most 1, more particularly at least −1.5 and at most −0.5, more particularly −1; and a b* of at least −9 and at most 1, particularly at least −4 and at most 0, more particularly at least −3 and at most 1, more particularly at least −1.5 and at most −0.5, more particularly −1.

Clause 59: The method of any of the clauses 46 to 58 wherein the first underlayer film thickness is between 11 nm and 15 nm, and/or the second underlayer film thickness is between 29 nm and 34 nm.

Clause 60: The method of any of the clauses 46 to 59 further comprising applying a protective layer over the transparent conductive oxide layer wherein the protective layer comprises a first protective film and a second protective film over at least a portion of the first protective film, wherein the second protective film is an outermost film and the second protective film comprises titania and alumina.

Clause 61: The method of clause 60 wherein the first protective film comprises titania, alumina, zinc oxide, tin oxide, zirconia, silica, or mixtures thereof. Optionally, the first protective film does not comprise a mixture of titania and alumina.

Clause 62: The method of clause 60 or 61 wherein the second protective film comprises 35 to 65 weight percent titania; particularly 45 to 55 weight percent titania; more particularly 50 weight percent titania.

Clause 63: The method of any of the clauses 60 to 62 wherein the second protective film comprises 65 to 35 weight percent alumina, particularly 55 to 45 weight percent alumina, more particularly 50 weight percent alumina.

Clause 64: The method of any of the clauses 60 to 63 further comprising a third protective film over at least a portion of the first protective film and positioned between the first protective film and the second protective film, or between the first protective film and the functional coating wherein the third protective film comprises titania, alumina, zinc oxide, tin oxide, zirconia, silica, or mixtures thereof. Optionally, the third protective film does not comprise a mixture of titania and alumina.

Clause 65: The method of any of the clauses 47 to 64 wherein the first transparent conductive oxide film and the second transparent conductive oxide film contain an identical metal oxide.

Clause 66: A coated article comprising a substrate, an underlayer over at least a portion of the substrate. The underlayer has a first underlayer film and a second underlayer film. The first underlayer film comprises a first high refractive index material. The second underlayer film comprises a low refractive index material. The first high refractive index material has refractive index that is higher than the low refractive index material. A first transparent conductive oxide film is over at least a portion of the second underlayer film. An embedded film is over at least a portion of the first transparent conductive oxide film. The embedded film comprises a second high refractive index material. The second high refractive index material has refractive index that is higher than the low refractive index material. A second transparent conductive oxide film is over at least a portion of the embedded film.

Clause 67: the coated article according to clause 66 wherein the embedded film has thickness of 5 nm to 50 nm, particularly 10 nm to 40 nm, more particularly 15 nm to 30 nm.

Clause 68: The coated article according to clause 66 or 67 wherein the second high refractive index material comprises tin oxide and zinc oxide.

Clause 69: The coated article according to any of the clauses 66 to 68 wherein the first transparent conductive oxide film is thicker than the second transparent conductive oxide film.

Clause 70: The coated article according to any of the clauses 66 to 68 wherein the first transparent conductive oxide film is thinner than the second transparent conductive oxide film.

Clause 71: The coated article according to any of the clauses 66 to 68 wherein the first transparent conductive oxide film is approximately the same thickness as the second transparent conductive oxide film.

Clause 72: The coated article according to any of the clauses 66 to 71 wherein the first transparent conductive oxide film and/or the second transparent conductive oxide film is selected from the group consisting of gallium-doped zinc oxide ("GZO"), aluminum-doped zinc oxide ("AZO"), indium-doped zinc oxide ("IZO") magnesium-doped zinc oxide ("MZO"), or tin-doped indium oxide ("ITO"), particularly GZO, AZO and ITO, more particularly ITO.

Clause 73: The coated article according any of the clauses 66 to 72, wherein the high refractive index material comprises zinc oxide and tin oxide.

Clause 74: The coated article of any of the clauses 66 to 73, wherein the low refractive index material comprises silica and alumina.

Clause 75: The coated article of any of the clauses 66 to 74, wherein the transparent conductive oxide layer has a thickness of at most 950 nm, particularly at most 550 nm, more particularly at most 360 nm.

Clause 76: The coated article of any of the clauses 66 to 75 wherein the coated article has a sheet resistance in the range of 5 to 20 ohms per square, particularly 8 to 18 ohms per square, more particularly 5 to 15 ohms per square.

Clause 77: The coated article of any of the clauses 66 to 80, wherein the first underlayer film has a first underlayer thickness, the second underlayer film has a second underlayer thickness and the embedded film has an embedded film thickness to provide the coated article with a color having an a* of at least −9 and at most 1, particularly at least −4 and at most 0, more particularly at least −3 and at most 1, more particularly at least −1.5 and at most −0.5, more particularly −1; and a b* of at least −9 and at most 1, particularly at least −4 and at most 0, more particularly at least −3 and at most 1, more particularly at least −1.5 and at most −0.5, more particularly −1.

Clause 78: The coated article of any of the clauses 76 to 77 wherein the first underlayer film thickness is between 11 nm and 15 nm, and/or the second underlayer film thickness is between 29 nm and 34 nm.

Clause 79: The coated article of any of the clauses 66 to 78 further comprising a protective layer over the transparent conductive oxide layer wherein the protective layer comprises a first protective film and a second protective film over at least a portion of the first protective film, wherein the second protective film is an outermost film and the second protective film comprises titania and alumina.

Clause 80: The coated article of clause 79 wherein the first protective film comprises titania, alumina, zinc oxide, tin oxide, zirconia, silica, or mixtures thereof. Optionally, the first protective film does not comprise a mixture of titania and alumina.

Clause 81: The coated article of clauses 79 or 80 wherein the second protective film comprises 35 to 65 weight percent titania; particularly 45 to 55 weight percent titania; more particularly 50 weight percent titania.

Clause 82: The coated article of any of the clauses 79 to 81 wherein the second protective film comprises 65 to 35 weight percent alumina, particularly 55 to 45 weight percent alumina, more particularly 50 weight percent alumina.

Clause 83: The coated article of any of the clauses 79 to 82 further comprising a third protective film over at least a portion of the first protective film and positioned between the first protective film and the second protective film, or between the first protective film and the functional coating wherein the third protective film comprises titania, alumina, zinc oxide, tin oxide, zirconia, silica, or mixtures thereof. Optionally, the third protective film does not comprise a mixture of titania and alumina.

Clause 84: The coated article of any of the clauses 66 to 83, wherein the first transparent conductive oxide layer and/or the second transparent conductive oxide layer has a thickness of at most 400 nm, particularly at most 360 nm, more particularly at most 240 nm, more particularly at most 180 nm, more particularly at most 120 nm or more particularly at most 80 nm.

Clause 85: A coated article comprising a substrate, a functional layer over at least a portion of the substrate, a first protective film over at least a portion of the functional layer, and a second protective film over at least a portion of the first protective film. The second protective film comprises titania and alumina, and is the outermost film.

Clause 86: The coated article of clause 85 wherein the first protective film comprises titania, alumina, zinc oxide, tin oxide, zirconia, silica or mixtures thereof.

Clause 87: The coated article of clauses 85 or 86 wherein the second protective film comprises 35 to 65 weight percent titania, particularly 45 to 55 weight percent titania, more particularly 50 weight percent titania.

Clause 88: The coated article of any of the clauses 85 to 87 wherein the second protective film comprises 65 to 35 weight percent silica, particularly 55 to 45 weight percent silica, more particularly 50 weight percent silica.

Clause 89: The coated article of any of the clauses 85 to 88 wherein the first protective film comprises titania, alumina, zinc oxide, tin oxide, zirconia, silica or mixtures thereof. Optionally the first protective film does not include a mixture of titania and alumina.

Clause 90: The coated article of any of the clauses 85 to 89 wherein the functional layer comprises a transparent conductive oxide layer that is selected from the group consisting of aluminum-doped zinc oxide, gallium-doped zinc oxide, and tin-doped indium oxide, particularly tin-doped indium oxide.

Clause 91: The coated article of any of the clauses of 85 to 90 wherein the functional layer comprises a metal selected from the group consisting of silver, gold, palladium, copper or mixtures thereof, particularly silver.

Clause 92: The coated article of any of the clauses of 85 to 91 further comprising a third protective film over at least a portion of the first protective film and between the first protective film and the second protective film, or between the first protective film and the functional coating.

Clause 93: The coated article of any of the clauses 85 to 91 wherein the third protective film comprises titania, alumina, zinc oxide, tin oxide, zirconia, silica or mixtures thereof. Optionally the third protective film does not include a mixture of titania and alumina.

Clause 94: A method of protecting a functional layer comprising providing an article coated with a functional layer, applying a first protective film over at least a portion of the functional coating; and applying a second protective film over at least a portion of the first protective film, wherein the second protective film comprises titania and alumina.

Clause 95: The method of clause 94 wherein the first protective film comprises titania, alumina, zinc oxide, tin oxide, zirconia, silica or mixtures thereof.

Clause 96: The method of clause 94 or 95 wherein the second protective film comprises 35 to 65 weight percent titania, particularly 45 to 55 weight percent titania, more particularly 50 weight percent titania.

Clause 97: The method of any of the clauses 94 to 99 wherein the second protective film comprises 65 to 35 weight percent silica, particularly 55 to 45 weight percent silica, more particularly 50 weight percent silica.

Clause 98: The method of any of the clauses 94 to 97 wherein the first protective film comprises titania, alumina, zinc oxide, tin oxide, zirconia, silica or mixtures thereof. Optionally the first protective film does not include a mixture of titania and alumina.

Clause 99: The method of any of the clause 94 to 98 wherein the functional layer comprises a transparent conductive oxide layer that is selected from the group consisting of aluminum-doped zinc oxide, gallium-doped zinc oxide, and tin-doped indium oxide, particularly tin-doped indium oxide.

Clause 100: The method of any of the clauses of 94 to 99 wherein the functional layer comprises a metal selected from the group consisting of silver, gold, palladium, copper or mixtures thereof, particularly silver.

Clause 101: The method of any of the clauses of 94 to 100 further comprising a third protective film over at least a portion of the first protective film and between the first protective film and the second protective film, or between the first protective film and the functional coating.

Clause 102: The method of any of the clauses 94 to 101 wherein the third protective film comprises titania, alumina, zinc oxide, tin oxide, zirconia, silica or mixtures thereof. Optionally the third protective film does not include a mixture of titania and alumina.

Clause 103: A method of reducing the absorption of a transparent conductive oxide layer, reducing emissivity of a coated article and/or reducing the absorbance of a coated article comprising providing a substrate; applying a transparent conductive oxide layer, and heat-treating the coated article comprising the transparent conductive oxide layer in an atmosphere that comprises between 0% and 1.0% oxygen, particularly between 0.% oxygen and 0.5% oxygen.

Clause 104: The method according to clause 103 wherein the transparent conductive oxide layer comprise indium-doped tin oxide ("ITO") or aluminum-doped zinc oxide ("AZO").

Clause 105: The method according to clauses 103 or 104 wherein the transparent conductive oxide layer has a thickness of at least 125 nm, particularly at least 150 nm, more particularly at least 175 nm, and at most 450 nm, at most 400 nm, at most 350 nm, at most 300 nm, at most 250 nm or at most 250 nm.

Clause 106: The method according to any of the clauses of 103 to 105 wherein the transparent conductive oxide layer comprises indium-doped tin oxide ("ITO"), and wherein the atmosphere comprises between 0.75% and 1.25% oxygen.

Clause 107: The method according to any of the clauses 103 to 106 wherein the transparent conductive oxide layer comprises a thickness of at least 95 nm and at most 225 nm.

Clause 108: The method according to any of the clauses 103 to 107 wherein the transparent conductive oxide layer comprises aluminum-doped zinc oxide ("AZO") and wherein the atmosphere comprises between 0% and 0.5% oxygen, particularly between 0% and 0.25% oxygen, more particularly between 0% volume and 0.1% volume oxygen, or more particularly 0% volume oxygen.

Clause 109: The method according to clause 108 wherein the transparent conductive oxide layer comprises a thickness of at least 225 nm and at most 440 nm.

Clause 110: The method according to any of the clauses 103 to 109 further comprising applying a functional coating over at least a portion of the substrate wherein the function coating is positioned between the substrate and the transparent conductive oxide layer.

Clause 111: The method according to any of the clauses 103 to 110 further comprising applying a first protective film over at least a portion of the transparent conductive oxide layer, wherein the first protective film comprises titania, alumina, zinc oxide, tin oxide, zirconia, silica or mixtures thereof, and a second protective film over at least a portion of the first protective film wherein the second protective film comprises titania and alumina, wherein the second protective film is an outermost film.

Clause 112: A method of reducing a sheet resistance of a coated article comprising applying a coating to a substrate wherein the coating comprises a transparent conductive oxide layer at room temperature; and heating a top surface of the transparent conductive oxide layer to above 380° F. or at least 435° F. for at least 5 second, at least 10 second, at least 30 seconds, and no more than 120 second, 90 second, 60 second, 55 second, 50 seconds, 45 seconds, 40 second or 35 seconds.

Clause 113: The method according to clause 112 wherein the heating step is flash annealing.

Clause 114: The method according to clause 112 or 113 wherein the transparent conductive oxide layer is at least 125 nm and at most nm to 950 nm.

Clause 115: The method according to any of the clauses 112 to 114 wherein the transparent conductive oxide layer comprises tin-doped indium oxide and is at least 105 nm and at most 171 nm, and wherein the sheet resistance of the coated article after the processing step is less than 20 Ω/□.

Clause 116: The method according to any of the clauses 112 to 115, wherein the transparent conductive oxide layer comprises gallium-doped zinc oxide having a thickness of at least 320 nm and at most 480 nm and wherein the sheet resistance of the coated article after the processing step is less than 20 Ω/□.

Clause 117: The method according to any of the clauses 112 to 116, wherein the transparent conductive oxide layer comprises alumina-doped oxide having a thickness of at least 344 nm and at most 880 nm, and wherein the sheet resistance of the coated article after the processing step is less than 20 Ω/□.

Clause 118: The method according to any of the clauses 112 to 117, wherein the applying the coating step comprises a magnetron sputtered vacuum deposition process.

Clause 119: The method according to any of the clauses 112 to 118, wherein the applying the coating step does not use radiant heat.

Clause 120: The method according to any of the clauses 112 to 119 further comprising applying a first protective film over at least a portion transparent conductive oxide layer, wherein the first protective film comprise titania, alumina, zinc oxide, tin oxide, zirconia, silica or mixtures thereof, and applying a second protective film over at least a portion of the transparent conductive oxide layer wherein the second protective film comprises titania and alumina, and wherein the applying the first protective film and applying the second protective film occurs before or after the processing step.

Clause 121: The method according to any of the clauses 112 to 120, wherein the heating step does not raise the top surface of the transparent conductive oxide above 635° F.

Clause 122: The method according to any of the clauses 112 to 121, wherein the substrate is glass and the transparent conductive oxide has an absorption not greater than 0.3.

Clause 123: The method according to any of the clauses 112 to 122, wherein the substrate is glass and the transparent conductive oxide has an absorption at least as high as 0.05.

Clause 124: The method according to any of the clauses 112 to 123, wherein the coated article is a refrigerator door.

Clause 125: The method according to any of the clauses 112 to 124, wherein the applying step is done in an atmosphere that has an oxygen content supplied to the atmosphere of between 0% and 1.5%.

Clause 126: The method according to any of the clauses 112 to 125, wherein the substrate is glass and the transparent conductive oxide has an absorption not greater than 0.2 and at least as high as 0.05.

Clause 127: A method of making a coated article comprising applying a transparent conductive oxide layer over a substrate, raising a top surface of the transparent conductive oxide to above 380° F., or at least 435° F. and not raising the top surface of the transparent conductive oxide above 806° F. (or particularly 635° F.) for at least 5 second, at least 10 second, at least 15 seconds, at least 20 seconds, at least 25 seconds, at least 30 seconds, and no more than 120 second, 90 second, 60 second, 55 second, 50 seconds, 45 seconds, 40 second or 35 seconds.

Clause 128: The method according to clause 127 further comprising not heating the coated article above 635° F.

Clause 129: The method according to any of the clauses 127 to 128, wherein the transparent conductive oxide layer comprises tin-doped indium oxide having a thickness of at least 96 nm and at most 171 nm and a sheet resistance of less than 25 Ω/□.

Clause 130: The method according to any of the clauses 1127 to 129 further comprising applying a protective layer over the transparent conductive oxide wherein the protective layer comprises titania and alumina.

Clause 131: A coated substrate having an a* between −9 and 1, particularly between −4 and 0, more particularly between −3 and 1, more particularly between −1.5 and −0.5; and a b* of between −9 and 1, particularly between −4 and 0, more particularly between −3 and 1, more particularly between −1.5 and −0.5 made by the method described in any of the clauses 15 to 26.

Clause 132: A coated substrate having an a* between −9 and 1, particularly between −4 and 0, more particularly between −3 and 1, more particularly between −1.5 and −0.5; and a b* of between −9 and 1, particularly between −4 and 0, more particularly between −3 and 1, more particularly between −1.5 and −0.5 made by the method described in any of the clauses 46 to 65.

Clause 133: A coated article made by the method described in any of the clauses 103 to 111.

Clause 134: A coated article made by the method described in any of the clauses 112 to 126.

Clause 135: A coated article made by the method described in any of the clauses 127 to 130.

Clause 136: Use of the underlayer of any of the clauses 1 to 14 or 27 to 45 to provide an a* between −9 and 1, particularly between −4 and 0, more particularly between −3 and 1, more particularly between −1.5 and −0.5; and a b* of between −9 and 1, particularly between −4 and 0, more particularly between −3 and 1, or more particularly between −1.5 and −0.5.

Clause 137: Use of the first underlayer film and the second underlayer film of any of the clauses 15 to 26 or 46 to 65 to provide an a* between −9 and 1, particularly between −4 and 0, more particularly between −3 and 1, more particularly between −1.5 and −0.5; and a b* of between −9 and 1, particularly between −4 and 0, more particularly between −3 and 1, or more particularly between −1.5 and −0.5.

Clause 138: Use of the embedded film of any of the clauses 27 to 65 to decrease sheet resistance.

Clause 139: Use of the protective layer of any of the clauses 85 to 93 to increase durability of the coating on the substrate.

Clause 140: The coated article of any of the clauses 85 to 91 wherein the protective layer has a thickness of at least at least 20 nm, 40 nm, 60 nm, or 80 nm, 100 nm or 120 nm; and at most 275 nm, 255 nm, 240 nm, 170 nm, 150 nm, 125 nm or 100 nm.

Clause 141: The coated article of any of the clauses 85 to 91 or 140 wherein the first protective film can have a thickness of at least 10 nm, at least 15 nm, at least 20 nm, at least 27 nm, at least 30 nm at least 35 nm, at least 40 nm, at least 54 nm, at least 72 nm; and at most 85 nm, 70 nm, 60 nm, 50 nm, 45 nm, or 30 nm.

Clause 142: The coated article of any of the clauses 85 to 91, 140 or 141 wherein the second protective film can have a thickness of at least 10 nm, at least 15 nm, at least 20 nm, at least 27 nm, at least 35 nm, at least 40 nm, at least 54 nm, at least 72 nm; and at most 85 nm, 70 nm, 60 nm, 50 nm, 40 nm 45 nm, 30 nm.

Clause 143: The coated article of any of the clauses 85 to 91, or 140 to 142 wherein the optional third protective film can have a thickness of at least 5 nm, at least 10 nm, at least 15 nm at least 27 nm, at least 35 nm, at least 40 nm, at least 54 nm, at least 72 nm; and at most 85 nm, 70 nm, 60 nm 50 nm, 45 nm, 30 nm or at most 30.

The invention claimed is:

1. A coated article comprising:

a substrate;

an underlayer over at least a portion of the substrate comprising a first refractive index material and a second refractive index material, wherein the underlayer is in direct contact with the substrate;

a transparent conductive oxide layer over at least a portion of the underlayer; and an embedded film embedded within the transparent conductive oxide layer, wherein the embedded film comprises a third refractive index material, wherein the third refractive index material has a refractive index that is within the range of −10 percent to +10 percent than the first refractive index material, wherein the underlayer comprises a first underlayer film and a second underlayer film, such that the second underlayer film is formed over at least a portion of the first underlayer film, and the first underlayer film comprises the first refractive index material and the second underlayer film comprises the second refractive index material, wherein the first refractive index material has a refractive index greater than the second refractive index material, and wherein the coated article has a sheet resistance that is less than 25 ohms per square.

2. The coated article of claim 1, wherein the first refractive index material has a refractive index that is higher than the second refractive index material.

3. The coated article of claim 1, wherein the transparent conductive oxide layer comprises tin-doped indium oxide.

4. The coated article of claim 1, wherein the transparent conductive oxide layer comprises a first transparent conductive oxide film and a second transparent conductive oxide film.

5. The coated article of claim 4, wherein the thickness of the first transparent conductive oxide film and the second transparent conductive oxide film of the transparent conductive oxide layer are each individually in the range of 75 nm to 475 nm.

6. The coated article of claim 4, wherein the first transparent conductive oxide film and the second transparent conductive oxide film of the transparent conductive oxide layer are both formed from tin-doped indium oxide.

7. The coated article of claim 4, wherein the embedded film is positioned at approximately a middle of the transparent conductive oxide layer.

8. The coated article of claim 1, wherein the embedded film comprises an alloy, mixture, oxide, nitride, or oxynitride of at least one of silicon, titanium, aluminum, zirconium, phosphorus, hafnium, niobium, zinc, bismuth, lead, indium, or tin.

9. The coated article of claim 1, further comprising a protective layer over at least a portion of the transparent conductive oxide layer, wherein the protective layer comprises:

a first protective film comprising titania, alumina, zinc oxide, tin oxide, zirconia, silica alloys thereof or mixtures thereof; and a second protective film over at least a portion of the first protective film, wherein the second protective film comprises titania and alumina.

10. A coated article comprising:

a substrate;

an underlayer over at least a portion of the substrate comprising a first refractive index material and a second refractive index material, wherein the underlayer is in direct contact with the substrate;

a transparent conductive oxide layer over at least a portion of the underlayer; and an embedded film embedded within the transparent conductive oxide layer, wherein the embedded film comprises a third refractive index material, wherein the third refractive index material has a refractive index that is within the range of −10 percent to +10 percent than the first refractive index material, wherein the embedded film has a thickness in the range of 5 nm to 50 nm, wherein the underlayer comprises a first underlayer film and a second underlayer film, such that the second underlayer film is formed over at least a portion of the first underlayer film, and the first underlayer film comprises the first refractive index material and the second underlayer film comprises the second refractive index material, wherein the first refractive index material has a refractive index greater than the second refractive index material, and wherein the coated article has a sheet resistance that is less than 25 ohms per square.

11. The coated article of claim 10, wherein the first refractive index material has a refractive index that is higher than the second refractive index material.

12. The coated article of claim 10, wherein the transparent conductive oxide layer comprises tin-doped indium oxide.

13. The coated article of claim 10, wherein the embedded film comprises an alloy, mixture, oxide, nitride, or oxynitride of at least one of silicon, titanium, aluminum, zirconium, phosphorus, hafnium, niobium, zinc, bismuth, lead, indium, or tin.

14. A method of improving sheet resistance by at least 35 percent, the method comprising the steps of:

(a) applying an underlayer over at least a portion of a substrate comprising a first refractive index material and a second refractive index material, wherein the underlayer is in direct contact with the substrate;

(b) applying a first transparent conductive oxide film over at least a portion of the underlayer;

(c) applying an embedded film over at least a portion of the first transparent conductive oxide film, wherein the embedded film comprises a third refractive index material, and wherein the third refractive index material has a refractive index that is within the range of −10 percent to +10 percent than the first refractive index material; and (d) applying a second transparent conductive oxide film over at least a portion of the embedded film to form a transparent conductive oxide layer formed from first transparent conductive oxide film, the embedded film, and the second transparent conductive oxide film, wherein the underlayer comprises a first underlayer film and a second underlayer film, such that the second underlayer film is formed over at least a portion of the first underlayer film, and the first underlayer film comprises the first refractive index material and the second underlayer film comprises the second refractive index material, wherein the first refractive index material has a refractive index greater than the second refractive index material, and wherein the coated article has a sheet resistance that is less than 25 ohms per square.

15. The method of claim 14, wherein the first refractive index material has a refractive index that is higher than the second refractive index material.

16. The method of claim 14, wherein the thickness of the first transparent conductive oxide film and the second transparent conductive oxide film of the transparent conductive oxide layer are each individually in the range of 75 nm to 475 nm.

17. The method of claim 14, wherein the first transparent conductive oxide film and the second transparent conductive oxide film of the transparent conductive oxide layer are both formed from tin-doped indium oxide.

18. The method of claim 14, wherein the embedded film comprises an alloy, mixture, oxide, nitride, or oxynitride of at least one of silicon, titanium, aluminum, zirconium, phosphorus, hafnium, niobium, zinc, bismuth, lead, indium, or tin.

19. The method of claim 14, further comprising a protective layer over at least a portion of the transparent conductive oxide layer, wherein the protective layer comprises:

a first protective film comprising titania, alumina, zinc oxide, tin oxide, zirconia, silica alloys thereof or mixtures thereof; and a second protective film over at least a portion of the first protective film, wherein the second protective film comprises titania and alumina.

* * * * *